US 9,349,418 B2

(12) United States Patent
Yamamoto et al.

(10) Patent No.: US 9,349,418 B2
(45) Date of Patent: May 24, 2016

(54) SEMICONDUCTOR DEVICE AND METHOD FOR DRIVING THE SAME

(71) Applicant: Semiconductor Energy Laboratory Co., Ltd., Atsugi-shi, Kanagawa-ken (JP)

(72) Inventors: Yoshitaka Yamamoto, Nara (JP); Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/582,319

(22) Filed: Dec. 24, 2014

(65) Prior Publication Data

US 2015/0187775 A1    Jul. 2, 2015

(30) Foreign Application Priority Data

Dec. 27, 2013   (JP) ................................ 2013-271666
Mar. 11, 2014   (JP) ................................ 2014-047382

(51) Int. Cl.
*G11C 11/00* (2006.01)
*G11C 11/14* (2006.01)
(Continued)

(52) U.S. Cl.
CPC .. *G11C 5/14* (2013.01); *G11C 8/16* (2013.01); *G11C 11/405* (2013.01);
(Continued)

(58) Field of Classification Search
CPC ...... G11C 11/412; G11C 11/24; G11C 11/40; G11C 14/0054; G11C 11/419; G11C 5/10; G11C 11/4074; G11C 16/10; G11C 16/30; G11C 2207/005; G11C 16/0433; G11C 11/404; G11C 11/405; G11C 16/0425; G11C 11/403; G11C 11/565
See application file for complete search history.

(56) References Cited

U.S. PATENT DOCUMENTS 4,466,081 A    8/1984   Masuoka
4,609,986 A    9/1986   Hartmann et al.
(Continued)

FOREIGN PATENT DOCUMENTS

EP    1737044 A    12/2006
EP    2226847 A     9/2010
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Hien Nguyen
(74) *Attorney, Agent, or Firm* — Fish & Richardson P.C.

(57) ABSTRACT

A novel semiconductor device where multilevel data can be written and read. The semiconductor device includes first to fifth transistors, a capacitor, a bit line, and a power supply line. Write operation is performed in such a manner that first data is supplied to a gate of the fifth transistor through the first transistor; the first transistor is turned off; second data is supplied to a second electrode of the capacitor through the second transistor to convert the first data into third data; and the second electrode of the capacitor are made electrically floating. The second electrode of the capacitor is initialized to GND through the third transistor. Read operation is performed by charging or discharging the bit line through the fourth transistor and the fifth transistor. The first to third transistors are preferably oxide semiconductor transistors.

18 Claims, 43 Drawing Sheets

(51) Int. Cl.

| | | |
|---|---|---|
| *G11C 5/14* | (2006.01) | |
| *H01L 27/108* | (2006.01) | |
| *H01L 27/06* | (2006.01) | |
| *H01L 29/786* | (2006.01) | |
| *G11C 8/16* | (2006.01) | |
| *G11C 11/405* | (2006.01) | |
| *G11C 11/408* | (2006.01) | |
| *G11C 11/56* | (2006.01) | |
| *H01L 27/115* | (2006.01) | |

(52) U.S. Cl.
CPC ......... *G11C 11/4087* (2013.01); *G11C 11/565* (2013.01); *H01L 27/0688* (2013.01); *H01L 27/1082* (2013.01); *H01L 27/10814* (2013.01); *H01L 27/10826* (2013.01); *H01L 27/10855* (2013.01); *H01L 27/10858* (2013.01); *H01L 27/10879* (2013.01); *H01L 27/10897* (2013.01); *H01L 29/786* (2013.01); *G11C 2207/108* (2013.01); *H01L 27/1156* (2013.01)

(56) References Cited

U.S. PATENT DOCUMENTS

| | | |
|---|---|---|
| 4,642,487 A | 2/1987 | Carter |
| 4,870,302 A | 9/1989 | Freeman |
| 4,902,637 A | 2/1990 | Kondou et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,563,174 B2 | 5/2003 | Kawasaki et al. |
| 6,727,522 B1 | 4/2004 | Kawasaki et al. |
| 6,781,865 B2 | 8/2004 | Ohtsuka et al. |
| 7,030,650 B1 | 4/2006 | Kaptanoglu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,054,121 B2 | 11/2011 | Kato |
| 8,314,637 B2 | 11/2012 | Kato et al. |
| 8,339,828 B2 | 12/2012 | Yamazaki et al. |
| 8,339,836 B2 | 12/2012 | Yamazaki et al. |
| 8,503,253 B2 * | 8/2013 | Tsukada ............... G11C 5/145 365/148 |
| 8,520,426 B2 | 8/2013 | Ohnuki |
| 8,542,528 B2 | 9/2013 | Sekine et al. |
| 8,614,916 B2 | 12/2013 | Nagatsuka et al. |
| 8,659,935 B2 | 2/2014 | Yamazaki et al. |
| 8,686,415 B2 | 4/2014 | Kamata |
| 8,792,284 B2 | 7/2014 | Ohnuki |
| 8,848,464 B2 | 9/2014 | Sekine et al. |
| 8,854,865 B2 | 10/2014 | Saito |
| 8,964,450 B2 * | 2/2015 | Ishizu ........................ 365/149 |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0047286 A1 | 3/2007 | Miki |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0280058 A1 | 11/2008 | Krunks et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0101332 A1 | 5/2011 | Yamazaki et al. |
| 2011/0101351 A1 | 5/2011 | Yamazaki |
| 2011/0114945 A1 | 5/2011 | Yamazaki et al. |
| 2011/0121878 A1 | 5/2011 | Kato et al. |
| 2011/0122673 A1 | 5/2011 | Kamata et al. |

(56) References Cited

U.S. PATENT DOCUMENTS

| | | |
|---|---|---|
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194332 A1 | 8/2011 | Saito |
| 2012/0161220 A1 | 6/2012 | Yamazaki |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293203 A1 | 11/2012 | Ohmaru et al. |
| 2012/0293206 A1 | 11/2012 | Yoneda et al. |
| 2012/0293242 A1 | 11/2012 | Kato |
| 2012/0306533 A1 | 12/2012 | Ohmaru |
| 2013/0308392 A1 | 11/2013 | Nishijima et al. |
| 2014/0177345 A1 | 6/2014 | Yamazaki et al. |
| 2014/0241054 A1 | 8/2014 | Koyama |
| 2014/0269063 A1 | 9/2014 | Nagatsuka et al. |
| 2014/0269099 A1 | 9/2014 | Nagatsuka et al. |
| 2014/0286073 A1 | 9/2014 | Onuki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 A | 12/2012 |
| WO | WO-2004/114391 | 12/2004 |

OTHER PUBLICATIONS

Asaoka.Y et al., "29.1: Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Compositions for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides",.Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest D8 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM NewsLetter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs with a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B(Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Dislay", SID Digest '08 : SID International Symposium Digest of Technical Papers, May 20, 2008, vol. 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display with Driver Circuit Using Amorphous In-Ga-Zn-Oxide TFTs", IDW '09 : Proceedings of the 16th International Display Workshops, 2009, pp. 689-692.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

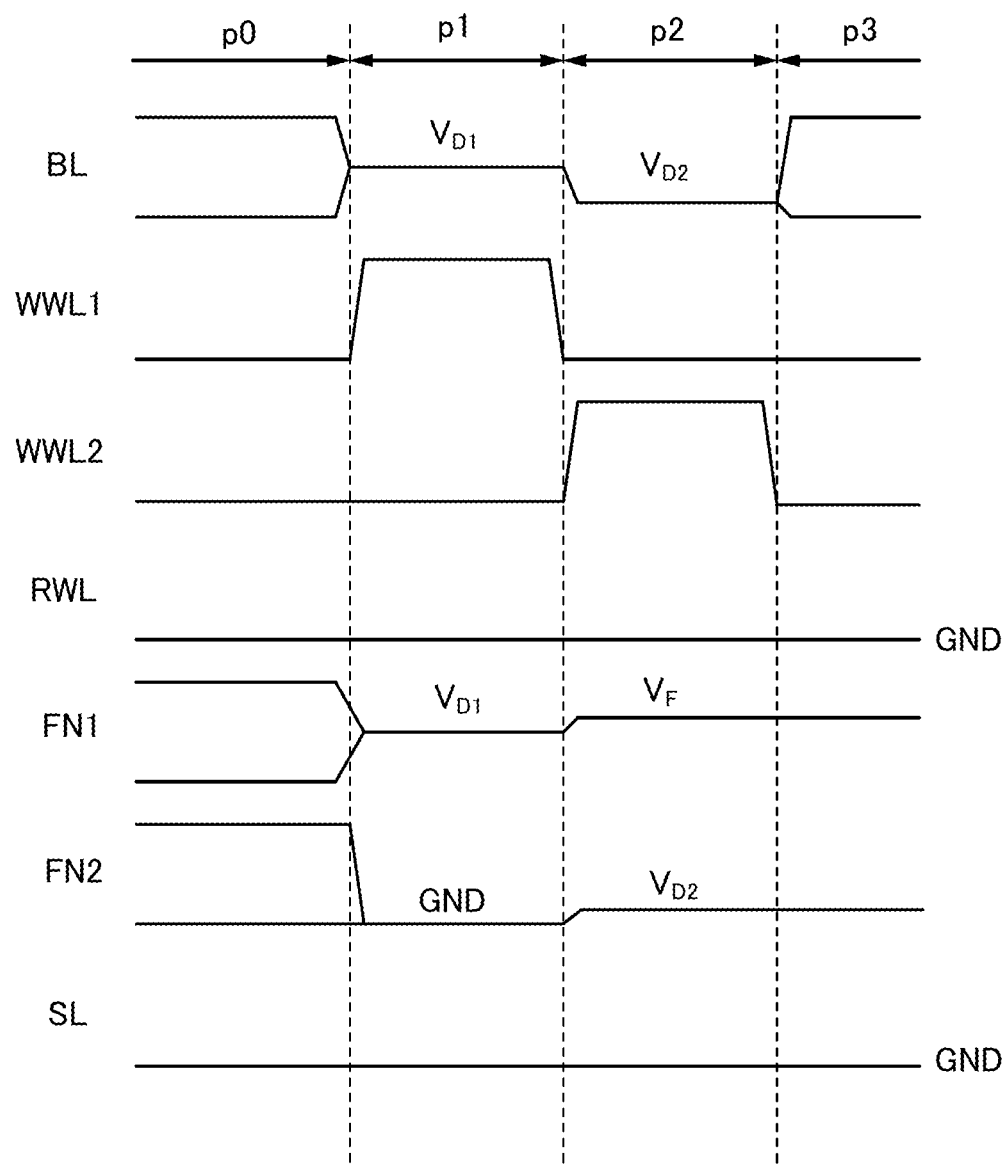

SEMICONDUCTOR DEVICE AND METHOD FOR DRIVING THE SAME

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, or a driving method thereof. In particular, one embodiment of the present invention relates to a semiconductor device, a display device, or a light-emitting device each including an oxide semiconductor.

In this specification and the like, a semiconductor device generally refers to a device that can function by utilizing semiconductor characteristics. A display device, an electro-optical device, a semiconductor circuit, and an electronic device include a semiconductor device in some cases.

2. Description of the Related Art

Much attention has been focused on a semiconductor device that retains data by using a combination of a transistor in which silicon (Si) is used for a semiconductor layer and a transistor in which an oxide semiconductor (OS) is used for a semiconductor layer (see Patent Document 1).

In recent years, with the increase in the amount of data manipulated, a semiconductor device having a large memory capacity has been required. In this situation, Patent Document 1 discloses a semiconductor device where multilevel data is stored and read.

REFERENCE

Patent Document 1: Japanese Published Patent Application No. 2012-256400

SUMMARY OF THE INVENTION

For example, in the semiconductor device disclosed in Patent Document 1, multilevel data is written by using one transistor. When the number of bits of multilevel data increases, the difference between potentials corresponding to different levels of data becomes small. Thus, determining a potential in reading data becomes difficult, and an incorrect value might be read out.

An object of one embodiment of the present invention is to provide a novel semiconductor device, a semiconductor device where multilevel data can be written and read, or a method for driving a semiconductor device where multilevel data can be written and read.

Note that the description of a plurality of objects does not preclude the existence of each object. One embodiment of the present invention does not necessarily achieve all the objects listed above. Objects other than those listed above are apparent from the description of the specification, drawings, and claims, and such objects could be an object of one embodiment of the present invention.

One embodiment of the present invention is a semiconductor device including first to fifth transistors, a first node, a second node, a capacitor, a bit line, and a power supply line. The first node is supplied with first data of Mbits (M is a natural number of 1 or more) through the first transistor. The first node is electrically connected to a first electrode of the capacitor and a gate of the fifth transistor. The second node is supplied with second data of N bits (N is a natural number of 1 or more) through the second transistor. The second node is supplied with a first potential through the third transistor. The second node is electrically connected to a second electrode of the capacitor. One of a source and a drain of the fifth transistor is electrically connected to the power supply line. The other of the source and the drain of the fifth transistor is electrically connected to the bit line through the fourth transistor. The semiconductor device can write and read (M+N)-bit data.

In the above embodiment, each of the first to third transistors preferably includes a semiconductor layer containing an oxide semiconductor.

One embodiment of the present invention is a method for driving the semiconductor device according to the above embodiment. The write operation includes a first step of turning on the first and third transistors and supplying first data to the first node; a second step of turning on the second transistor, turning off the first and third transistors, and supplying second data to the second node; and a third step of making the first and second nodes electrically floating. The read operation includes a fourth step of applying a potential difference between the power supply line and the bit line; a fifth step of making the bit line electrically floating; and a sixth step of turning on the fourth transistor and charging the bit line.

One embodiment of the present invention is a semiconductor device including first to fourth transistors, a first node, a second node, a first capacitor, a second capacitor, a bit line, and a power supply line. The first node is supplied with first data of M bits (M is a natural number of 1 or more) through the first transistor. The first node is electrically connected to a first electrode of the first capacitor, a first electrode of the second capacitor, and a gate of the fourth transistor. The second node is supplied with second data of N bits (N is a natural number of 1 or more) through the second transistor. The second node is supplied with a first potential through the third transistor. The second node is electrically connected to a second electrode of the first capacitor. One of a source and a drain of the fourth transistor is electrically connected to the power supply line. The other of the source and the drain of the fourth transistor is electrically connected to the bit line. The semiconductor device can write and read (M+N)-bit data.

In the above embodiment, each of the first to third transistors preferably includes a semiconductor layer containing an oxide semiconductor.

One embodiment of the present invention is a method for driving the semiconductor device according to the above embodiment. The write operation includes a first step of turning on the first and third transistors, supplying first data to the first node, and supplying a second potential to a second electrode of the second capacitor; a second step of turning on the second transistor, turning off the first and third transistors, and supplying second data to the second node; and a third step of making the first and second nodes electrically floating. The read operation includes a fourth step of applying a potential difference between the power supply line and the bit line; a fifth step of making the bit line electrically floating; and a sixth step of supplying a third potential to the second electrode of the second capacitor and charging or discharging the bit line.

One embodiment of the present invention can provide e a novel semiconductor device, a semiconductor device where multilevel data can be written and read, or a method for driving a semiconductor device where multilevel data can be written and read.

Note that the description of these effects does not disturb the existence of other effects. One embodiment of the present invention does not necessarily achieve all the above effects.

Other effects will be apparent from and can be derived from the description of the specification, the drawings, the claims, and the like.

BRIEF DESCRIPTION OF THE DRAWINGS

In the accompanying drawings:
FIG. 3 is a timing chart of a memory cell.

DETAILED DESCRIPTION OF THE INVENTION

Figure 1:
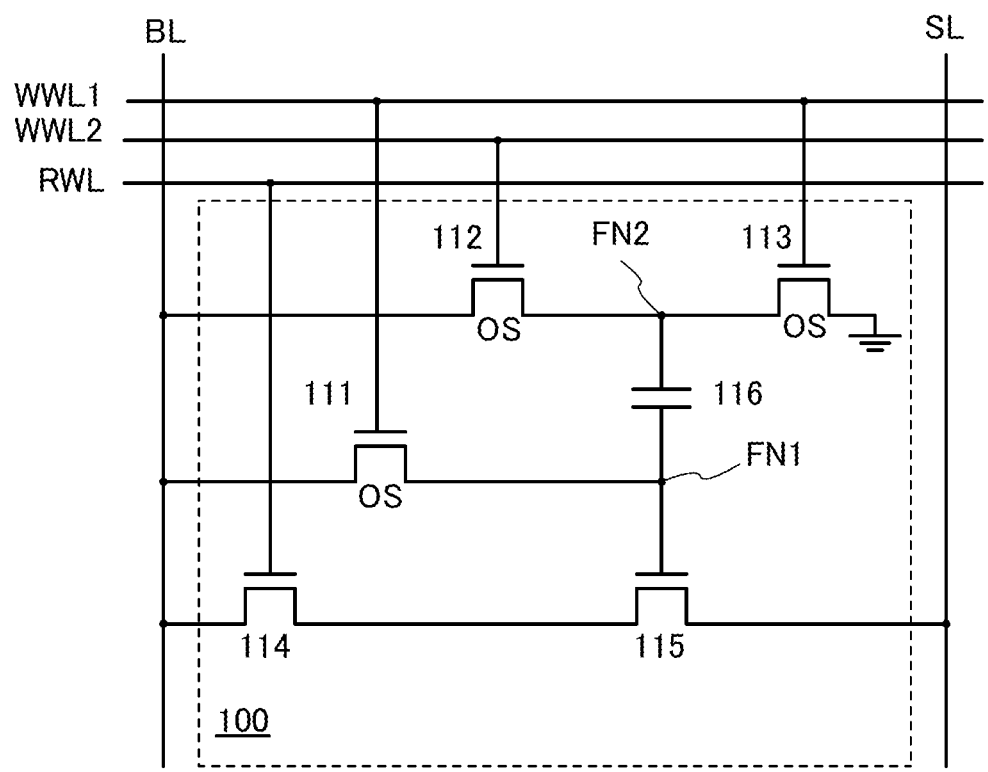
FIG. 1 is a circuit diagram of a memory cell.

Embodiments of the present invention will be described below in detail with reference to the drawings. Note that the present invention is not limited to the description below, and it is easily understood by those skilled in the art that a variety of changes and modifications can be made without departing from the spirit and scope of the present invention. Therefore, the present invention should not be construed as being limited to the description of the embodiments below. In the following embodiments, the same portions or portions having similar functions are denoted by the same reference numerals in different drawings, and explanation thereof will not be repeated.

In the drawings, the size, the layer thickness, or the region is exaggerated for clarity in some cases; therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source. Here, since the source and the drain change depending on the structure, the operating condition, and the like of the transistor, it is difficult to define which is a source or a drain. Thus, a portion functioning as the source and a portion functioning as the drain are not referred to as a source and a drain in some cases, and one of the source and the drain may be referred to as a first electrode and the other thereof may be referred to as a second electrode.

In this specification and the like, among signals supplied to a gate electrode of a transistor, a signal for establishing electrical continuity between a source electrode and a drain electrode of the transistor is designated as an H-level signal, and a signal for breaking electrical continuity between the source electrode and the drain electrode of the transistor is designated as an L-level signal. The state where the electrical continuity is established is referred to as an on state, and the state where the electrical continuity is not established is referred to as an off state.

In this specification, the term "node" refers to any point on a wiring provided to connect elements electrically.

In this specification and the like, the potential of a grounded wiring and a grounded node is represented by GND, and GND is 0 V unless otherwise specified. Note that a potential is a relative value and thus is sometimes a value other than 0 V.

In this specification, ordinal numbers such as first, second, and third are used in order to avoid confusion among components and thus do not limit the number of the components.

In this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that the positional relations of circuit blocks in a drawing are specified for description. Even when a drawing shows that different functions are achieved by different circuit blocks, an actual circuit or region may be configured so that the different functions are achieved in the same circuit block. Functions of circuit blocks in a drawing are specified for description, and even when a drawing shows one circuit block performing given processing, a plurality of circuit blocks may be provided in an actual circuit or region to perform the processing.

Embodiment 1

In this embodiment, a circuit configuration and operation of a memory cell included in a semiconductor device of one embodiment of the present invention will be described with reference to FIG. 1, FIGS. 2A to 2D, and FIGS. 3 to 6.
<Configuration of Memory Cell>

FIG. 1 is a circuit diagram of a memory cell 100 of one embodiment of the present invention.

The memory cell 100 illustrated in FIG. 1 includes a transistor 111, a transistor 112, a transistor 113, a transistor 114, a transistor 115, a capacitor 116, a node FN1, and a node FN2. Although not shown in FIG. 1, a plurality of memory cells 100 are actually arranged in a matrix.

A gate of the transistor 111 is connected to a write word line WWL1. One of a source and a drain of the transistor 111 is connected to a bit line BL. The other of the source and the drain of the transistor 111 is connected to the node FN1.

A gate of the transistor 112 is connected to a write word line WWL2. One of a source and a drain of the transistor 112 is connected to the bit line BL. The other of the source and the drain of the transistor 112 is connected to the node FN2.

A gate of the transistor 113 is connected to the write word line WWL1. One of a source and a drain of the transistor 113 is connected to the node FN2. The other of the source and the drain of the transistor 113 is grounded.

A gate of the transistor 114 is connected to a read word line RWL. One of a source and a drain of the transistor 114 is connected to the bit line BL.

A gate of the transistor 115 is connected to the node FN1. One of a source and a drain of the transistor 115 is connected to a power supply line SL. The other of the source and the drain of the transistor 115 is connected to the other of the source and the drain of the transistor 114.

One electrode of the capacitor 116 is connected to the node FN1. The other electrode of the capacitor 116 is connected to the node FN2.

Capacitance $C_0$ of the capacitor 116 is sufficiently larger than capacitance $C_{Tr}$ between the gate electrode and the source and drain electrodes of the transistor 115.

A word signal is supplied to the write word line WWL1, the write word line WWL2, and the read word line RWL.

A word signal is a signal for turning on the transistor 111, the transistor 112, or the transistor 113 to apply the voltage of the bit line BL to the node FN1 or the node FN2.

Binary or multilevel data is supplied to the bit line BL. Multilevel data is k-bit data (k is a natural number of 2 or more). Specifically, 2-bit data is 4-level data, namely, a signal having any one of the four levels of voltages.

A read signal is supplied to the read word line RWL.

A read signal is a signal that is supplied to the gate electrode of the transistor 114 in order to read data from the memory cell in a selective manner.

The node FN1 corresponds to any node on a wiring that connects the one electrode of the capacitor 116, the other of the source and the drain of the transistor 111, and the gate of the transistor 115.

The node FN2 corresponds to any node on a wiring that connects the other electrode of the capacitor 116, the other of the source and the drain of the transistor 112, and the one of the source and the drain of the transistor 113.

Note that in this specification, "writing data to the memory cell" means that word signals supplied to the write word lines WWL1 and WWL2 are controlled so that the potential of the node FN1 or the node FN2 becomes a potential corresponding to the voltage of the bit line BL. Furthermore, "reading data from the memory cell" means that a read signal supplied to the read word line RWL is controlled so that the voltage of the bit line BL becomes a voltage corresponding to the potential of the node FN1.

The transistors 111 to 115 are n-channel transistors in the following description.

Each of the transistors 111 to 113 functions as a switch for controlling data writing by being turned on or off. While being kept off, the transistors 111 to 113 have a function of holding a potential based on written data.

The transistors 111 to 113 are preferably transistors in which current flowing between a source and drain in the off state (off-state current) is low. Here, the term "low off-state current" means that a normalized off-state current per micrometer of a channel width at room temperature with a source-drain voltage of 10 V is less than or equal to $10 \times 10^{-21}$ A. An example of a transistor with such a low off-state current is a transistor including a semiconductor layer containing an oxide semiconductor.

In the configuration of the memory cell 100 shown in FIG. 1, a potential based on written data is held by keeping the transistors 111 to 113 off. Thus, it is particularly preferred that a transistor with a low off-state current be used as switches for suppressing change in the potential accompanied by the transfer of electric charge at the nodes FN1 and FN2.

The transistors 114 and 115 have a function of making current flow between the bit line BL and the power supply line SL in accordance with the potentials of the read word line RWL and the node FN1.

The transistors 114 and 115 are preferably transistors with little variation in threshold voltage. Here, transistors with little variation in threshold voltage refer to transistors fabricated in the same process so as to have an acceptable threshold voltage difference of 100 mV or less, and are specifically transistors including single crystal silicon in a channel. It is needless to say that the variation in threshold voltage is preferably as little as possible; however, even the transistors using single crystal silicon may have a threshold voltage difference of approximately 20 mV.
<Operation>

Next, an example of the operation of the memory cell 100 will be described with reference to FIGS. 2A to 2D. FIGS. 2A to 2D schematically illustrate the operation of the memory cell 100. In FIGS. 2A to 2D, the transistors 111 to 113 are shown as switches.

First, write operation of the memory cell 100 will be described with reference to FIGS. 2A and 2B.

Figure 2A:
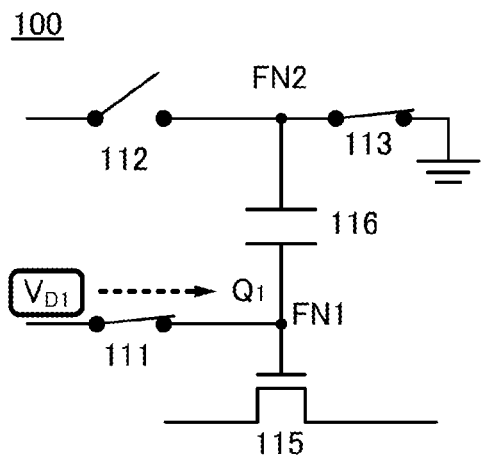
FIGS. 2A to 2D illustrate circuit operation of a memory cell.

In FIG. 2A, the transistors 111 and 113 are turned on and the transistor 112 is turned off, and a potential $V_{D1}$ is supplied to the node FN1 through the transistor 111 to write electric charge $Q_1$.

Figure 2B:
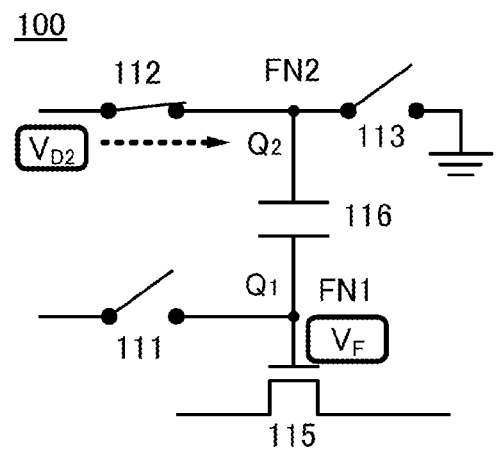

In FIG. 2B, the transistor 112 is turned on and the transistors 111 and 113 are turned off, and a potential $V_{D2}$ is supplied to the node FN2 through the transistor 112 to write electric charge $Q_2$.

At this time, a potential $V_F$ of the node FN1 is represented by Formula 1.

$$V_F = V_{D1} + \frac{C_0}{C_{Tr} + C_0} V_{D2} \qquad \text{[Formula 1]}$$

Since the capacitance $C_0$ is sufficiently larger than the capacitance $C_{Tr}$ ($C_0 \gg C_{Tr}$), Formula 1 is represented as Formula 2. That is, a potential that is the sum of the potential $V_{D1}$ and the potential $V_{D2}$ is supplied to the node FN1 as the potential $V_F$.

$$V_F = V_{D1} + V_{D2} \quad \text{[Formula 2]}$$

For example, when the potential Vii has 4 values such that $V_{D1} = \{0\,V, 1\,V, 2\,V, 3\,V\}$ and the potential $V_{D2}$ has 4 values such that $V_{D2} = \{0.25\,V, 0.5\,V, 0.75\,V, 1\,V\}$, the potential $V_F$ can have 16 levels of potentials such that $V_F = \{0.25\,V, 0.5\,V, 0.75\,V, 1\,V, 1.25\,V, 1.5\,V, 1.75\,V, 2\,V, 2.25\,V, 2.5\,V, 2.75\,V, 3\,V, 3.25\,V, 3.5\,V, 3.75\,V, 4\,V\}$. That is, when the potential $V_{D1}$ is M-bit data ($2^M$ levels, where M is a natural number of 1 or more) and the potential $V_{D2}$ is N-bit data ($2^N$ levels, where N is a natural number of 1 or more), the potential $V_F$ can have (M+N)-bit data ($2^{M+N}$ levels).

Then, the transistors 111 to 113 are turned off to make the nodes FN1 and FN2 electrically floating, whereby the electric charge $Q_1$ and the electric charge $Q_2$ are held. The electric charge $Q_1$ and the electric charge $Q_2$ can be retained because the off-state current of the transistors 111 to 113 is low.

By the method shown in FIGS. 2A and 2B, multilevel data corresponding to the potential $V_{D1}$ and the potential $V_{D2}$ can be written to the memory cell 100.

Next, read operation of the memory cell 100 will be described with reference to FIGS. 2C and 2D.

First, the potential of the bit line BL is initialized to GND, and a potential $V_H$ is supplied to the power supply line SL. Moreover, the transistors 111 to 113 are turned off to make the nodes FN1 and FN2 electrically floating. The potential $V_H$ supplied to the power supply line SL is set higher than or equal to the potential $V_F$. The transistor 114 is turned off so that current does not flow between the bit line BL and the power supply line SL (FIG. 2C).

Figure 2C:
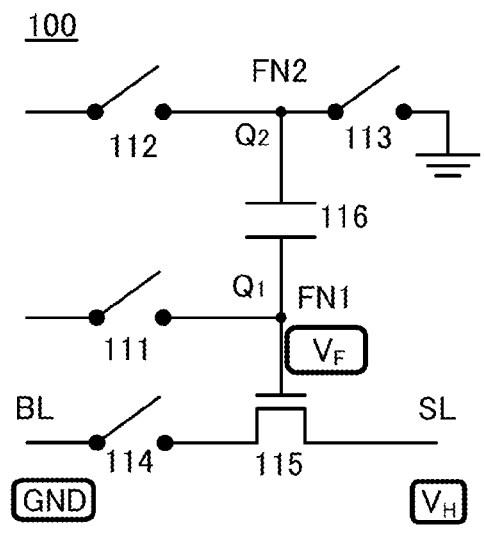
Figure 2D:
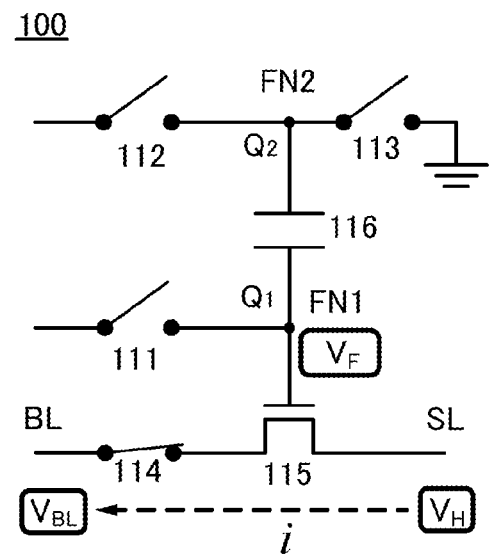

Then, the bit line BL is made electrically floating, and the transistor 114 is turned on (FIG. 2D). The bit line BL can be made electrically floating by turning off a switch that supplies a potential to the bit line BL. The potential difference between the node FN1 and the bit line BL corresponds to a potential $V_{GS}$ between the gate and the source of the transistor 115. The transistor 115 is on when the potential $V_{GS}$ is higher than a threshold voltage $V_{th}$ of the transistor 115. In FIG. 2D, the transistor 115 is on because of the potential $V_F$ written to the node FN1.

When the transistor 114 is turned on, current flows between the power supply line SL and the bit line BL through the transistors 114 and 115 as illustrated in FIG. 2D. The bit line BL is charged by the current flow, so that a potential $V_{BL}$ of the bit line BL increases. Eventually, the potential of the bit line BL increases until the potential difference between the node FN1 and the bit line BL becomes equal to $V_{th}$ of the transistor 115 ($V_F - V_{BL} = V_{th}$, i.e., $V_{BL} = V_F - V_{th}$). By converting the potential of the bit line BL at this time into digital data with the use of a comparator or the like, data held in the memory cell 100 can be read out.

By the method shown in FIGS. 2C and 2D, multilevel data written to the memory cell 100 can be read out.

Next, the above-described operation of the memory cell 100 will be explained with reference to timing charts.

<Timing Chart for Write Operation>

FIG. 3 is a timing chart showing changes of signals supplied to the write word lines WWL1 and WWL2, the read word line RWL, the nodes FN1 and FN2, the bit line BL, and the power supply line SL when data is written to the memory cell 100 in FIG. 1.

In the timing chart of FIG. 3, the potentials of the read word line RWL and the power supply line SL are always kept at GND.

In a period p1 after a period p0 during which the memory cell 100 is in an initial state, the potential $V_{D1}$ is supplied to the bit line BL, an H-level signal is supplied to the write word line WWL1, and an L-level signal is supplied to the write word line WWL2.

In the period p1, the transistors 111 and 113 are turned on, and the transistor 112 is turned off. At this time, the potential $V_{D1}$ supplied to the bit line BL is written to the node FN1 through the transistor 111.

Then, in a period p2, the potential $V_{D2}$ is supplied to the bit line BL, an L-level signal is supplied to the write word line WWL1, and an H-level signal is supplied to the write word line WWL2.

In the period p2, the transistors 111 and 113 are turned off, the transistor 112 is turned on, and the potential $V_{D2}$ supplied to the bit line BL is written to the node FN2. At this time, a potential that is the sum of the potential $V_{D1}$ and the potential $V_{D2}$ is supplied as the potential $V_F$ of the node FN1 as represented by Formula 2.

In a period p3, an L-level signal is supplied to the write word lines WWL1 and WWL2, and the transistors 111 to 113 are turned off. Thus, the potential $V_F$ of the node FN1 and the potential $V_{D2}$ of the node FN2 are held.

With the circuit operation shown in FIG. 3, multilevel data corresponding to the potential Vii and the potential $V_{D2}$ can be written to the memory cell 100.

<Timing Chart for Read Operation>

Figure 4:
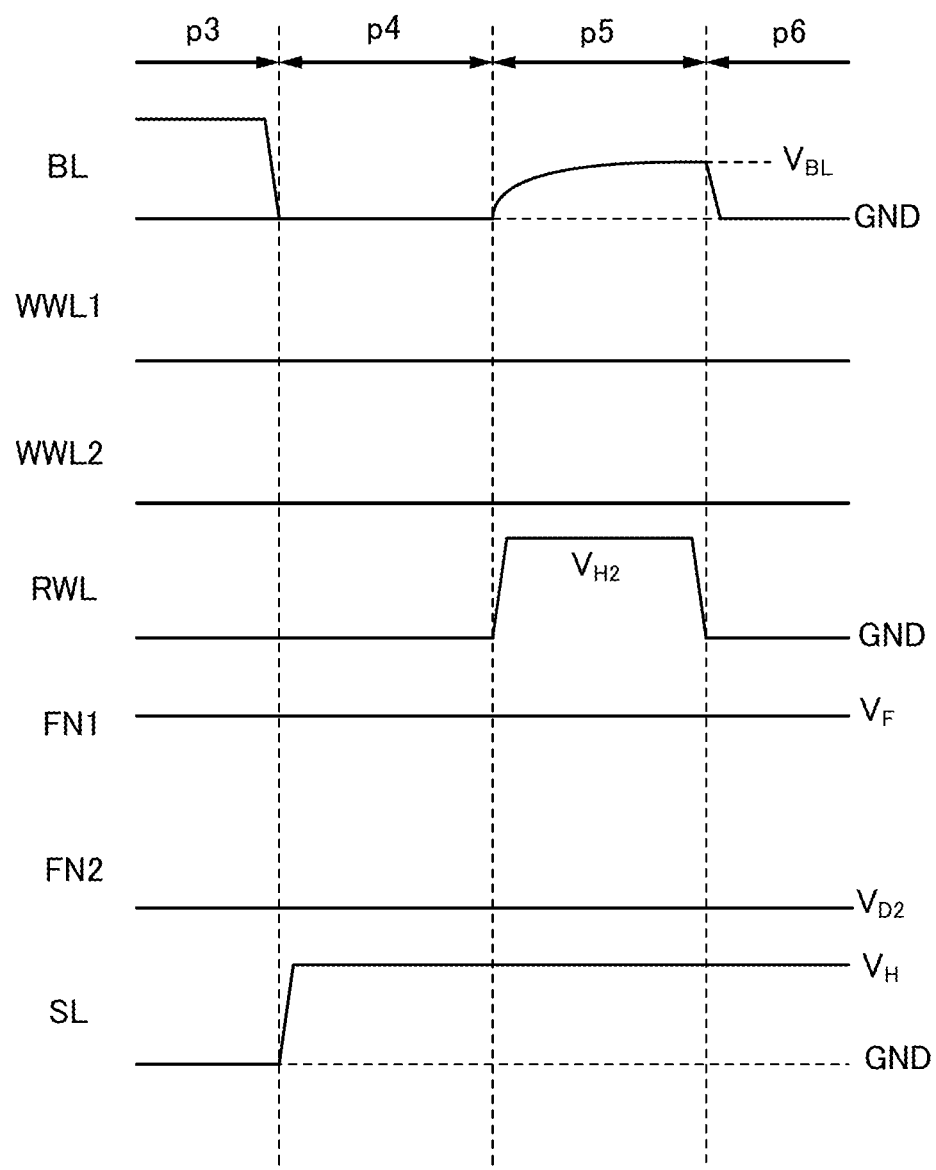
FIG. 4 is a timing chart of a memory cell.

FIG. 4 is a timing chart showing changes of signals supplied to the write word lines WWL1 and WWL2, the read word line RWL, the nodes FN1 and FN2, the bit line BL, and the power supply line SL when the potential written to the node FN1 according to the timing chart of FIG. 3 is read out. The period p3 in FIG. 4 indicates that the state in the period p3 in FIG. 3 is maintained.

In the timing chart of FIG. 4, the potentials of the write word lines WWL1 and WWL2 are always kept at L level, and the node FN1 and the node FN2 always hold the potential $V_F$ and the potential $V_{D2}$, respectively.

In a period p4, the potential of the bit line BL is initialized to GND, and the potential $V_H$ is supplied to the power supply line SL. It is preferred that the potential $V_H$ be higher than or equal to the potential $V_F$ of the node FN1. The read word line RWL is supplied with the L-level potential as in the previous period.

Then, in a period p5, the bit line BL is made electrically floating, and a potential $V_{H2}$ is supplied to the read word line RWL. It is preferred that the potential $V_{H2}$ be sufficiently higher than the potential $V_F$ of the node FN1. The power supply line SL is supplied with the potential $V_H$ as in the previous period.

In the period p5, by supply of the potential $V_{H2}$ to the read word line RWL, the transistors 114 and 115 are turned on, electric charge is transferred from the power supply line SL to the bit line BL through the transistors 114 and 115, and the potential $V_{BL}$ of the bit line BL increases. Eventually, the potential of the bit line BL increases until the potential difference between the node FN1 and the bit line BL becomes equal to $V_{th}$ of the transistor 115. At this time, the potential of the bit line BL is converted into digital data with the use of a comparator or the like, and data held in the memory cell 100 is read out.

With the circuit operation shown in FIG. 4, multilevel data written to the memory cell 100 can be read out.

Figure 40A:
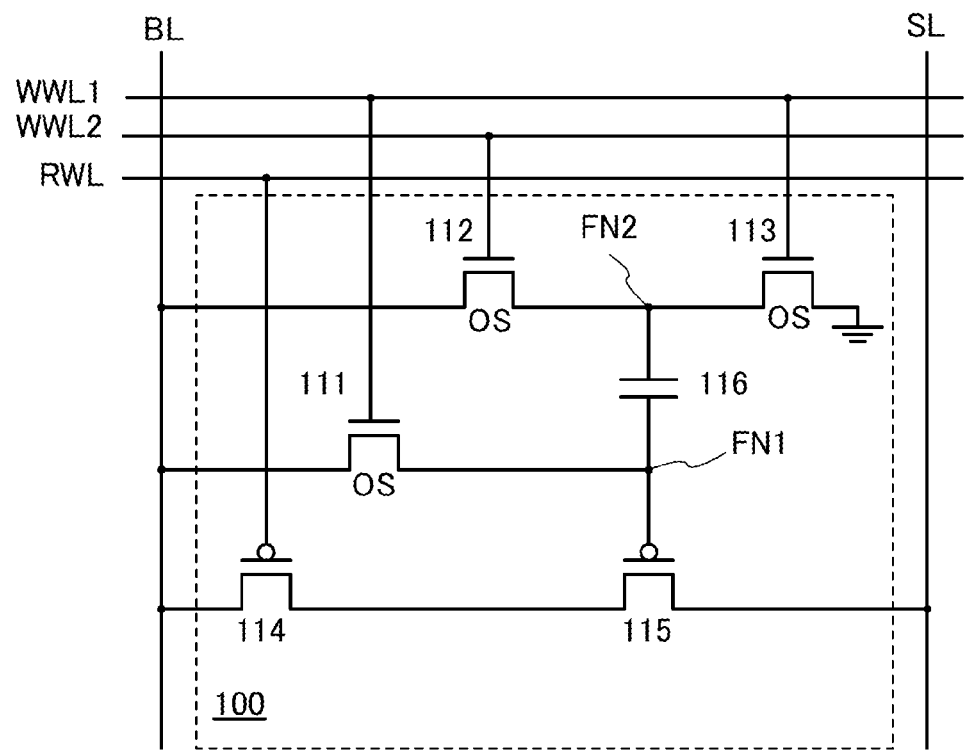
FIGS. 40A and 40B are circuit diagrams of a memory cell.

Although the read operation with the n-channel transistors 114 and 115 is described above, this embodiment may be applied to the case where the transistors 114 and 115 are p-channel transistors (see FIG. 40A).

<Structure Examples of Semiconductor Device>

Next, a cross section of the memory cell 100 in this embodiment will be described with reference to FIGS. 5 and 6.

Figure 5:
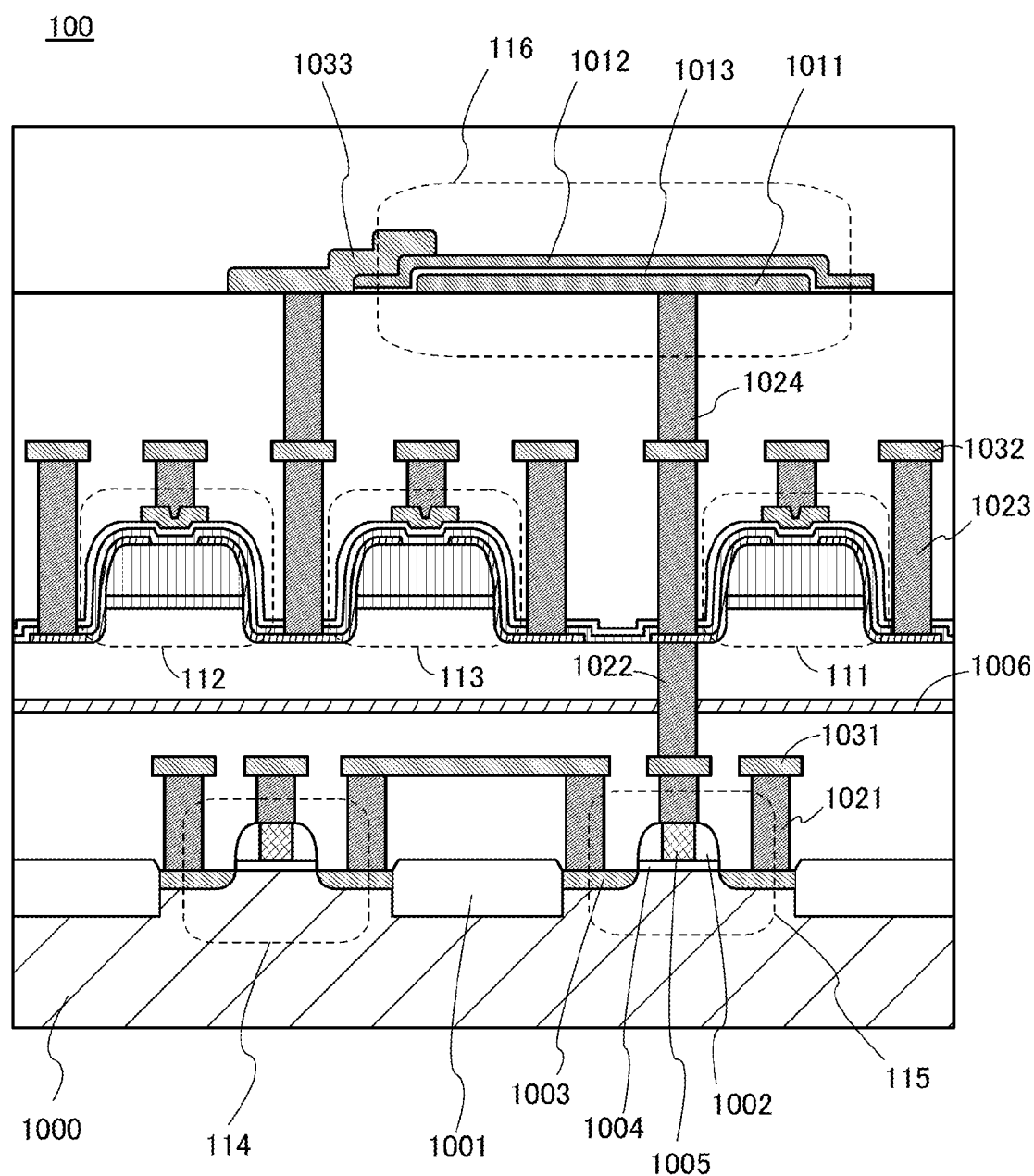
FIG. 5 is a cross-sectional view of a semiconductor device.

FIG. 5 illustrates an example of the cross section of the memory cell 100 in this embodiment. The memory cell 100 in FIG. 5 includes a substrate 1000, an element isolation layer 1001, an insulating film 1006, plugs 1021 to 1024, wirings 1031 to 1033, the transistors 114 and 115 located to be level with each other, the transistors 111 to 113 located to be level with each other, and the capacitor 116. The transistors 111 to 113 are placed above the transistors 114 and 115, and the capacitor 116 is placed above these transistors. Note that in FIG. 5, when there are a plurality of plugs at the same level, a reference numeral is given only to one representative plug and the other plugs are denoted by the reference numeral. Similarly, when there are a plurality of wirings at the same level, a reference numeral is given only to one representative wiring and the other wirings are denoted by the reference numeral.

Although not illustrated in FIG. 5, wirings such as the bit line BL, the power supply line SL, the write word lines WWL1 and WWL2, and the read word line RWL may be provided at the levels shown in FIG. 5 or an upper level as necessary.

Each of the transistors 114 and 115 includes a gate electrode 1005, a gate insulating film 1004, impurity regions 1003 functioning as a source and a drain, and a sidewall insulating layer 1002.

The transistors 114 and 115 may be provided with an impurity region functioning as a lightly doped drain (LDD) region or an extension region under the sidewall insulating layer 1002.

As the transistors 114 and 115, a transistor containing silicide (salicide) or a transistor that does not include the sidewall insulating layer 1002 may be used. With a structure using silicide (salicide), the resistance of the source and drain regions can be further lowered and the operation speed of the semiconductor device can be increased. Furthermore, the semiconductor device can operate at low voltage; thus, power consumption of the semiconductor device can be reduced.

The details of the transistors 111 to 113 will be described below in Embodiment 3.

The capacitor 116 includes a first capacitor electrode 1011, a second capacitor electrode 1012, and a capacitor insulating film 1013.

The substrate 1000 is preferably a semiconductor substrate (e.g., a single crystal substrate or a silicon substrate) or a silicon-on-insulator (SOI) substrate, in which case small transistors with high on-state current can be fabricated.

Alternatively, the substrate 1000 may be an insulating substrate provided with a semiconductor layer. Examples of the insulating substrate include a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base film. Examples of a glass substrate are a barium borosilicate glass substrate, an aluminoborosilicate glass substrate, and a soda lime glass substrate. Examples of a flexible substrate include flexible synthetic resin substrates of plastics typified by polyethylene terephthalate (PET), polyethylene naphthalate (PEN), and polyethersulfone (PES), and acrylic. Examples of the material for an attachment film include polypropylene, polyester, polyvinyl fluoride, and polyvinyl chloride. Examples of the material for a base film are polyester, polyamide, polyimide, aramid, epoxy, an inorganic vapor deposition film, and paper.

It is possible that a memory cell is formed using one substrate and then transferred to another substrate. Examples of a substrate to which a memory cell is transferred include, in addition to the above substrates where the memory cell can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability or high heat resistance can be provided, or reduction in weight or thickness can be achieved.

When a first semiconductor material is used for the transistors 114 and 115 and a second semiconductor material is used for the transistors 111 to 113, the first semiconductor material and the second semiconductor material are preferably materials having different band gaps. For example, the first semiconductor material can be a semiconductor material other than an oxide semiconductor, and the second semiconductor material can be an oxide semiconductor. Specific examples of the first semiconductor material include silicon (including strained silicon), germanium, silicon germanium, silicon carbide, gallium arsenide, aluminum gallium arsenide, indium phosphide, gallium nitride, and an organic semiconductor. A transistor using a material other than an oxide semiconductor, such as single crystal silicon, can operate at high speed easily. In contrast, a transistor using an oxide semiconductor exhibits low off-state current.

Here, when a silicon-based semiconductor material is used for the transistors 114 and 115, hydrogen in an insulating film provided in the vicinity of semiconductor films of the transistors 114 and 115 terminates dangling bonds of silicon; thus, the reliability of the transistors 114 and 115 can be improved. Meanwhile, when an oxide semiconductor is used for the transistors 111 to 113, hydrogen in an insulating film provided in the vicinity of semiconductor films of the transistors 111 to 113 is a factor of generating carriers in the oxide semiconductor; thus, the reliability of the transistors 111 to 113 might be decreased. Consequently, providing the insulating film 1006 with a function of preventing hydrogen diffusion between the lower transistors 114 and 115 and the upper transistors 111 to 113 is particularly effective. The insulating film 1006 makes hydrogen remain in the lower layer, thereby improving the reliability of the transistors 114 and 115. In addition, since the insulating film 1006 suppresses diffusion of hydrogen from the lower layer to the upper layer, the reliability of the transistors 111 to 113 can also be improved.

The insulating film 1006 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example.

The plugs 1021 to 1024 and the wirings 1031 to 1033 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. The plugs and the wirings are particularly preferably formed using a Cu—Mn alloy, in which case manganese oxide formed at the interface with an insulator containing oxygen has a function of preventing Cu diffusion.

Figure 6:
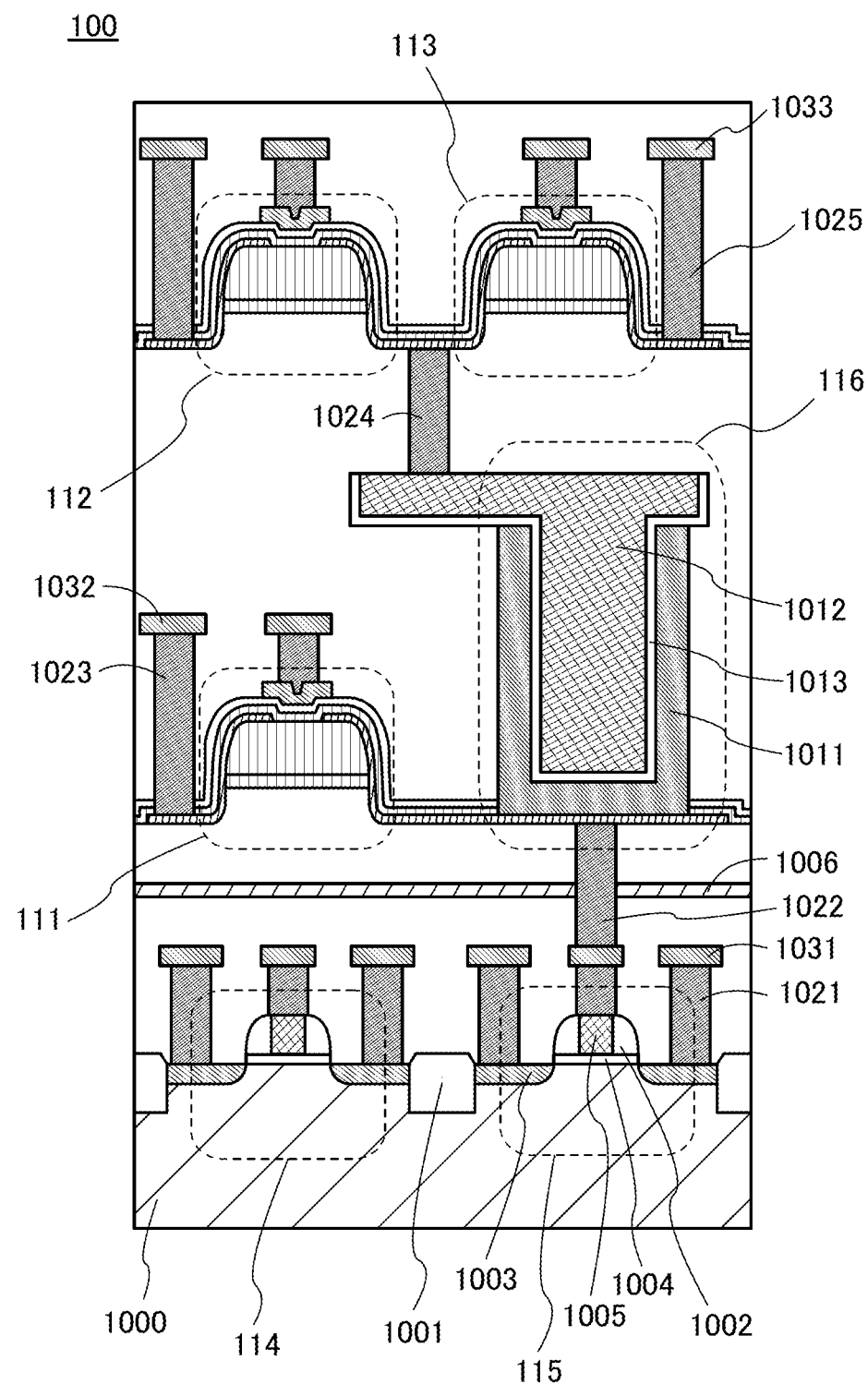
FIG. 6 is a cross-sectional view of a semiconductor device.

In the memory cell 100 in FIG. 5, the transistor 111 and the capacitor 116 may be provided to be level with each other and the transistors 112 and 113 may be provided above the transistor 111 and the capacitor 116 as illustrated in FIG. 6. The structure illustrated in FIG. 6 can increase the integration density of the memory cells 100.

In the cross-sectional views of FIGS. 5 and 6, a region without a hatch pattern represents a region made of an insulator. The region can be formed using an insulator containing at least one of aluminum oxide, aluminum nitride, aluminum nitride oxide, magnesium oxide, silicon oxide, silicon oxynitride, silicon nitride oxide, silicon nitride, gallium oxide, gallium oxynitride, yttrium oxide, yttrium oxynitride, hafnium oxide, hafnium oxynitride, germanium oxide, zirconium oxide, lanthanum oxide, neodymium oxide, tantalum oxide, and the like. Furthermore, a barrier film for preventing diffusion of the metal contained in the wiring and the plug may be provided as needed. The barrier film is preferably formed using silicon nitride, silicon carbide, or the like.

Figure 43:
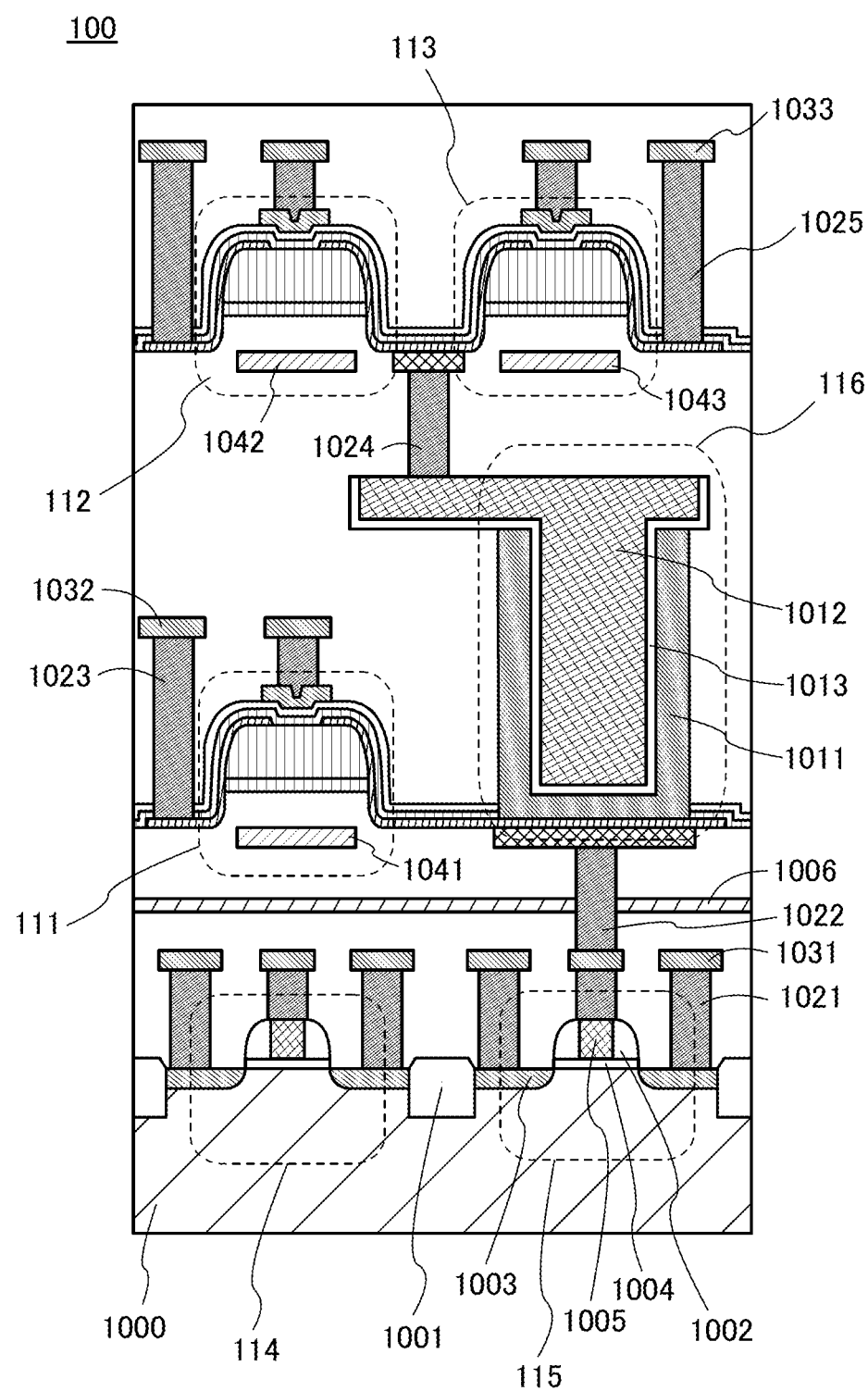
FIG. 43 is a cross-sectional view of a semiconductor device.

Forming the transistors of the memory cell 100 at different levels as illustrated in FIGS. 5 and 6 can increase the integration density of the memory cells 100, resulting in a large-capacity memory device. Note that the transistors 111 to 113 illustrated in FIGS. 5 and 6 may be provided with a second gate electrode. One example is shown in FIG. 43. FIG. 43 illustrates the case where wirings 1041, 1042, and 1043 are provided in the structure of FIG. 6. The wiring 1041 functions as a second gate electrode of the transistor 111. The wiring 1042 functions as a second gate electrode of the transistor 112. The wiring 1043 functions as a second gate electrode of the transistor 113.

Although FIG. 1 illustrates one example of the circuit configuration, one embodiment of the present invention is not limited to this.

Figure 25A:
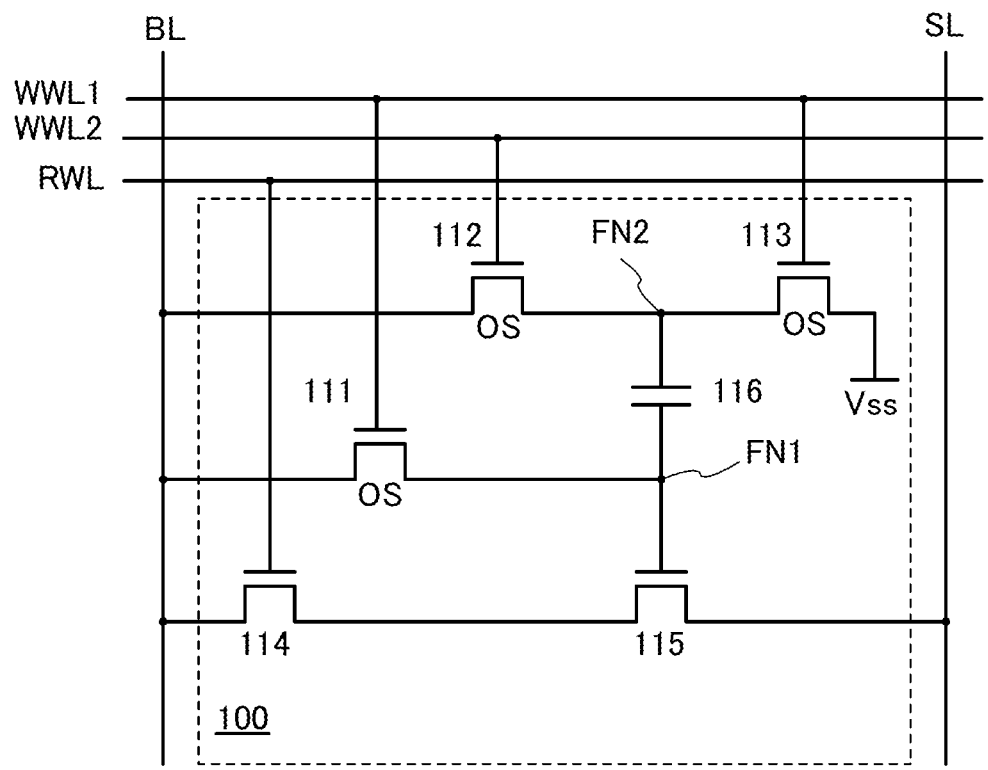
FIGS. 25A and 25B are circuit diagrams of a memory cell.

For example, the other of the source and the drain of the transistor 113 may be connected to a wiring having a function of supplying the power supply voltage (e.g., $V_{dd}$ or $V_{ss}$). As an example, FIG. 25A illustrates the case where the other of the source and the drain of the transistor 113 is connected to a wiring supplied with a low power supply voltage. Note that not only in FIG. 1 but also in other diagrams, the other of the source and the drain of the transistor 113 can be connected as in FIG. 25A.

Figure 25B:
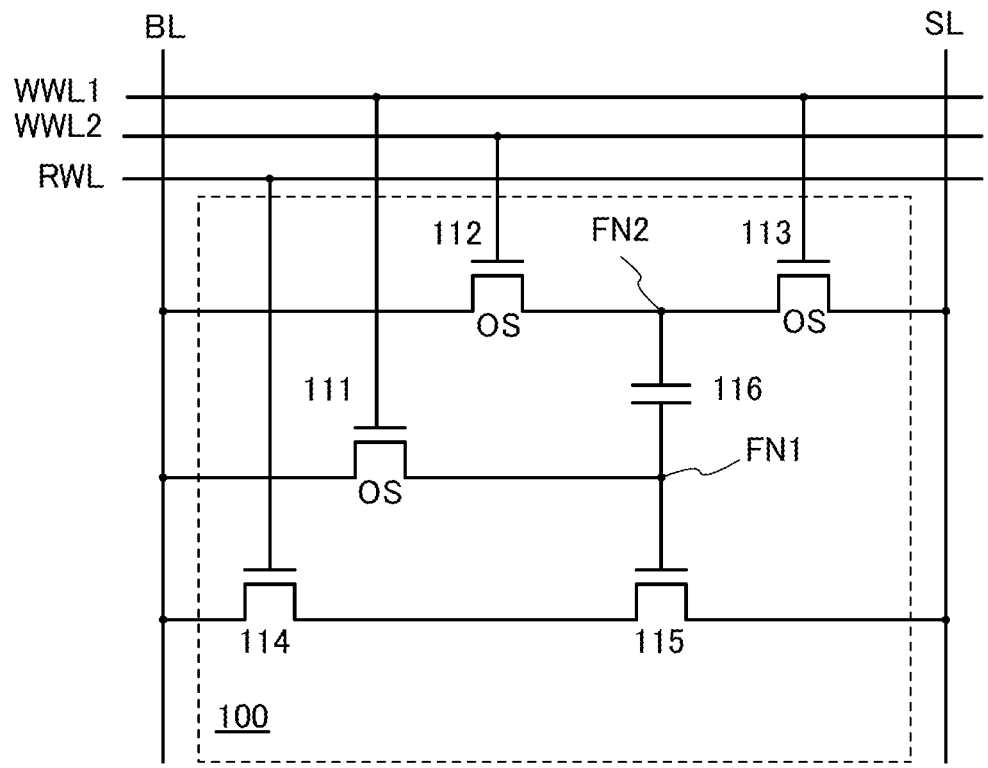

Alternatively, the other of the source and the drain of the transistor 113 may be connected to another wiring. FIG. 25B illustrates an example where the other of the source and the drain of the transistor 113 is connected to the power supply line SL. Note that not only in FIG. 1 but also in other diagrams, the other of the source and the drain of the transistor 113 can be connected as in FIG. 25B.

Figure 26A:
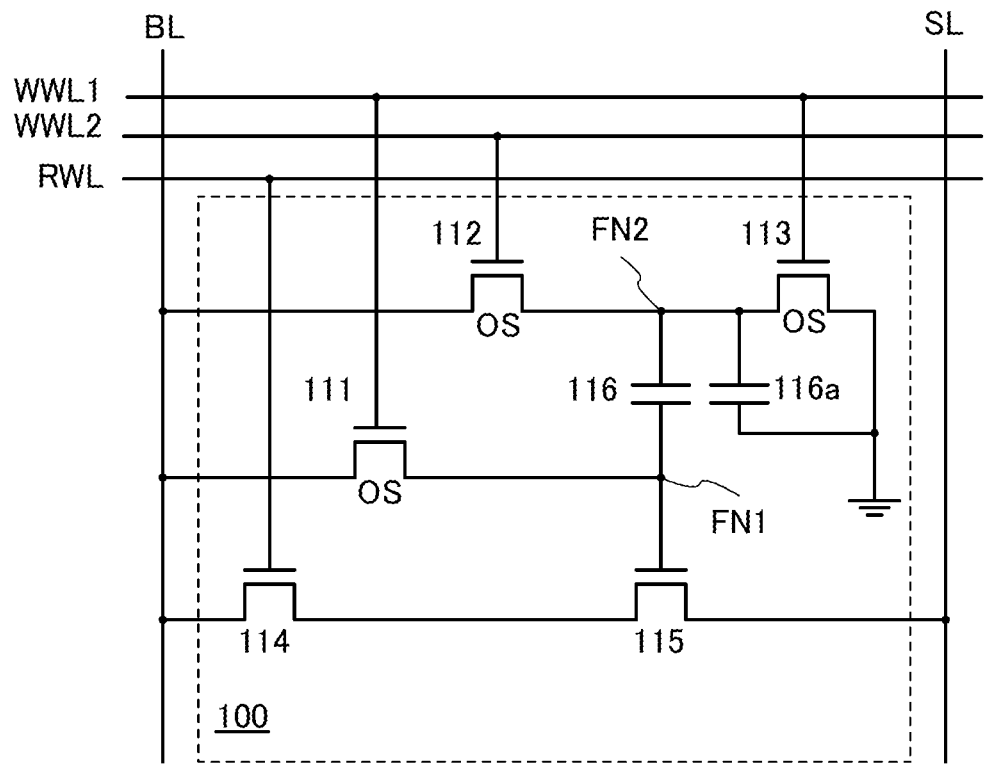
FIGS. 26A and 26B are circuit diagrams of a memory cell.
Figure 26B:
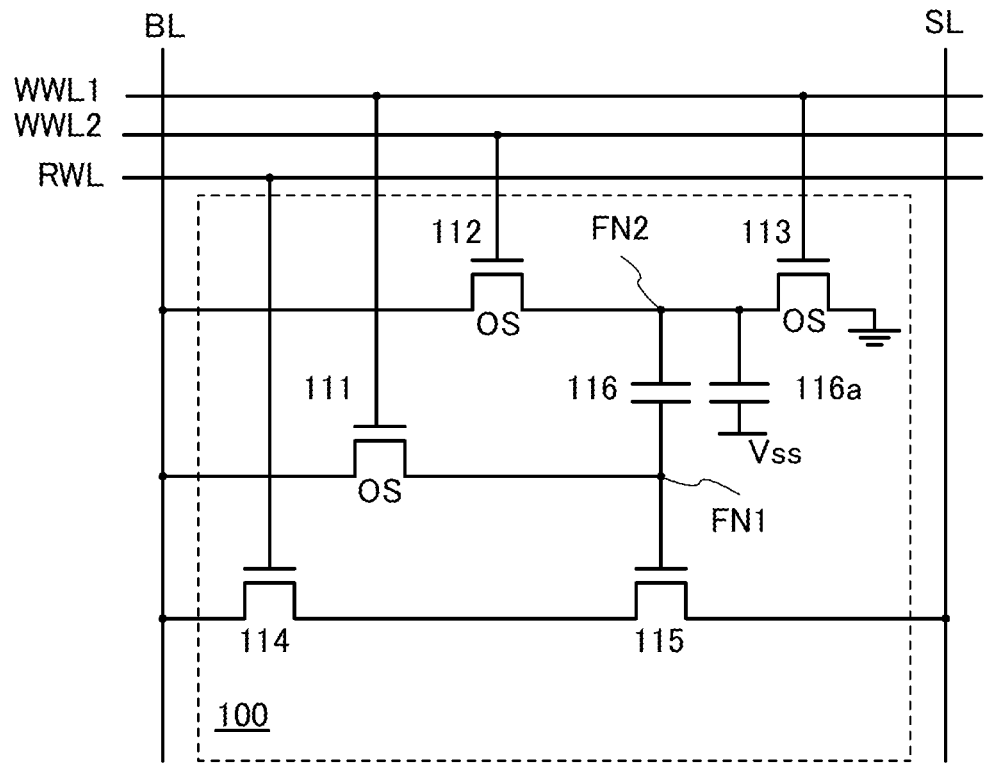

Note that an additional capacitor may be connected to the node FN2. FIGS. 26A and 26B illustrate examples where one terminal of a capacitor 116a is connected to the node FN2. The other terminal of the capacitor 116a may be grounded as illustrated in FIG. 26A, or may be connected to a wiring having a function of supplying the power supply voltage (e.g., $V_{dd}$ or $V_{ss}$) as illustrated in FIG. 26B. Note that not only in FIG. 1 but also in other diagrams, the capacitor 116a can be provided as in FIG. 26A or FIG. 26B.

Figure 27:
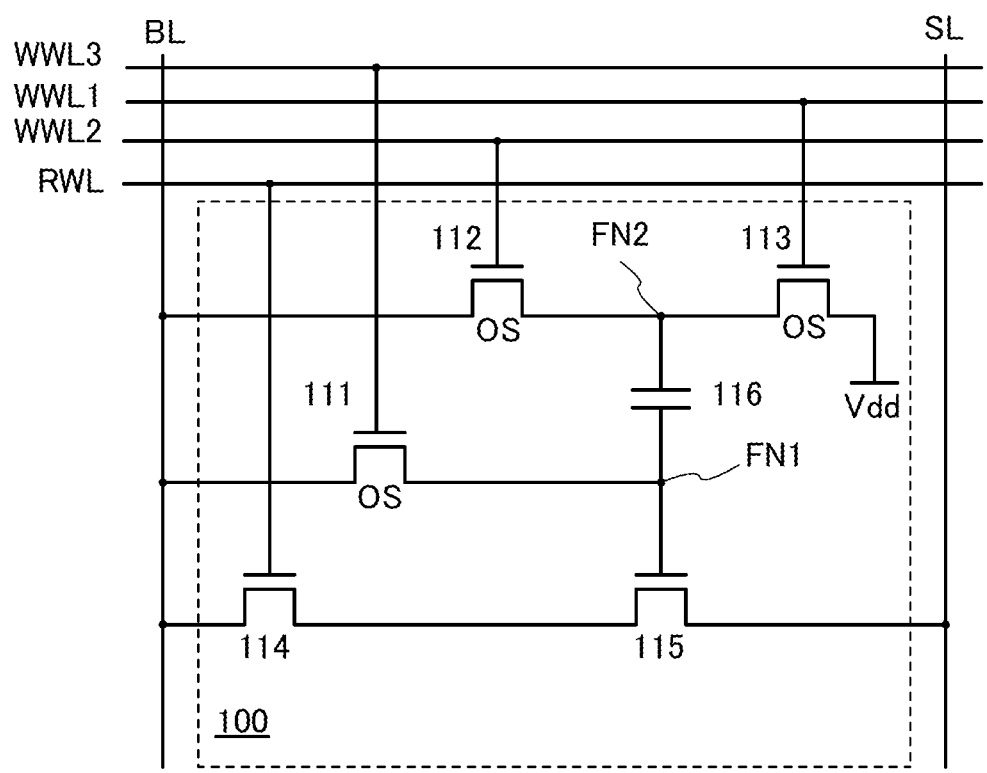
FIG. 27 is a circuit diagram of a memory cell.

Although the transistor 112 and the transistor 113 are connected to the write word line WWL1 in FIG. 1, one embodiment of the present invention is not limited to this. It is possible that a write word line WWL3 is additionally provided and one of the transistors 112 and 113 is connected to the write word line WWL3. An example of this case is shown in FIG. 27. Note that not only in FIG. 1 but also in other diagrams, the write word line WWL3 can be provided and connected as in FIG. 27.

Figure 28A:
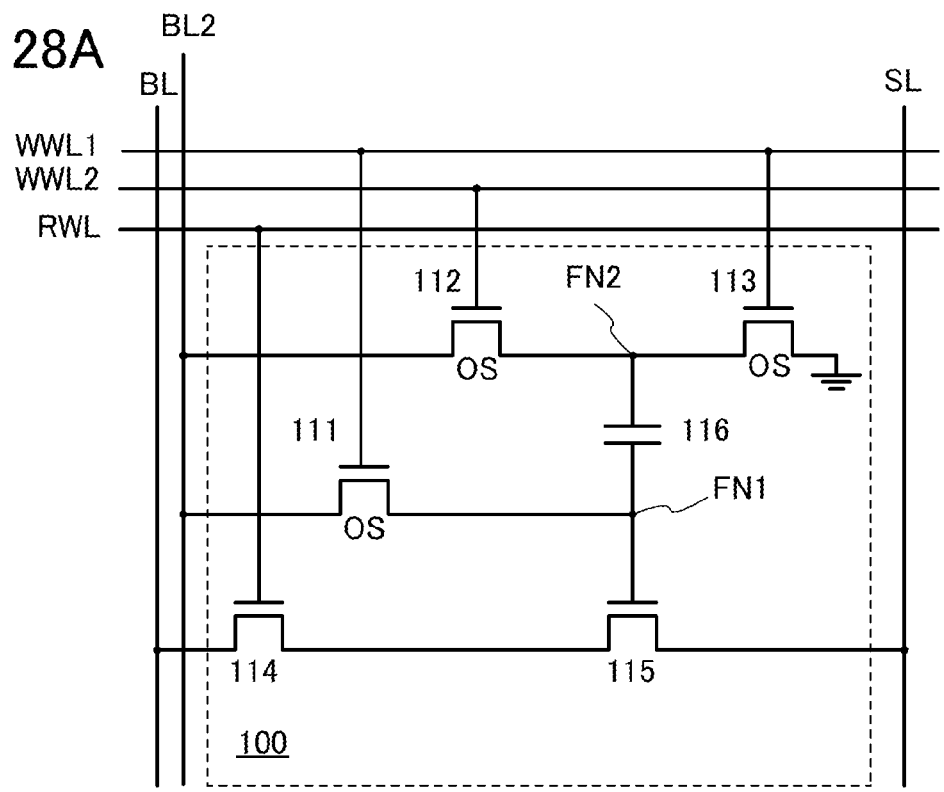
FIGS. 28A and 28B are circuit diagrams of a memory cell.
Figure 28B:
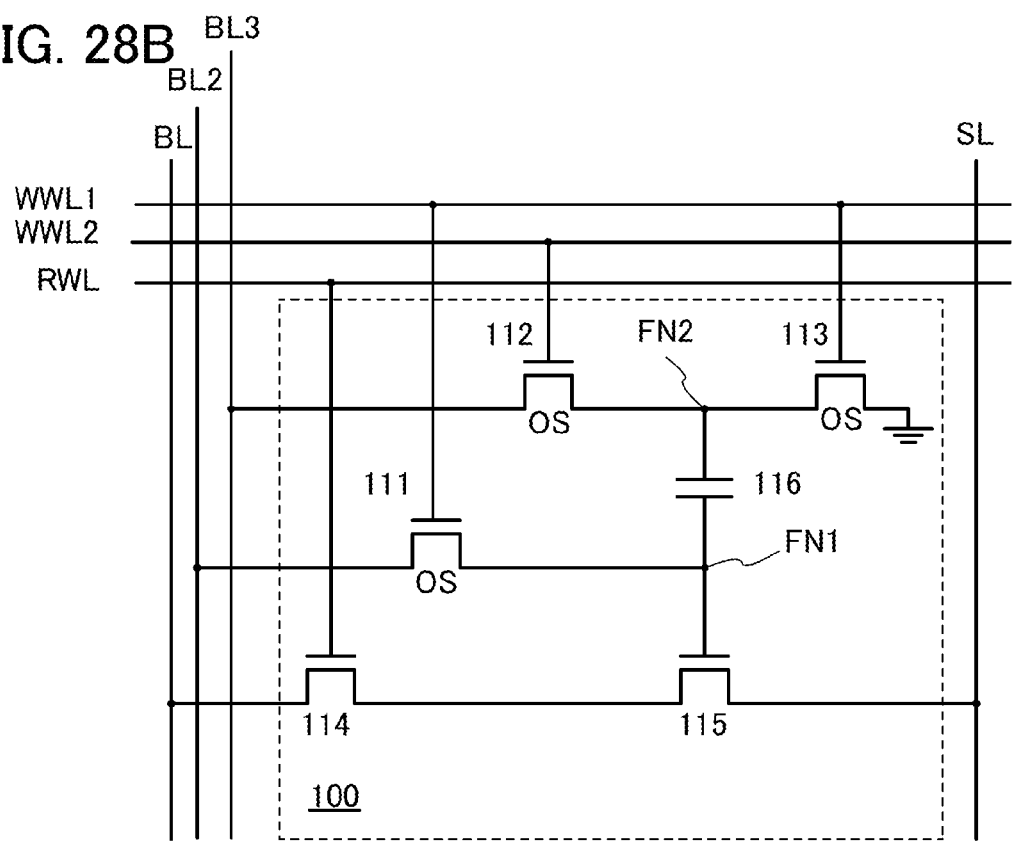

Although the transistor 111, the transistor 112, and the transistor 114 are connected to the bit line BL in FIG. 1, one embodiment of the present invention is not limited to this, and an additional bit line may be provided. For example, it is possible that a bit line BL2 is provided and at least one of the transistors 111, 112, and 114 is connected to the bit line BL2. It is also possible that the bit line BL2 and a bit line BL3 are provided and the transistors 114, 111, and 112 are connected to the respective bit lines BL, BL2, and BL3. FIGS. 28A and 28B illustrate examples of circuit configurations in these cases. Note that not only in FIG. 1 but also in other diagrams, the bit line BL2 and/or the bit line BL3 can be provided and connected as in FIG. 28A or FIG. 28B.

Figure 29:
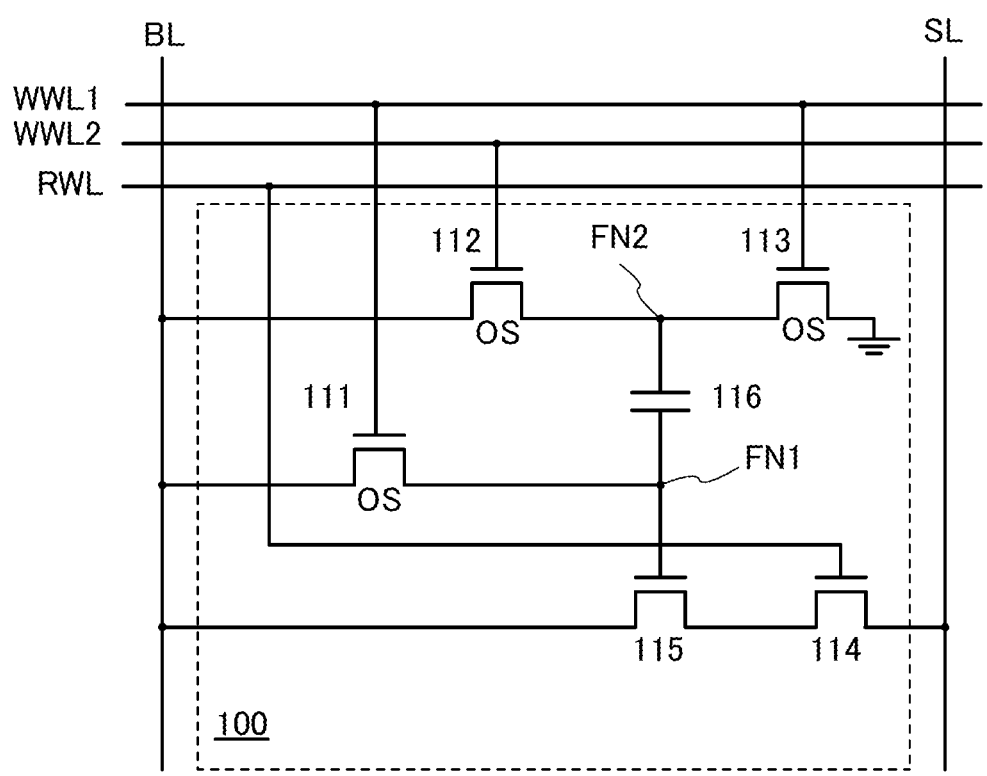
FIG. 29 is a circuit diagram of a memory cell.

The transistor 114 and the transistor 115 are connected in series between the bit line BL and the power supply line SL in FIG. 1, but they may be connected in a different order. An example of this case is shown in FIG. 29. Note that as in FIG. 29, the order of the transistor 114 and the transistor 115 can be changed not only in FIG. 1 but also in other diagrams.

Figure 30A:
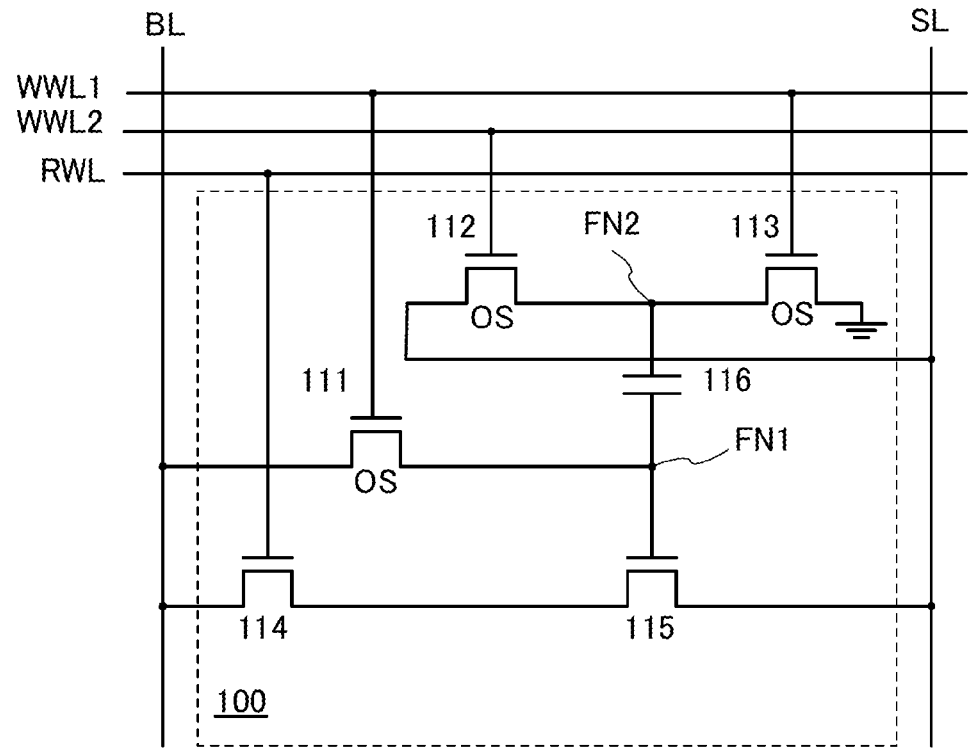
FIGS. 30A and 30B are circuit diagrams of a memory cell.

The one of the source and the drain of the transistor 112 is connected to the bit line BL in FIG. 1; however, one embodiment of the present invention is not limited to this, and the one of the source and the drain of the transistor 112 may be connected to another wiring. FIG. 30A illustrates an example where the one of the source and the drain of the transistor 112 is connected to the power supply line SL. Note that as in FIG. 30A, where to connect the one of the source and the drain of the transistor 112 can be changed not only in FIG. 1 but also in other diagrams.

Figure 30B:
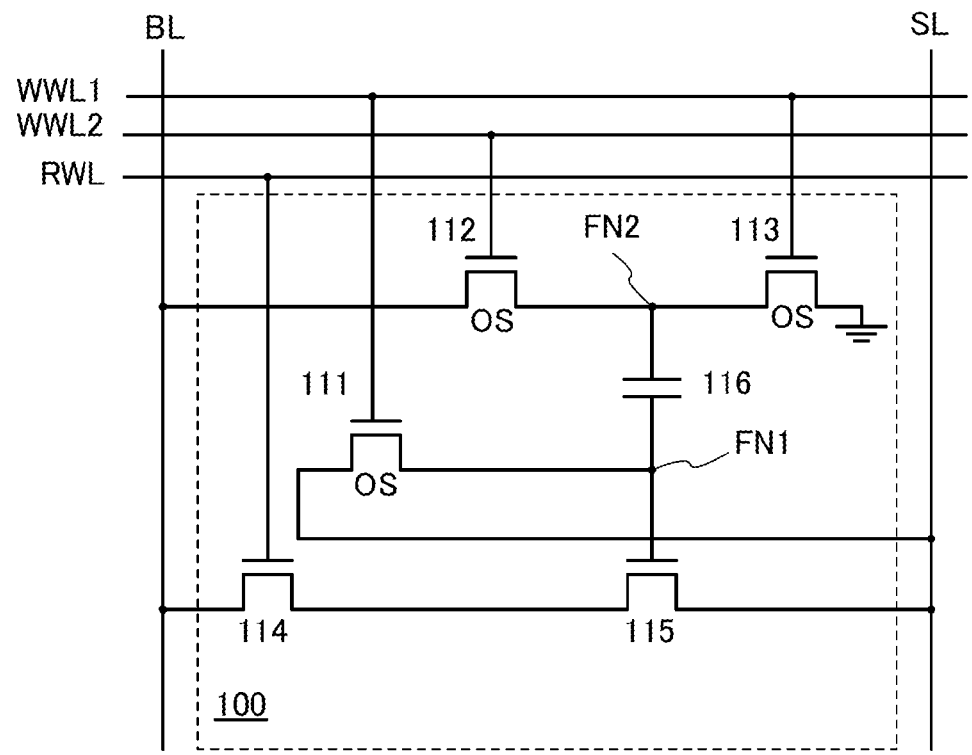

The one of the source and the drain of the transistor 111 is connected to the bit line BL in FIG. 1; however, one embodiment of the present invention is not limited to this, and the one of the source and the drain of the transistor 111 may be connected to another wiring. FIG. 30B illustrates an example where the one of the source and the drain of the transistor 111 is connected to the power supply line SL. Note that as in FIG. 30B, where to connect the one of the source and the drain of the transistor 111 can be changed not only in FIG. 1 but also in other diagrams.

Note that the structures, the methods, and the like described in this embodiment can be combined as appropriate with any of the structures, the methods, and the like described in the other embodiments.

Embodiment 2

In this embodiment, a circuit configuration and operation of a memory cell included in a semiconductor device of one embodiment of the present invention will be described with reference to FIG. 7, FIGS. 8A to 8D, and FIGS. 9 to 11.
<Configuration of Memory Cell>

Figure 7:
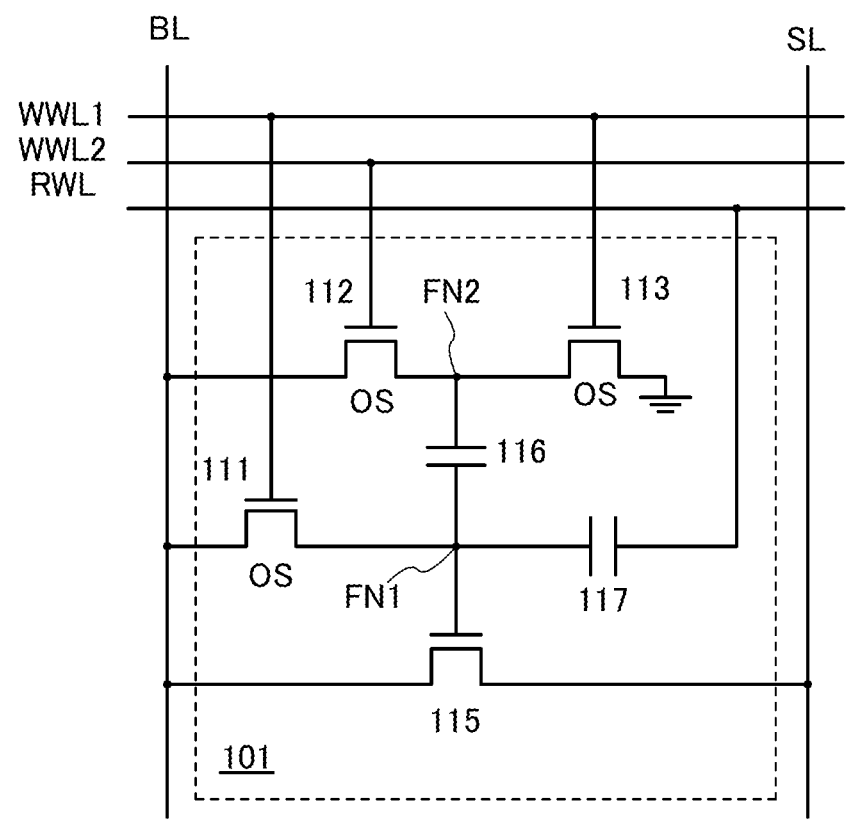
FIG. 7 is a circuit diagram of a memory cell.

FIG. 7 is a circuit diagram of a memory cell 101 of one embodiment of the present invention.

The memory cell 101 illustrated in FIG. 7 includes the transistor 111, the transistor 112, the transistor 113, the transistor 115, the capacitor 116, a capacitor 117, the node FN1, and the node FN2. Although not shown in FIG. 7, a plurality of memory cells 101 are actually arranged in a matrix.

The gate of the transistor 111 is connected to the write word line WWL1. One of the source and the drain of the transistor 111 is connected to the bit line BL. The other of the source and the drain of the transistor 111 is connected to the node FN1.

The gate of the transistor 112 is connected to the write word line WWL2. One of the source and the drain of the transistor 112 is connected to the bit line BL. The other of the source and the drain of the transistor 112 is connected to the node FN2.

The gate of the transistor 113 is connected to the write word line WWL1. One of the source and the drain of the transistor 113 is connected to the node FN2. The other of the source and the drain of the transistor 113 is grounded.

The gate of the transistor 115 is connected to the node FN1. One of the source and the drain of the transistor 115 is connected to the power supply line SL. The other of the source and the drain of the transistor 115 is connected to the bit line BL.

One electrode of the capacitor 116 is connected to the node FN1. The other electrode of the capacitor 116 is connected to the node FN2.

One electrode of the capacitor 117 is connected to the node FN1. The other electrode of the capacitor 117 is connected to the read word line RWL.

The memory cell 101 is different from the memory cell 100 shown in Embodiment 1 in that the transistor 114 is omitted and the capacitor 117 is additionally provided.

As in Embodiment 1, the transistors 111 to 113 and 115 are described as n-channel transistors.

The description of Embodiment 1 is referred to for the details of the transistors 111 to 113 and 115.

The capacitance $C_0$ of the capacitor 116 is sufficiently larger than the capacitance $C_{Tr}$ between the gate electrode and the source and drain electrodes of the transistor 115 ($C_0 \gg C_{Tr}$).

Capacitance $C_R$ of the capacitor 117 is sufficiently larger than the capacitance $C_{Tr}$ ($C_R \gg C_{Tr}$).

The capacitance $C_R$ of the capacitor 117 is larger than the capacitance $C_0$ of the capacitor 116 ($C_R > C_0$). The capacitance $C_R$ is preferably 1 to 10 times, more preferably 1 to 5 times the capacitance $C_0$.

<Operation>

Next, an example of the operation of the memory cell 101 will be described with reference to FIGS. 8A to 8D. FIGS. 8A to 8D schematically illustrate the operation of the memory cell 101. In FIGS. 8A to 8D, the transistors 111 to 113 are shown as switches.

First, write operation of the memory cell 101 will be described with reference to FIGS. 8A and 8B.

Figure 8A:
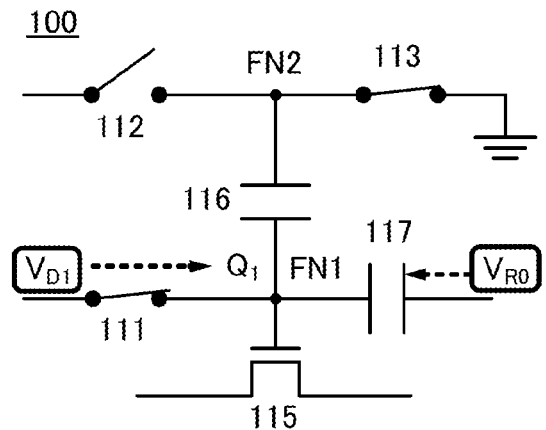
FIGS. 8A to 8D illustrate circuit operation of a memory cell.

In FIG. 8A, the transistors 111 and 113 are turned on and the transistor 112 is turned off, and the potential $V_{D1}$ is supplied to the node FN1 through the transistor 111 to write the electric charge $Q_1$. A constant potential $V_{R0}$ is supplied to the other electrode of the capacitor 117.

Figure 8B:
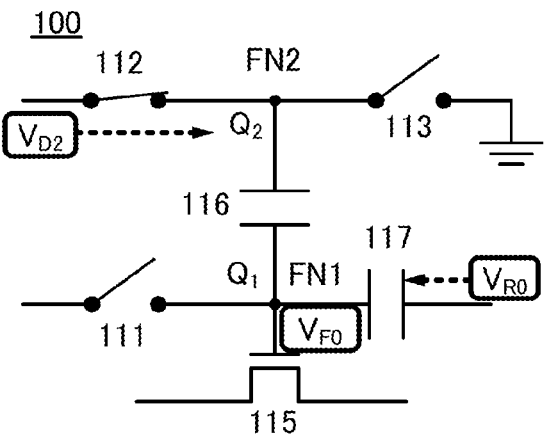

In FIG. 8B, the transistor 112 is turned on and the transistors 111 and 113 are turned off, and the potential $V_{D2}$ is supplied to the node FN2 through the transistor 112 to write the electric charge $Q_2$. As in FIG. 8A, the constant potential $V_{R0}$ is supplied to the other electrode of the capacitor 117.

At this time, a potential $V_{F0}$ of the node FN1 is represented by Formula 3. Note that the capacitance $C_{Tr}$ is omitted in Formula 3 because each of the capacitance $C_0$ and the capacitance $C_R$ is assumed to be sufficiently larger than the capacitance $C_{Tr}$ ($C_0 \gg C_{Tr}$, $C_R \gg C_{Tr}$) in the process of deriving Formula 3.

$$V_{F0} = V_{D1} + \frac{C_0}{C_0 + C_R} V_{D2} \quad \text{[Formula 3]}$$

For example, when the capacitance $C_R$ is twice the capacitor $C_0$ ($C_R/C_0=2$), the potential $V_{D1}$ has 4 values such that $V_{D1}=\{0\,V, 1\,V, 2\,V, 3\,V\}$, and the potential $V_{D2}$ has 4 values such that $V_{D2}=\{0.75\,V, 1.5\,V, 2.25\,V, 3\,V\}$, the potential $V_{F0}$ can have 16 levels of potentials such that $V_{F0}=\{0.25\,V, 0.5\,V, 0.75\,V, 1\,V, 1.25\,V, 1.5\,V, 1.75\,V, 2\,V, 2.25\,V, 2.5\,V, 2.75\,V, 3\,V, 3.25\,V, 3.5\,V, 3.75\,V, 4\,V\}$. That is, when the potential $V_{D1}$ is M-bit data ($2^M$ levels, where M is a natural number of 1 or more) and the potential $V_{D2}$ is N-bit data ($2^N$ levels, where N is a natural number of 1 or more), the potential $V_F$ can have (M+N)-bit data ($2^{M+N}$ levels).

Then, the transistors 111 to 113 are turned off to make the nodes FN1 and FN2 electrically floating, whereby the electric charge $Q_1$ and the electric charge $Q_2$ are held. The electric charge $Q_1$ and the electric charge $Q_2$ can be retained because the off-state current of the transistors 111 to 113 is low.

By the method shown in FIGS. 8A and 8B, multilevel data corresponding to the potential $V_{D1}$ and the potential $V_{D2}$ can be written to the memory cell 101.

Next, read operation of the memory cell 101 will be described with reference to FIGS. 8C and 8D.

First, the potential of the bit line BL is set at GND, and the potential $V_H$ is supplied to the power supply line SL. The potential $V_H$ supplied to the power supply line SL is set higher than or equal to the potential $V_{F0}$. Moreover, the transistors 111 to 113 are turned off to make the nodes FN1 and FN2 electrically floating (FIG. 8C).

Figure 8C:
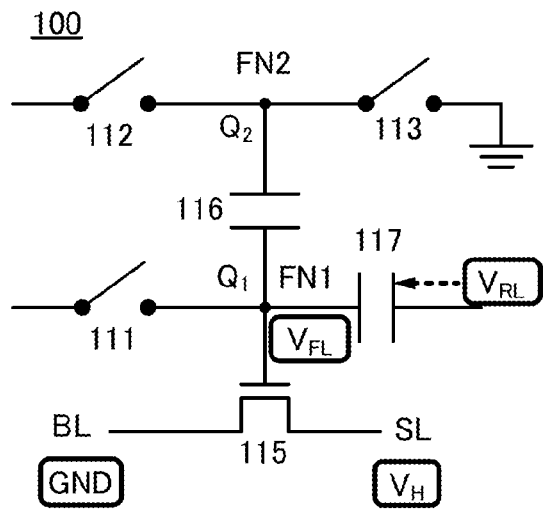

In FIG. 8C, a potential $V_{RL}$ is supplied to the other electrode of the capacitor 117 to keep the transistor 115 off. At this time, a potential $V_{FL}$ of the node FN1 is represented by Formula 4. Note that each of the capacitance $C_0$ and the capacitance $C_R$ is assumed to be sufficiently larger than the capacitance $C_{Tr}$ ($C_0 \gg C_{Tr}$, $C_R \gg C_{Tr}$) in the process of deriving Formula 4.

$$V_{FL} = V_{D1} + \frac{C_0}{C_0 + C_R} V_{D2} + \frac{C_R}{C_0 + C_R}(V_{RL} - V_{R0}) \quad \text{[Formula 4]}$$

In FIG. 8C, the potential difference between the node FN1 and the bit line BL is preferably less than or equal to the threshold voltage of the transistor 115 to keep the transistor 115 off. Accordingly, the potential $V_{RL}$ is preferably lower than or equal to 0 V.

Then, the bit line BL is made electrically floating, and a potential $V_{R3}$ is supplied to the other electrode of the capacitor 117. As the potential $V_{R3}$, a potential higher than the potential $V_{RL}$ is supplied. With the potential $V_{R3}$, the potential of the node FN1 increases to a potential $V_{F3}$ according to Formula 5 (FIG. 8D).

$$V_{F3} = V_{D1} + \frac{C_0}{C_0 + C_R} V_{D2} + \frac{C_R}{C_0 + C_R}(V_{R3} - V_{R0}) \quad \text{[Formula 5]}$$

At this time, the difference between the potential $V_{F3}$ of the node FN1 and the potential $V_{BL}$ of the bit line BL corresponds to the potential $V_{GS}$ between the gate and the source of the transistor 115. When the difference between the potential $V_{F3}$ and the potential $V_{BL}$ is greater than the threshold voltage $V_{th}$ of the transistor 115, the transistor 115 is turned on, current flows from the power supply line SL to the bit line BL, and the bit line BL is charged (FIG. 8D).

Eventually, the potential $V_{BL}$ of the bit line BL increases until the difference between the potential $V_{F3}$ of the node FN1 and the potential of $V_{BL}$ of the bit line BL becomes equal to the threshold voltage $V_{th}$ of the transistor 115. By converting the potential of the bit line BL at this time into digital data with the use of a comparator or the like, data held in the memory cell 101 can be read out.

Figure 8D:
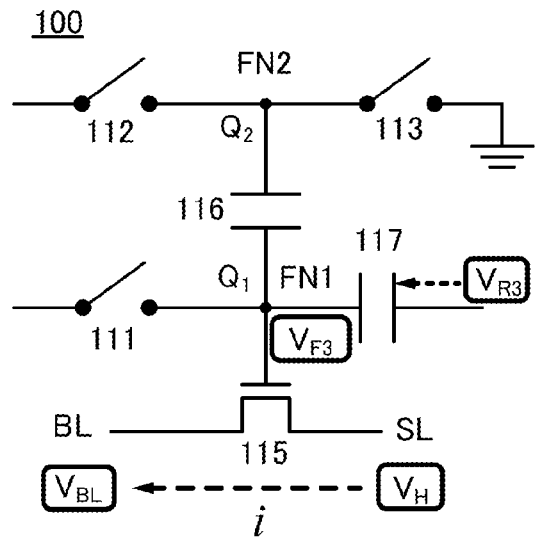

By the method shown in FIGS. 8C and 8D, multilevel data written to the memory cell 101 can be read out.

<Timing Chart for Write Operation>

Figure 9:
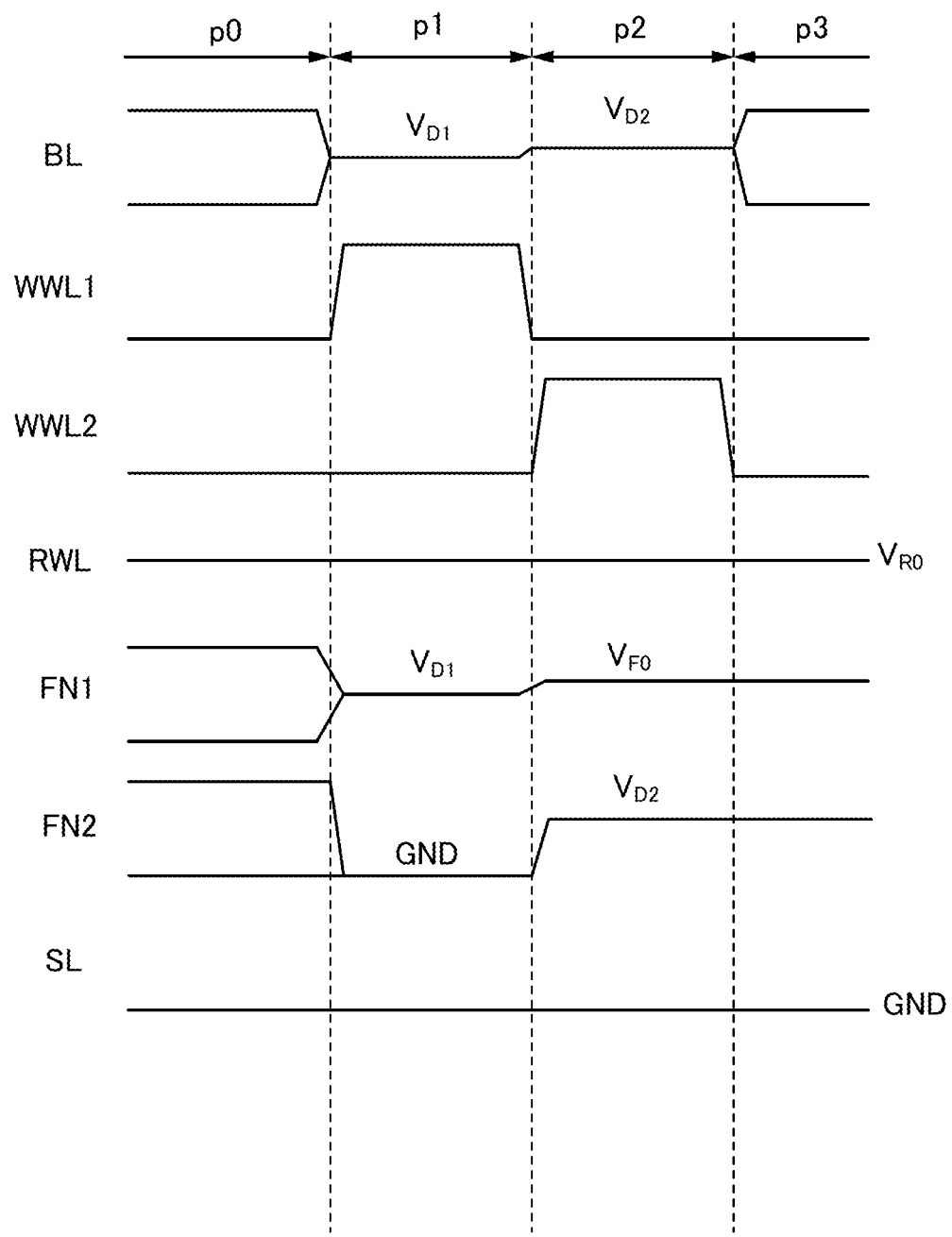
FIG. 9 is a timing chart of a memory cell.

FIG. 9 is a timing chart showing changes of signals supplied to the write word lines WWL1 and WWL2, the read word line RWL, the nodes FN1 and FN2, the bit line BL, and the power supply line SL when data is written to the memory cell 101 in FIG. 7.

In the timing chart of FIG. 9, the potential of the power supply line SL is always kept at GND and the potential of the read word line RWL is always kept at $V_{R0}$.

In a period p1 after a period p0 during which the memory cell 101 is in an initial state, the potential $V_{D1}$ is supplied to the bit line BL, an H-level signal is supplied to the write word line WWL1, and an L-level signal is supplied to the write word line WWL2.

In the period p1, the transistors 111 and 113 are turned on, and the transistor 112 is turned off. At this time, the potential $V_{D1}$ supplied to the bit line BL is written to the node FN1 through the transistor 111.

Then, in a period p2, the potential $V_{D2}$ is supplied to the bit line BL, an L-level signal is supplied to the write word line WWL1, and an H-level signal is supplied to the write word line WWL2.

In the period p2, the transistors 111 and 113 are turned off, and the transistor 112 is turned on. At this time, the potential $V_{D2}$ supplied to the bit line BL is written to the node FN2 through the transistor 112, and the potential of the node FN1 changes to the potential $V_{F0}$ according to Formula 3.

The potential $V_{F0}$ can be a value corresponding to multilevel data based on the potential $V_{D1}$ and the potential $V_{D2}$.

In a period p3, an L-level signal is supplied to the write word lines WWL1 and WWL2, and the transistors 111 to 113 are turned off. Thus, the potential $V_{F0}$ of the node FN1 and the potential $V_{D2}$ of the node FN2 are held.

With the circuit operation shown in FIG. 9, multilevel data can be written to the memory cell 101.

<Timing Chart for Read Operation>

Figure 10:
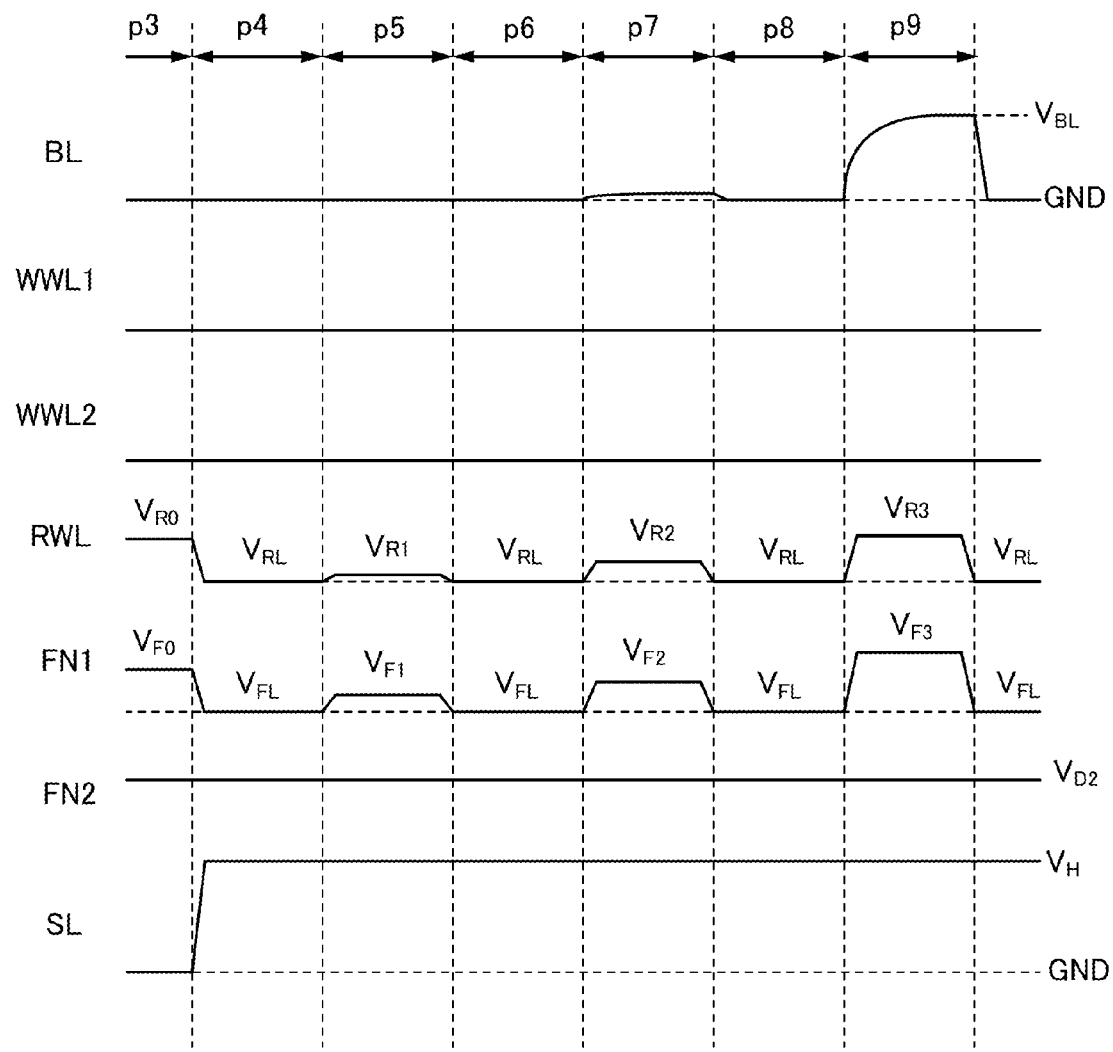
FIG. 10 is a timing chart of a memory cell.

FIG. 10 is a timing chart showing changes of signals supplied to the write word lines WWL1 and WWL2, the read word line RWL, the nodes FN1 and FN2, the bit line BL, and the power supply line SL when the potential written to the node FN1 according to the timing chart of FIG. 9 is read out. The period p3 in FIG. 10 indicates that the state in the period p3 in FIG. 9 is maintained.

In the timing chart of FIG. 10, the potentials of the write word lines WWL1 and WWL2 are always kept at L level, and the node FN2 always holds the potential $V_{D2}$.

In a period p4 after the period p3, the potential of the bit line BL is initialized to GND, and the potential $V_H$ is supplied to the power supply line SL. Moreover, the negative potential $V_{RL}$ is supplied to the read word line RWL to decrease the potential of the node FN1 to the potential $V_{FL}$, whereby the transistor 115 is turned off.

Then, in a period p5, the bit line BL is made electrically floating, and a potential $V_{R1}$ is supplied to the read word line RWL. Supply of the potential $V_{R1}$ increases the potential of the node FN1 to a potential $V_{F1}$; however, the potential difference between the node FN1 and the bit line BL remains less than the threshold voltage of the transistor 115. Thus, the transistor 115 is kept off and electric charge does not move to the bit line BL, so that the bit line BL is kept at GND.

Next, in a period p6, the potential of the bit line BL is initialized to GND again, and the negative potential $V_{RL}$ is supplied to the read word line RWL to decrease the potential of the node FN1 to the potential $V_{FL}$, whereby the transistor 115 is turned off.

Then, in a period p7, the bit line BL is made electrically floating, and a potential $V_{R2}$ is supplied to the read word line RWL. Supply of the potential $V_{R2}$ increases the potential of the node FN1 to a potential $V_{F2}$ and makes the potential difference between the node FN1 and the bit line BL close to a value that is slightly less than the threshold voltage of the transistor 115. As a result, leakage current flows through the transistor 115, and the potential of the bit line BL increases slightly.

Subsequently, in a period p8, the potential of the bit line BL is initialized to GND again, and the negative potential $V_{RL}$ is supplied to the read word line RWL to decrease the potential of the node FN1 to the potential $V_{FL}$, whereby the transistor 115 is turned off.

Then, in a period p9, the bit line BL is made electrically floating, the potential $V_{R3}$ is supplied to the read word line RWL. Supply of the potential $V_{R3}$ increases the potential of the node FN1 to the potential $V_{F3}$ and makes the potential difference between the node FN1 and the bit line BL exceed the threshold voltage of the transistor 115. Consequently, the transistor 115 is turned on and the bit line BL is charged, whereby the potential of the bit line BL increases.

Eventually, the potential $V_{BL}$ of the bit line BL increases until the difference between the potential $V_{F3}$ of the node FN1 and the potential $V_{BL}$ of the bit line BL becomes equal to the threshold voltage $V_{th}$ of the transistor 115 ($V_{F3} - V_{BL} = V_{th}$, i.e., $V_{BL} = V_{F3} - V_{th}$). By converting the potential $V_{BL}$ at this time into digital data with the use of a comparator or the like, data held in the memory cell 101 can be read out.

With the circuit operation shown in FIG. 10, multilevel data written to the memory cell 101 can be read out.

Figure 40B:
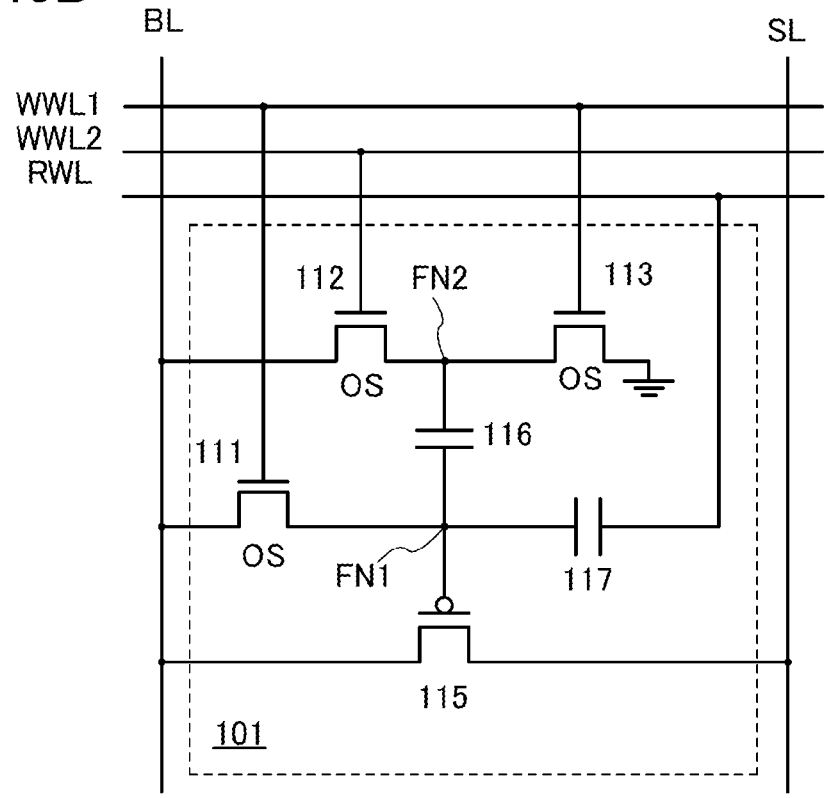

Although the read operation with the n-channel transistor 115 is described above, this embodiment may be applied to the case where the transistor 115 is a p-channel transistor (see FIG. 40B). In that case, data is read in such a manner that a precharge potential is supplied to the bit line BL while the power supply line SL is kept at GND, and then the bit line BL is made electrically floating and the potential of the bit line BL is released to the power supply line SL through the transistor 115. It is preferred that a sufficiently high potential be supplied to the read word line RWL when data reading is not performed (when the transistor 115 is turned off), and that the potential of the read word line RWL decrease from the high potential to the low potential when data reading is performed (when the transistor 115 is turned on).

<Structure Example of Semiconductor Device>

Next, a cross section of the memory cell 101 in this embodiment will be described with reference to FIG. 11.

Figure 11:
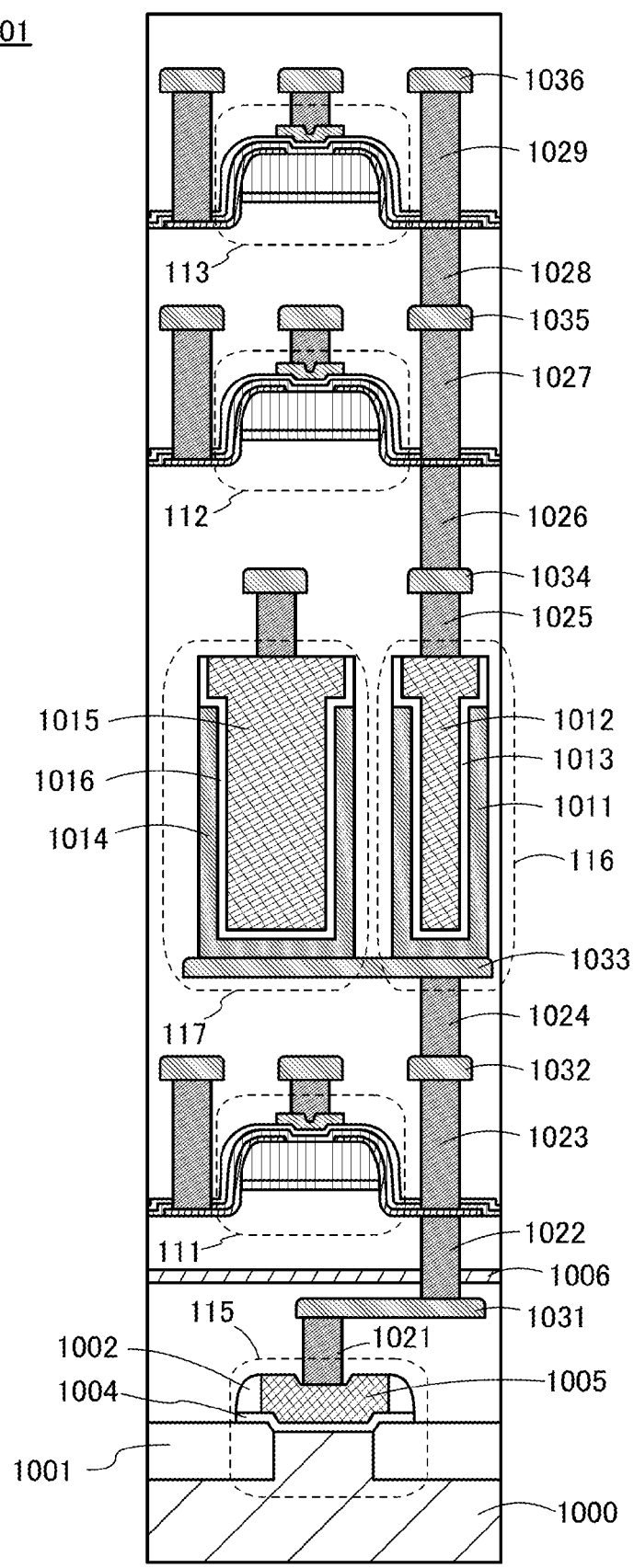
FIG. 11 is a cross-sectional view of a semiconductor device.

FIG. 11 illustrates an example of the cross section of the memory cell 101 in this embodiment. The memory cell 101 in FIG. 11 includes the substrate 1000, the element isolation layer 1001, the transistor 115, the transistor 111 above the transistor 115, the capacitors 116 and 117 above the transistor 111, the transistor 112 above the capacitors 116 and 117, the transistor 113 above the transistor 112, plugs 1021 to 1029, wirings 1031 to 1036, and the insulating film 1006. Note that in FIG. 11, when there are a plurality of plugs at the same level, a reference numeral is given only to one representative plug and the other plugs are denoted by the reference numeral. Similarly, when there are a plurality of wirings at the same level, a reference numeral is given only to one representative wiring and the other wirings are denoted by the reference numeral.

In FIG. 11, the transistor 115 includes the gate insulating film 1004, the gate electrode 1005, and the sidewall insulating layer 1002. FIG. 11 illustrates the cross section of the transistor 115 in the channel width direction.

In FIG. 11, the capacitor 116 includes the first capacitor electrode 1011, the second capacitor electrode 1012, and the capacitor insulating film 1013, and the capacitor 117 includes a first capacitor electrode 1014, a second capacitor electrode 1016, and a capacitor insulating film 1015. The capacitors 116 and 117 are located at the same level.

In FIG. 11, the positions of the transistor 112 and the transistor 113 may be interchanged.

Although not illustrated in FIG. 11, wirings such as the bit line BL, the power supply line SL, the write word lines WWL1 and WWL2, and the read word line RWL may be provided at the levels shown in FIG. 11 or an upper level as necessary.

The description of Embodiment 1 is referred to for the details of the substrate 1000, the transistors 111 to 113 and 115, and the insulating film 1006 in FIG. 11. The description of the plugs 1021 to 1024 in FIG. 5 is referred to for the details of the plugs 1021 to 1029. The description of the wirings 1031 to 1033 in FIG. 5 is referred to for the details of the wirings 1031 to 1036.

In the cross-sectional view of FIG. 11, a region without a hatch pattern represents a region made of an insulator. The region can be formed using an insulator containing at least one of aluminum oxide, aluminum nitride, aluminum nitride oxide, magnesium oxide, silicon oxide, silicon oxynitride, silicon nitride oxide, silicon nitride, gallium oxide, gallium oxynitride, yttrium oxide, yttrium oxynitride, hafnium oxide, hafnium oxynitride, germanium oxide, zirconium oxide, lanthanum oxide, neodymium oxide, tantalum oxide, and the like. Furthermore, a barrier film for preventing diffusion of the metal contained in the wiring and the plug may be provided as needed. The barrier film is preferably formed using silicon nitride, silicon carbide, or the like.

As in the memory cell 100 illustrated in FIG. 5, the transistors 111 to 113 in the memory cell 101 may be formed at the same level. Furthermore, as in the memory cell 100 illustrated in FIG. 6, the transistors 112 and 113 in the memory cell 101 may be formed at the same level.

Forming the transistors of the memory cell 101 at different levels as illustrated in FIG. 11 can increase the integration density of the memory cells 101, resulting in a large-capacity memory device.

Although FIG. 7 illustrates one example of the circuit configuration, one embodiment of the present invention is not limited to this.

Figure 31A:
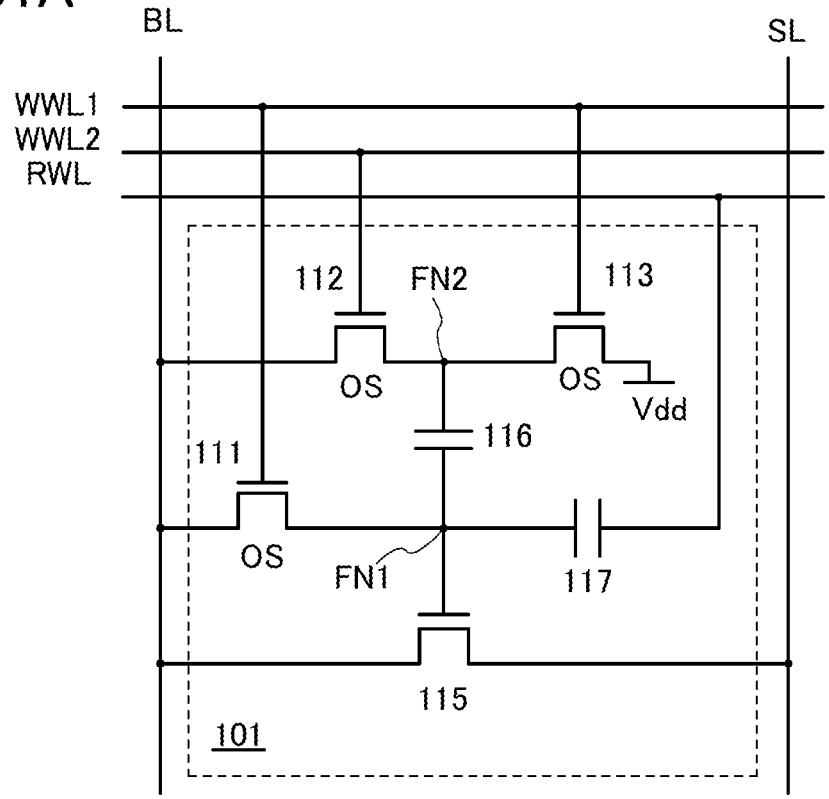
FIGS. 31A and 31B are circuit diagrams of a memory cell.

For example, the other of the source and the drain of the transistor 113 may be connected to a wiring having a function of supplying the power supply voltage (e.g., $V_{dd}$ or $V_{ss}$). As an example, FIG. 31A illustrates the case where the other of the source and the drain of the transistor 113 is connected to a wiring supplied with a high power supply voltage. Note that not only in FIG. 7 but also in other diagrams, the other of the source and the drain of the transistor 113 can be connected as in FIG. 31A.

Figure 31B:
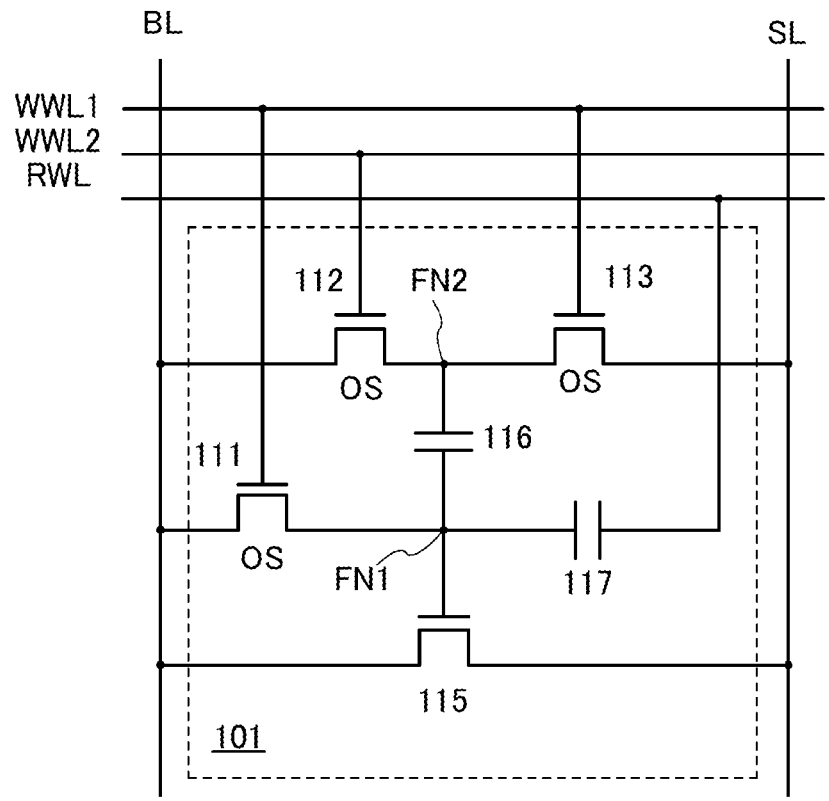

Alternatively, the other of the source and the drain of the transistor 113 may be connected to another wiring. FIG. 31B illustrates an example where the other of the source and the drain of the transistor 113 is connected to the power supply line SL. Note that not only in FIG. 7 but also in other diagrams, the other of the source and the drain of the transistor 113 can be connected as in FIG. 31B.

Figure 35:
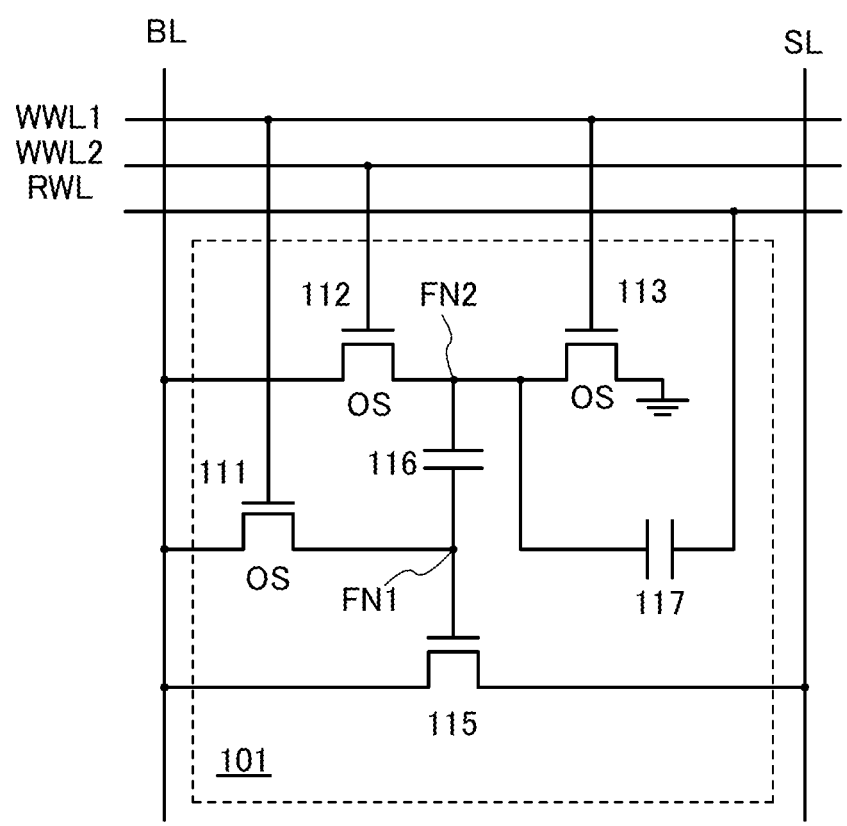
FIG. 35 is a circuit diagram of a memory cell.

Note that the capacitor 117 may be connected to the node FN2 instead of the node FN1. FIG. 35 shows an example of this case. Note that not only in FIG. 7 but also in other diagrams, the capacitor 117 can be connected to the node FN2 as in FIG. 35.

Figure 32:
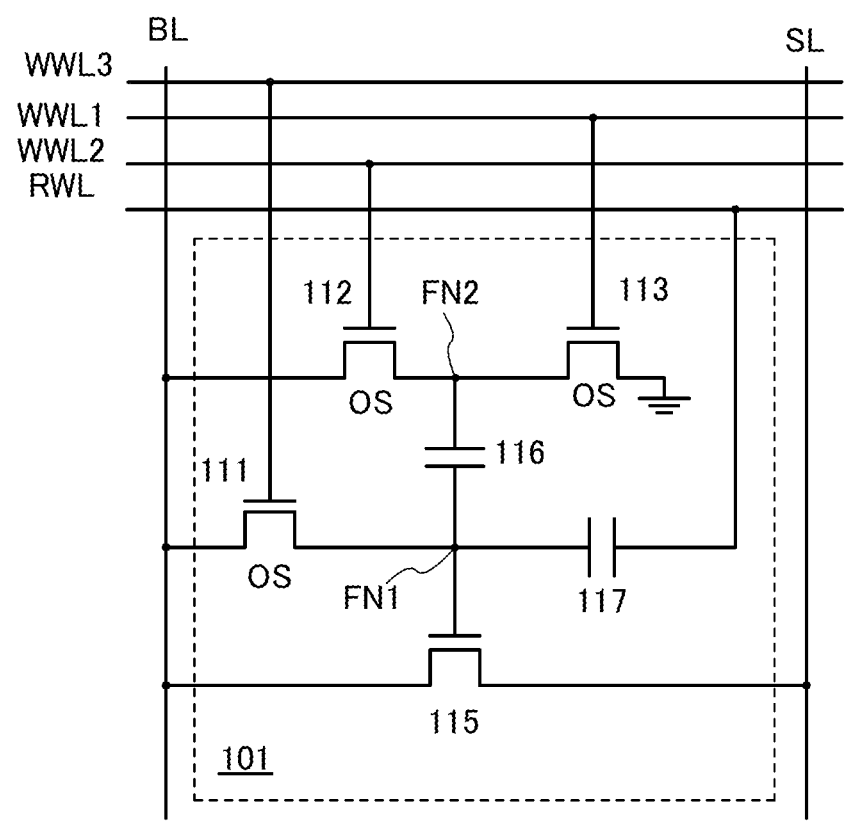
FIG. 32 is a circuit diagram of a memory cell.

Although the transistors 112 and 113 are connected to the write word line WWL1 in FIG. 7, one embodiment of the present invention is not limited to this. It is possible that the write word line WWL3 is additionally provided and one of the transistors 112 and 113 is connected to the write word line WWL3. An example of this case is shown in FIG. 32. Note that not only in FIG. 7 but also in other diagrams, the write word line WWL3 can be provided and connected as in FIG. 32.

Figure 33A:
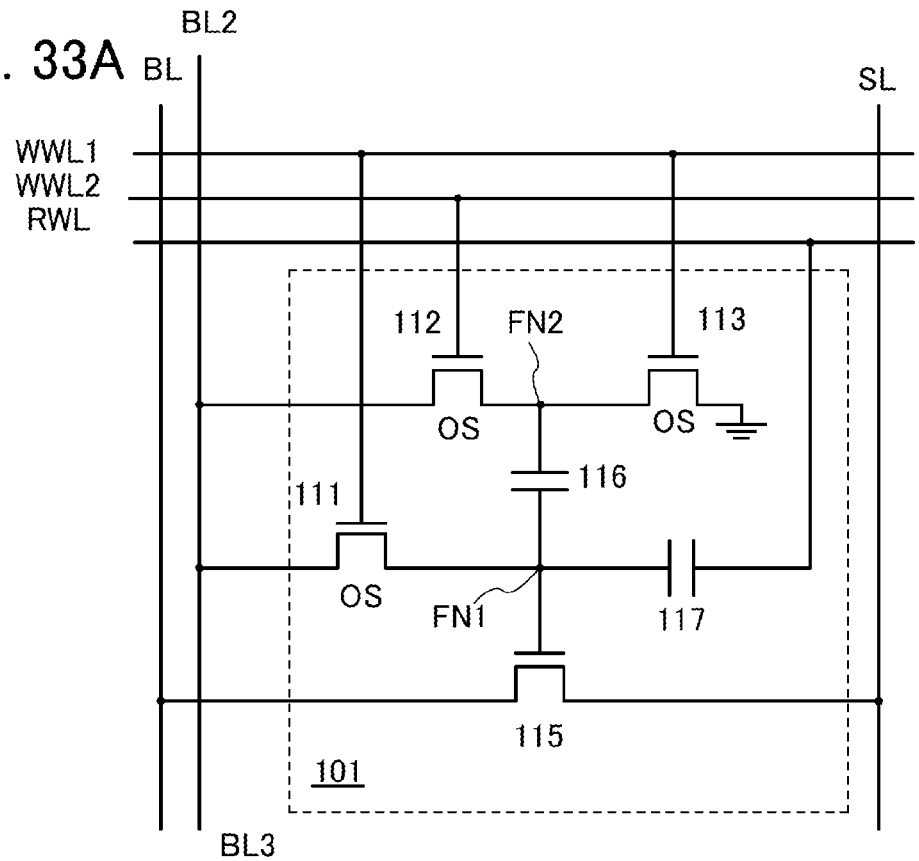
FIGS. 33A and 33B are circuit diagrams of a memory cell.
Figure 33B:
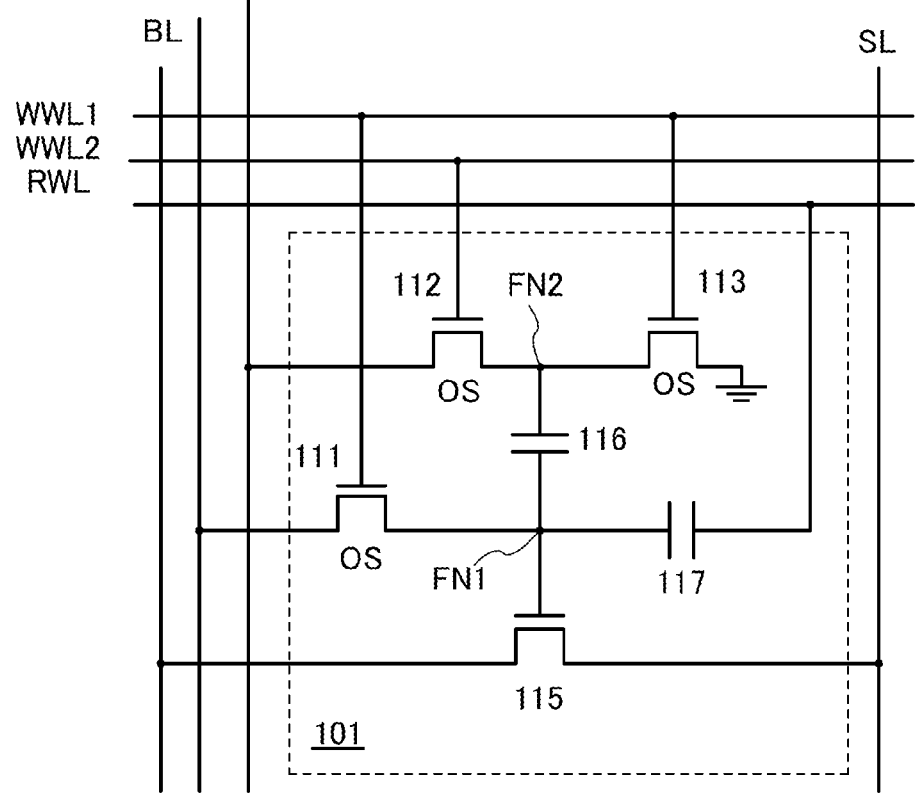

Although the transistors 111, 112, and 115 are connected to the bit line BL in FIG. 7, one embodiment of the present invention is not limited to this, and an additional bit line may be provided. For example, it is possible that the bit line BL2 is provided and at least one of the transistors 111, 112, and 115 is connected to the bit line BL2. It is also possible that the bit line BL2 and the bit line BL3 are provided and the transistors 115, 111, and 112 are connected to the respective bit lines BL, BL2, and BL3. FIGS. 33A and 33B illustrate examples of circuit configurations in these cases. Note that not only in FIG. 7 but also in other diagrams, the bit line BL2 and/or the bit line BL3 can be provided and connected as in FIG. 33A or FIG. 33B.

Figure 34A:
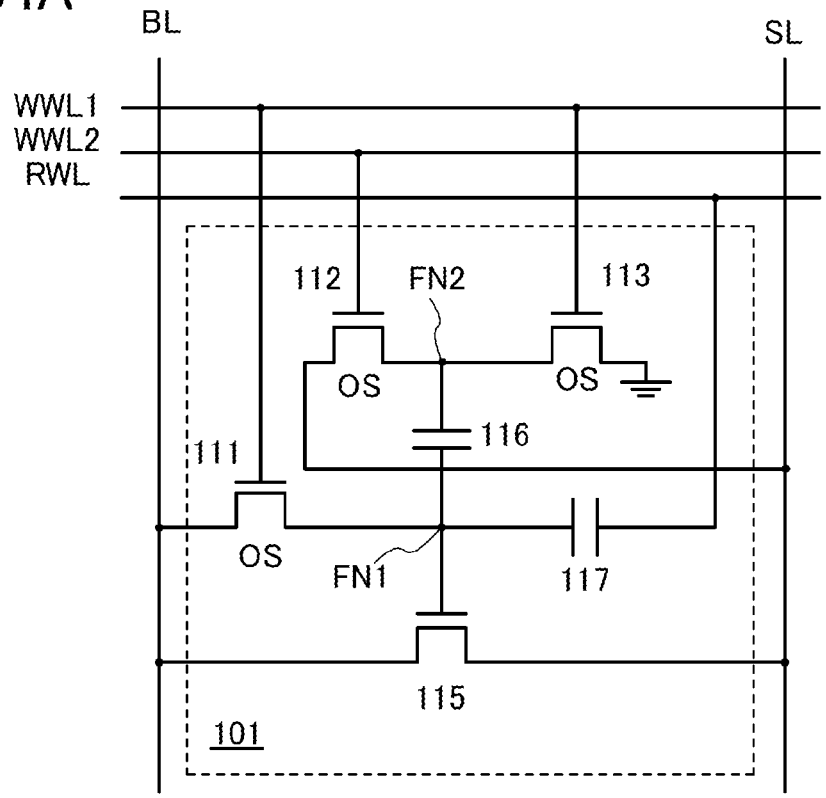
FIGS. 34A and 34B are circuit diagrams of a memory cell.

The one of the source and the drain of the transistor 112 is connected to the bit line BL in FIG. 7; however, one embodiment of the present invention is not limited to this, and the one of the source and the drain of the transistor 112 may be connected to another wiring. FIG. 34A illustrates an example where the one of the source and the drain of the transistor 112 is connected to the power supply line SL. Note that as in FIG. 34A, where to connect the one of the source and the drain of the transistor 112 can be changed not only in FIG. 7 but also in other diagrams.

Figure 34B:
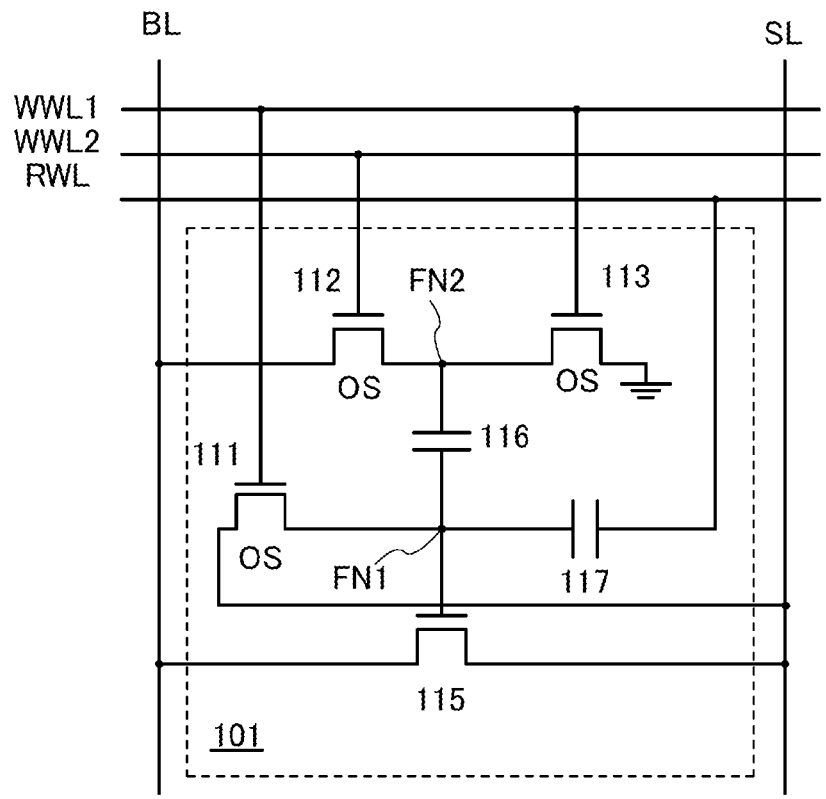

The one of the source and the drain of the transistor 111 is connected to the bit line BL in FIG. 7; however, one embodiment of the present invention is not limited to this, and the one of the source and the drain of the transistor 111 may be connected to another wiring. FIG. 34B illustrates an example where the one of the source and the drain of the transistor 111 is connected to the power supply line SL. Note that as in FIG. 34B, where to connect the one of the source and the drain of the transistor 111 can be changed not only in FIG. 7 but also in other diagrams.

Note that the structures, the methods, and the like described in this embodiment can be combined as appropriate with any of the structures, the methods, and the like described in the other embodiments.

Embodiment 3

In this embodiment, an oxide semiconductor transistor that can be used as the transistors 111 to 113 shown in the foregoing embodiments will be described. Although the transistor 111 is given as an example below, the same description can apply to the transistors 112 and 113.

<Structure Example of Semiconductor Device>

Figure 12A:
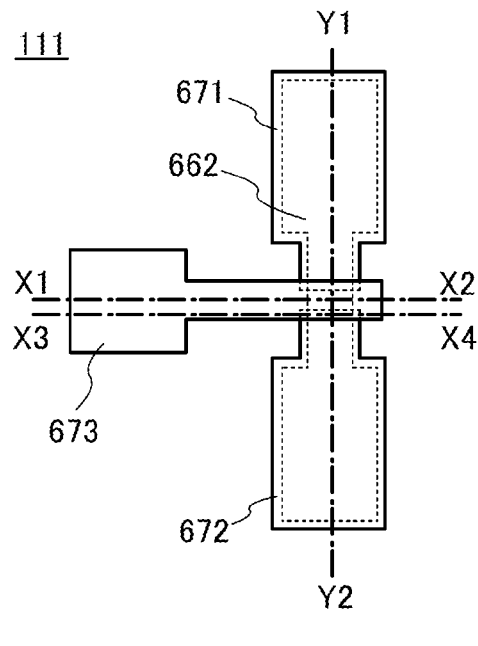
FIG. 12A is a top view of a transistor and FIGS. 12B to 12D are cross-sectional views of the transistor.
Figure 12B:
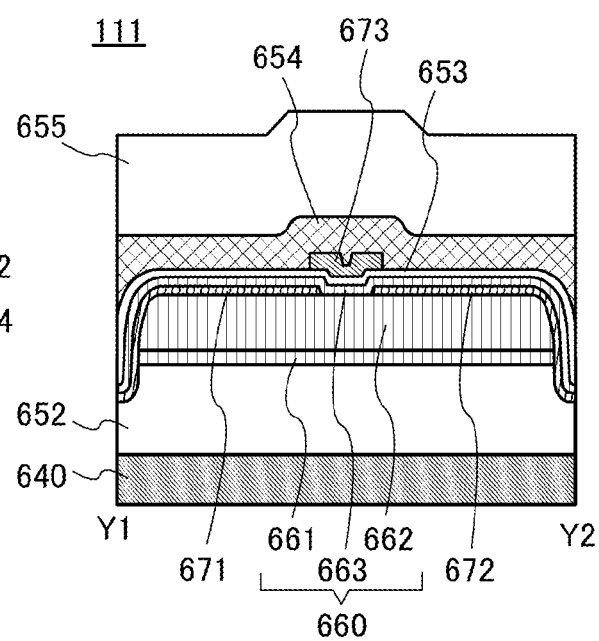
Figure 12C:
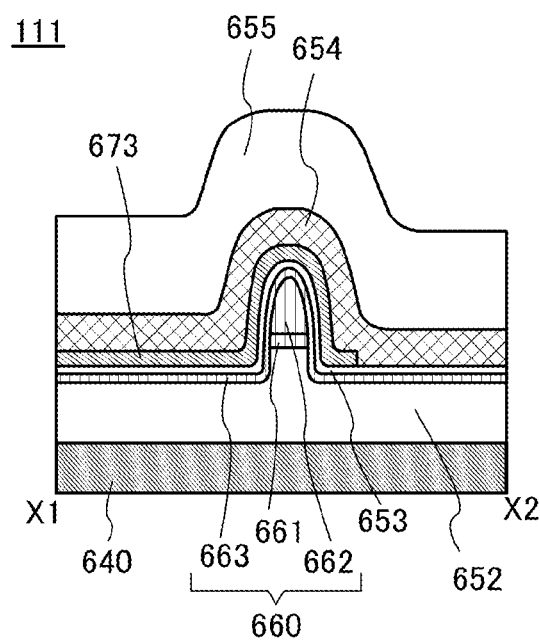
Figure 12D:
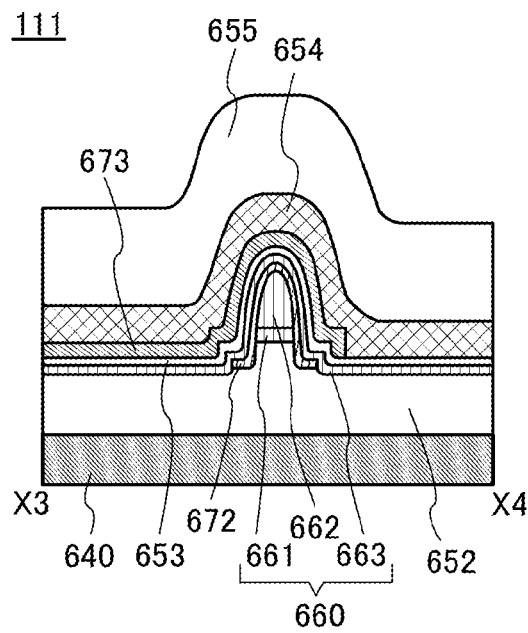

FIGS. 12A to 12D are a top view and cross-sectional views illustrating the transistor 111. FIG. 12A is the top view. FIG. 12B illustrates a cross section along the dashed-dotted line Y1-Y2 in FIG. 12A. FIG. 12C illustrates a cross section along the dashed-dotted line X1-X2 in FIG. 12A. FIG. 12D illustrates a cross section along the dashed-dotted line X3-X4 in FIG. 12A. In FIGS. 12A to 12D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, a channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as effective channel width) is sometimes different from a channel width shown in a top view of a transistor (hereinafter referred to as apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Accordingly, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width, i.e., an apparent channel width or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate electric field mobility, a current value per channel width, and the like of a transistor. In this case, the obtained value is sometimes different from one obtained by using an effective channel width for the calculation.

The transistor 111 includes an insulating film 652 over a substrate 640; a stack in which a first oxide semiconductor 661 and a second oxide semiconductor 662 are formed in this order over the insulating film 652; a source electrode 671 and a drain electrode 672 electrically connected to part of the stack; a third oxide semiconductor 663 that covers part of the stack, part of the source electrode 671, and part of the drain electrode 672; a gate insulating film 653 and a gate electrode 673 that cover part of the stack, part of the source electrode 671, part of the drain electrode 672, and part of the third oxide semiconductor 663; an insulating film 654 over the source electrode 671, the drain electrode 672, and the gate electrode 673; and an insulating film 655 over the insulating film 654. Note that the first oxide semiconductor 661, the second oxide semiconductor 662, and the third oxide semiconductor 663 are collectively referred to as an oxide semiconductor 660.

Note that at least part (or all) of the source electrode 671 (and/or the drain electrode 672) is provided on at least part (or all) of a surface, side surfaces, a top surface, and/or a bottom surface of a semiconductor layer such as the second oxide semiconductor 662 (and/or the first oxide semiconductor 661).

Alternatively, at least part (or all) of the source electrode 671 (and/or the drain electrode 672) is in contact with at least part (or all) of a surface, side surfaces, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is in contact with at least part (or all) of a semiconductor layer such as the second oxide semiconductor 662 (and/or the first oxide semiconductor 661).

Alternatively, at least part (or all) of the source electrode 671 (and/or the drain electrode 672) is electrically connected to at least part (or all) of a surface, side surfaces, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is electrically connected to part (or all) of a semiconductor layer such as the second oxide semiconductor 662 (and/or the first oxide semiconductor 661).

Alternatively, at least part (or all) of the source electrode 671 (and/or the drain electrode 672) is provided near part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided near part (or all) of a semiconductor layer such as the second oxide semiconductor 662 (and/or the first oxide semiconductor 661).

Alternatively, at least part (or all) of the source electrode 671 (and/or the drain electrode 672) is provided next to part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided next to part (or all) of a semiconductor layer such as the second oxide semiconductor 662 (and/or the first oxide semiconductor 661).

Alternatively, at least part (or all) of the source electrode 671 (and/or the drain electrode 672) is provided obliquely above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided obliquely above part (or all) of a semiconductor layer such as the second oxide semiconductor 662 (and/or the first oxide semiconductor 661).

Alternatively, at least part (or all) of the source electrode 671 (and/or the drain electrode 672) is provided above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided above part (or all) of a semiconductor layer such as the second oxide semiconductor 662 (and/or the first oxide semiconductor 661).

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

The transistor of one embodiment of the present invention is a top-gate transistor with a channel length of 10 nm to 1000 nm, preferably 20 nm to 500 nm, more preferably 30 nm to 300 nm.

Constituent elements of the semiconductor device of this embodiment will be described below in detail.

<Substrate>

The substrate 640 is not limited to a simple supporting substrate and may be a substrate where a device such as a transistor is formed. In that case, one of the gate electrode 673, the source electrode 671, and the drain electrode 672 of the transistor 111 may be electrically connected to the device.

<Base Insulating Film>

The insulating film 652 can have a function of supplying oxygen to the oxide semiconductor 660 as well as a function of preventing diffusion of impurities from the substrate 640. For this reason, the insulating film 652 is preferably an insulating film containing oxygen and more preferably an insulating film having an oxygen content higher than that in the stoichiometric composition. For example, the insulating film 652 is a film in which the amount of released oxygen converted into oxygen atoms is $1.0 \times 10^{19}$ atoms/cm$^3$ or more in thermal desorption spectroscopy (TDS) analysis. Note that the temperature of the film surface in the TDS analysis ranges preferably from 100° C. to 700° C. or from 100° C. to 500° C. When the substrate 640 is a substrate where a device is formed as described above, the insulating film 652 is preferably subjected to planarization treatment such as chemical mechanical polishing (CMP) treatment so as to have a flat surface.

The insulating film 652 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a mixed material of any of these.

<Oxide Semiconductor>

The oxide semiconductor 660 is typically formed using an In—Ga oxide, an In—Zn oxide, or an In—M-Zn oxide (M is Ti, Ga, Y, Zr, La, Ce, Nd, Sn, or Hf), and is preferably formed using an In—M-Zn oxide.

Note that the oxide semiconductor 660 is not limited to the oxide containing indium. The oxide semiconductor 660 may be, for example, a Zn—Sn oxide or a Ga—Sn oxide.

In the case where the oxide semiconductor 660 is an In—M-Zn oxide (M is Ti, Ga, Y, Zr, La, Ce, Nd, Sn, or Hf) formed by sputtering, it is preferred that the atomic ratio of metal elements of a target used for forming a film of the In—M-Zn oxide satisfy In≥M and Zn≥M. As the atomic ratio of metal elements of such a target, In:M:Zn=1:1:1, In:M:Zn=1:1:1.2, and In:M:Zn=3:1:2 are preferable. Note that the atomic ratios of metal elements in the oxide semiconductor 660 vary from those in the sputtering target within an error range of ±40%.

Figure 14A:
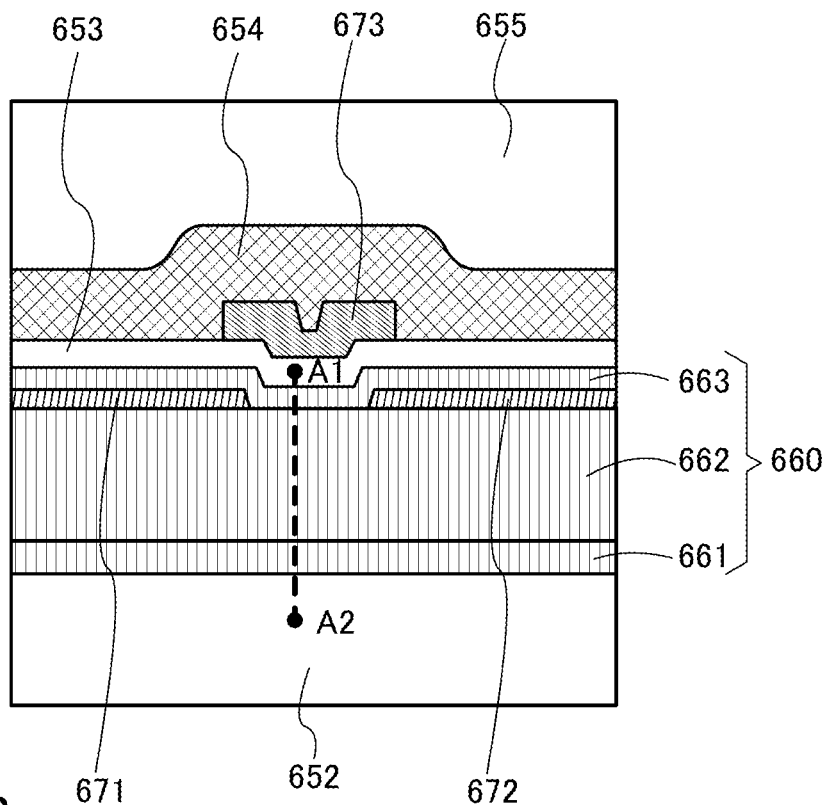
FIGS. 14A and 14B are a cross-sectional view and a band diagram of a transistor.
Figure 14B:
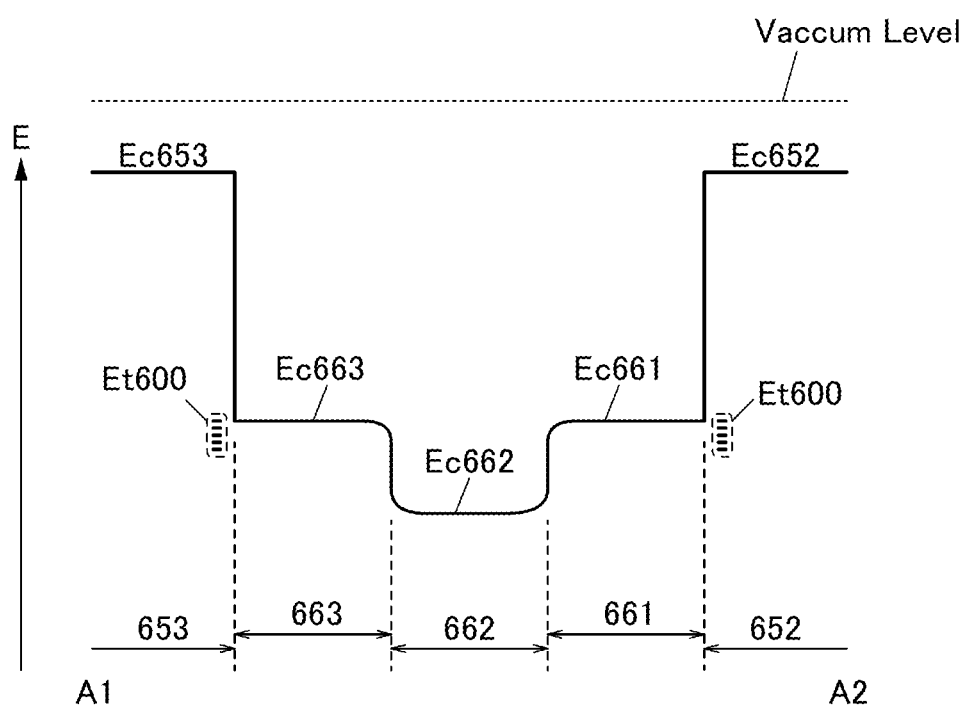

Next, a function and an effect of the oxide semiconductor 660 in which the first oxide semiconductor 661, the second oxide semiconductor 662, and the third oxide semiconductor 663 are stacked will be described using an energy band diagram in FIG. 14B. FIG. 14A is an enlarged view of the channel portion of the transistor 111 illustrated in FIG. 12B. FIG. 14B shows an energy band diagram of a portion along the chain line A1-A2 in FIG. 14A.

In FIG. 14B, Ec652, Ec661, Ec662, Ec663, and Ec653 indicate the energy of the conduction band minimum of the insulating film 652, the first oxide semiconductor 661, the second oxide semiconductor 662, the third oxide semiconductor 663, and the gate insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide formed using a target with an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV.

Since the insulating film 652 and the gate insulating film 653 are insulators, Ec652 and Ec653 are closer to the vacuum level than Ec661, Ec662, and Ec663 (i.e., the insulating film 652 and the gate insulating film 653 have a smaller electron affinity than the first oxide semiconductor 661, the second oxide semiconductor 662, and the third oxide semiconductor 663).

Ec661 is closer to the vacuum level than Ec662. Specifically, Ec661 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Ec663 is closer to the vacuum level than Ec662. Specifically, Ec663 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the first oxide semiconductor 661 and the second oxide semiconductor 662 and the interface between the second oxide semiconductor 662 and the third oxide semiconductor 663; thus, the energy of the conduction band minimum changes continuously. In other words, no state or few states exist at these interfaces.

Accordingly, electrons transfer mainly through the second oxide semiconductor 662 in the stacked-layer structure having the above energy band. Therefore, even if an interface state exists between the first oxide semiconductor 661 and the insulating film 652 or between the third oxide semiconductor 663 and the gate insulating film 653, the interface state hardly influences the transfer of electrons. In addition, since no interface state or few interface states exist between the first oxide semiconductor 661 and the second oxide semiconductor 662 and between the second oxide semiconductor 662 and the third oxide semiconductor 663, the transfer of electrons is not interrupted in the regions. Consequently, the transistor 111 including the above stacked oxide semiconductors can have high field-effect mobility.

Although trap states Et600 due to impurities or defects might be formed in the vicinity of the interface between the first oxide semiconductor 661 and the insulating film 652 and the interface between the third oxide semiconductor 663 and the gate insulating film 653 as illustrated in FIG. 14B, the second oxide semiconductor 662 can be separated from the trap states owing to the existence of the first oxide semiconductor 661 and the third oxide semiconductor 663.

In the transistor 111 described in this embodiment, in the channel width direction, the top surface and side surfaces of the second oxide semiconductor 662 are in contact with the third oxide semiconductor 663, and the bottom surface of the second oxide semiconductor 662 is in contact with the first oxide semiconductor 661 (see FIG. 12C). Surrounding the second oxide semiconductor 662 by the first oxide semiconductor 661 and the third oxide semiconductor 663 in this manner can further reduce the influence of the trap states.

However, when the energy difference between Ec662 and Ec661 or Ec663 is small, an electron in the second oxide semiconductor 662 might reach the trap state by passing over the energy difference. When the electron is trapped at the trap state, a negative fixed charge is generated at the interface with the insulating film, causing the threshold voltage of the transistor to be shifted in the positive direction.

Therefore, each of the energy gaps between Ec661 and Ec662 and between Ec662 and Ec663 is preferably 0.1 eV or more, further preferably 0.15 eV or more, in which case a change in the threshold voltage of the transistor can be reduced and the transistor can have favorable electrical characteristics.

The band gap of each of the first oxide semiconductor 661 and the third oxide semiconductor 663 is preferably wider than that of the second oxide semiconductor 662.

For the first oxide semiconductor 661 and the third oxide semiconductor 663, a material containing Al, Ti, Ga, Ge, Y, Zr, Sn, La, Ce, or Hf with a higher atomic ratio than that used for the second oxide semiconductor 662 can be used, for example. Specifically, any of the above metal elements in an atomic ratio 1.5 times or more, preferably 2 times or more, further preferably 3 times or more as much as a metal element of the second oxide semiconductor 662 is contained. Any of the above metal elements is strongly bonded to oxygen and thus has a function of suppressing generation of an oxygen vacancy in the first oxide semiconductor 661 and the third oxide semiconductor 663. That is, an oxygen vacancy is less likely to be generated in the first oxide semiconductor 661 and the third oxide semiconductor 663 than in the second oxide semiconductor 662.

When each of the first oxide semiconductor 661, the second oxide semiconductor 662, and the third oxide semiconductor 663 is an In—M-Zn oxide containing at least indium, zinc, and M (M is a metal such as Al, Ti, Ga, Ge, Y, Zr, Sn, La, Ce, or Hf) and the atomic ratio of In to M and Zn of the first oxide semiconductor 661 is $x_1:y_1:z_1$, that of the second oxide semiconductor 662 is $x_2:y_2:z_2$, and that of the third oxide semiconductor 663 is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. In this case, the transistor can have stable electrical characteristics when $y_2$ is greater than or equal to $x_2$ in the second oxide semiconductor 662. However, when $y_2$ is 3 times or more as large as $x_2$, the field-effect mobility of the transistor is reduced; thus, $y_2$ is preferably smaller than 3 times $X_2$.

In the case where Zn and O are not taken into consideration, the proportion of In and the proportion of M in the first oxide semiconductor 661 and the third oxide semiconductor 663 are preferably lower than 50 atomic % and higher than or equal to 50 atomic %, respectively, and further preferably lower than 25 atomic % and higher than or equal to 75 atomic %, respectively. In the case where Zn and O are not taken into consideration, the proportion of In and the proportion of M in the second oxide semiconductor 662 are preferably greater than or equal to 25 atomic % and less than 75 atomic %, respectively, and further preferably greater than or equal to 34 atomic % and less than 66 atomic %, respectively.

The thickness of each of the first oxide semiconductor 661 and the third oxide semiconductor 663 ranges from 3 nm to 100 nm, preferably from 3 nm to 50 nm. The thickness of the second oxide semiconductor 662 ranges from 3 nm to 200 nm, preferably from 3 nm to 100 nm, further preferably from 3 nm to 50 nm. The second oxide semiconductor 662 is preferably thicker than the first oxide semiconductor 661 and the third oxide semiconductor 663.

Note that in order that a transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to a state where an oxide semiconductor has a carrier density lower than $8\times10^{11}/cm^3$, preferably lower than $1\times10^{11}/cm^3$, further preferably lower than $1\times10^{10}/cm^3$ and higher than or equal to $1\times10^{-9}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the first oxide semiconductor 661, the second oxide semiconductor 662, and the third oxide semiconductor 663 and at interfaces between the layers.

In order to make the oxide semiconductor intrinsic or substantially intrinsic, for example, the concentration of silicon at a certain depth of the oxide semiconductor or in a region of the oxide semiconductor, which is measured by in secondary ion mass spectrometry (SIMS), is lower than $1\times10^{19}$ atoms/cm$^3$, preferably lower than $5\times10^{18}$ atoms/cm$^3$, further preferably lower than $1\times10^{18}$ atoms/cm$^3$. The concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to lower the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above-described highly purified oxide semiconductor is used for a channel formation region exhibits an extremely low off-state current. When a voltage between a source and a drain is set at about 0.1 V, 5 V, or 10 V, for example, the off-state current standardized on the channel width of the transistor can be as low as several yoctoamperes per micrometer to several zeptoamperes per micrometer.

In the transistor 111 described in this embodiment, the gate electrode 673 is formed to electrically surround the oxide semiconductor 660 in the channel width direction; consequently, a gate electric field is applied to the semiconductor 660 in the side surface direction in addition to the perpendicular direction (see FIG. 12C). In other words, a gate electric field is applied to the whole oxide semiconductor 660, so that current flows through the entire second oxide semiconductor 662 serving as a channel, leading to a further increase in on-state current.

<Crystal Structure of Oxide Semiconductor>

Next, a structure of an oxide semiconductor film is described below.

Note that in this specification, the term "parallel" indicates that an angle formed between two straight lines ranges from −10° to 10°, and accordingly also includes the case where the angle ranges from −5° to 5°. The term "substantially parallel" indicates that an angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that an angle formed between two straight lines ranges from 60° to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into a crystalline oxide semiconductor and an amorphous oxide semiconductor, for example.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is an oxide semiconductor film having a plurality of c-axis aligned crystal parts.

With a transmission electron microscope (TEM), a combined analysis image (high-resolution TEM image) of a bright-field image and a diffraction pattern of the CAAC-OS film is observed, and a plurality of crystal part can be clearly observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer reflects unevenness of a surface over which the CAAC-OS film is formed (hereinafter a surface over which the CAAC-OS film is formed is referred to as a formation surface) or a top surface of the CAAC-OS film, and is arranged parallel to the formation surface or the top surface of the CAAC-OS film.

In the high-resolution plan-view TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (rarely has normally-on characteristics). The highly purified intrinsic or substantially highly purified intrinsic oxide semiconductor film has few carrier traps. Consequently, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film. Thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are sometimes shown. Also in a nanobeam electron diffraction pattern of the nc-OS film, a plurality of spots are sometimes shown in a ring-like region.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure with physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization occurs by a slight amount of electron beam used for TEM observation and growth of the crystal part is found in some cases. In contrast, crystallization due to a slight amount of electron beam used for TEM observation is hardly observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the spacing between these adjacent layers is substantially equivalent to the lattice spacing (also referred to as d value) on the (009) plane, and is 0.29 nm according to crystal structure analysis. Consequently, focusing on the lattice fringes in the high-resolution TEM image, lattice fringes with a spacing ranging from 0.28 nm to 0.30 nm each correspond to the a-b plane of the $InGaZnO_4$ crystal.

The density of an oxide semiconductor film might vary depending on its structure. For example, when the composition of an oxide semiconductor film becomes clear, the structure of the oxide semiconductor film can be estimated from a comparison between the density of the oxide semiconductor film and the density of a single crystal oxide semiconductor film having the same composition as the oxide semiconductor film. For instance, the density of an a-like OS film is 78.6% or higher and lower than 92.3% of the density of the single crystal oxide semiconductor film. In addition, for example, the density of an nc-OS film or a CAAC-OS film is 92.3% or higher and lower than 100% of the density of the single crystal oxide semiconductor film. Note that it is difficult to deposit an oxide semiconductor film whose density is lower than 78% of the density of the single crystal oxide semiconductor film.

A specific example of the above is described. For example, in an oxide semiconductor film with an atomic ratio of In:Ga:Zn=1:1:1, the density of single crystal InGaZnO$_4$ with a rhombohedral crystal structure is 6.357 g/cm$^3$. Thus, for example, the density of an a-like OS film with an atomic ratio of In:Ga:Zn=1:1:1 is higher than or equal to 5.0 g/cm$^3$ and lower than 5.9 g/cm$^3$. Moreover, for example, the density of an nc-OS film or a CAAC-OS film with an atomic ratio of In:Ga:Zn=1:1:1 is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In a transistor including the CAAC-OS film, a change in electrical characteristics due to irradiation with visible light or ultraviolet light is small. Thus, the transistor has high reliability.

Furthermore, a transistor including the CAAC-OS film is more resistant to external force, such as deformation due to substrate bending, than a polysilicon transistor and a single crystal silicon transistor and thus is suitable for a highly flexible substrate such as a plastic substrate.

The following conditions are preferably employed to deposit a CAAC-OS film by sputtering.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in a treatment chamber or by reducing the concentration of impurities in a deposition gas. Specifically, a deposition gas with a dew point of −80° C. or lower, preferably −100° C. or lower is used.

By increasing the substrate heating temperature during the deposition, migration of a sputtered particle occurs after the sputtered particle reaches a substrate surface. Specifically, the substrate temperature during the deposition ranges from 100° C. to 740° C., preferably from 200° C. to 500° C. When the substrate heating temperature during the deposition is increased and flat-plate-like or pellet-like sputtered particles reach the substrate, migration occurs on the substrate, so that a flat plane of each sputtered particle is attached to the substrate.

It is preferred that the proportion of oxygen in the deposition gas be increased and the power be optimized in order to reduce plasma damage in the deposition. The proportion of oxygen in the deposition gas is 30 vol % or higher, preferably 100 vol %.

As an example of a target, an In—Ga—Zn-based oxide target is described below.

A polycrystalline In—Ga—Zn-based oxide target is made by mixing InO$_X$ powder, GaO$_Y$ powder, and ZnO$_Z$ powder in a predetermined molar ratio, applying pressure, and performing heat treatment at a temperature of 1000° C. to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, 1:4:4, or 3:1:2. The kinds of powder and the molar ratio for mixing powder can be determined as appropriate depending on the desired target.

<Gate Electrode>

The gate electrode 673 can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), and ruthenium (Ru); an alloy containing any of these metal element as its component; an alloy containing a combination of any of these metal elements; or the like. The gate electrode 673 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The gate electrode 673 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, the gate electrode 673 can have a stacked-layer structure using the above light-transmitting conductive material and the above metal element.

<Gate Insulating Film>

The gate insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 653 may be a stack including any of the above materials. The gate insulating film 653 may contain lanthanum (La), nitrogen, or zirconium (Zr) as an impurity.

An example of a stacked-layer structure of the gate insulating film 653 is described. The gate insulating film 653 contains oxygen, nitrogen, silicon, or hafnium, for example. Specifically, the gate insulating film 653 preferably contains hafnium oxide and one of silicon oxide and silicon oxynitride.

Hafnium oxide has a higher dielectric constant than silicon oxide and silicon oxynitride. Hence, with the use of hafnium oxide, the physical thickness can be larger than the equivalent oxide thickness; thus, even when the equivalent oxide thickness is 10 nm or less or 5 nm or less, leakage current due to tunneling current can be low. That is, it is possible to provide a transistor with a low off-state current. Since crystalline hafnium oxide has a higher dielectric constant than amorphous hafnium oxide, crystalline hafnium oxide is preferably used to form a transistor with a low off-state current. Examples of the crystalline structure include a monoclinic crystal structure and a cubic crystal structure. Note that one embodiment of the present invention is not limited to the above examples.

<Source and Drain Electrodes>

The source electrode 671 and the drain electrode 672 can be formed using a material used for the gate electrode 673. A Cu—Mn alloy film is preferably used because of its low electrical resistance and because it forms manganese oxide at the interface with the oxide semiconductor 660 and manganese oxide can prevent Cu diffusion.

<Protective Insulating Film>

The insulating film 654 has a function of blocking oxygen, hydrogen, water, alkali metal, alkaline earth metal, and the like. Providing the insulating film 654 can prevent outward diffusion of oxygen from the oxide semiconductor 660 and entry of hydrogen, water, or the like into the oxide semiconductor 660 from the outside. The insulating film 654 can be a nitride insulating film, for example. Examples of the nitride insulating film include a silicon nitride film, a silicon nitride oxide film, an aluminum nitride film, and an aluminum nitride oxide film. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. Examples of the oxide insulating film having a blocking effect against oxygen, hydrogen, water, and the like include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor 660, preventing release of oxygen, which is the main component of the oxide semiconductor 660, from the oxide semiconductor, and preventing unnecessary release of oxygen from the insulating film 652. Furthermore, oxygen contained in the aluminum oxide film can be diffused into the oxide semiconductor.

<Interlayer Insulating Film>

The insulating film 655 is preferably formed over the insulating film 654. The insulating film 655 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 655 may be a stack containing any of the above materials.

<Second Gate Electrode>

Figure 13A:
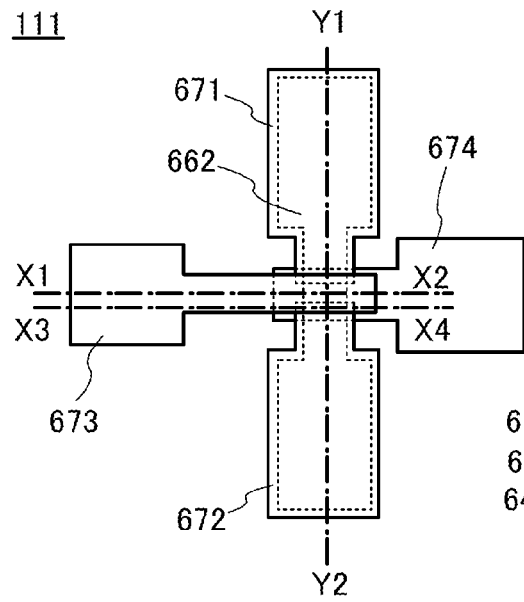
FIG. 13A is a top view of a transistor and FIGS. 13B to 13D are cross-sectional views of the transistor.
Figure 13B:
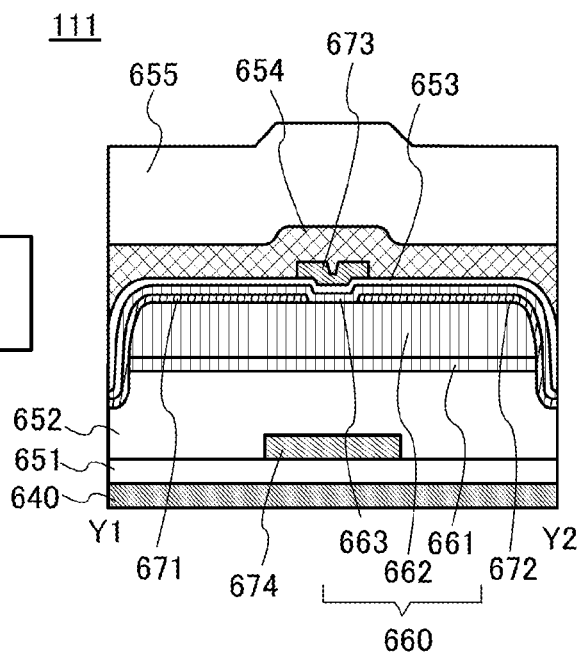
Figure 13C:
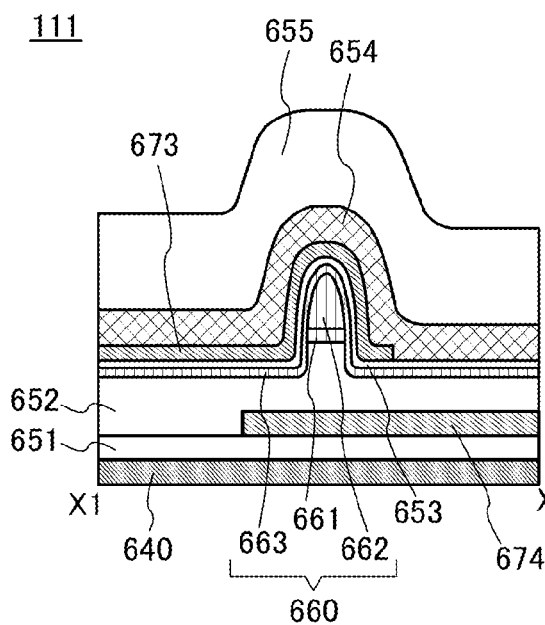
Figure 13D:
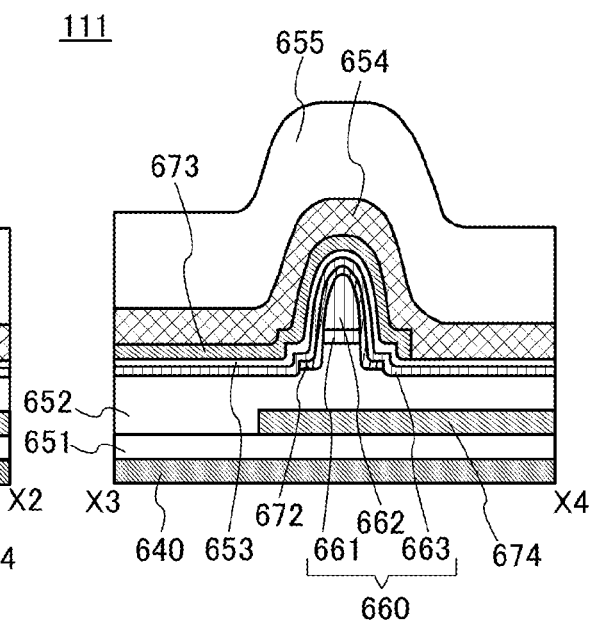

Although FIGS. 12A to 12D illustrate the example where the transistor has one gate electrode, one embodiment of the present invention is not limited to this and the transistor may have a plurality of gate electrodes. FIGS. 13A to 13D illustrate an example where the transistor 111 shown in FIGS. 12A to 12D is provided with a conductive film 674 as a second gate electrode. FIG. 13A is the top view. FIG. 13B illustrates a cross section along the dashed-dotted line Y1-Y2 in FIG. 13A. FIG. 13C illustrates a cross section along the dashed-dotted line X1-X2 in FIG. 13A. FIG. 13D illustrates a cross section along the dashed-dotted line X3-X4 in FIG. 13A. In FIGS. 13A to 13D, some components are scaled up or down or omitted for easy understanding.

Figure 41A:
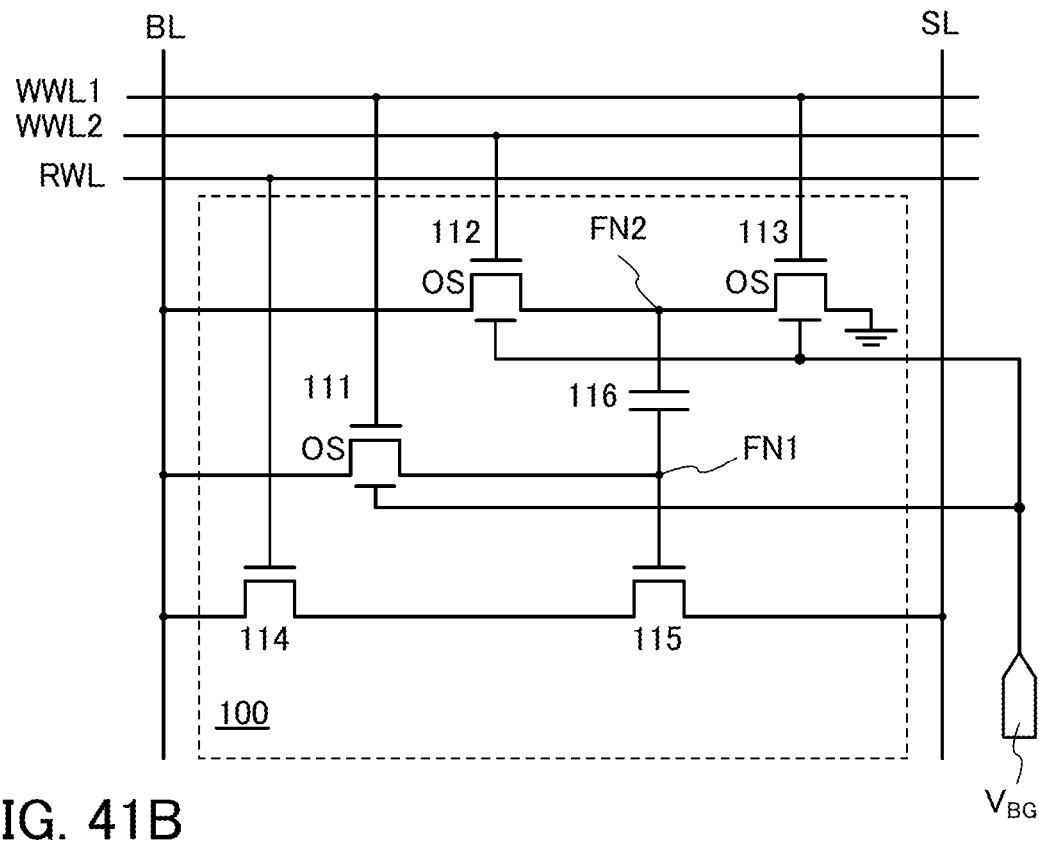
FIGS. 41A and 41B are circuit diagrams of a memory cell.
Figure 41B:
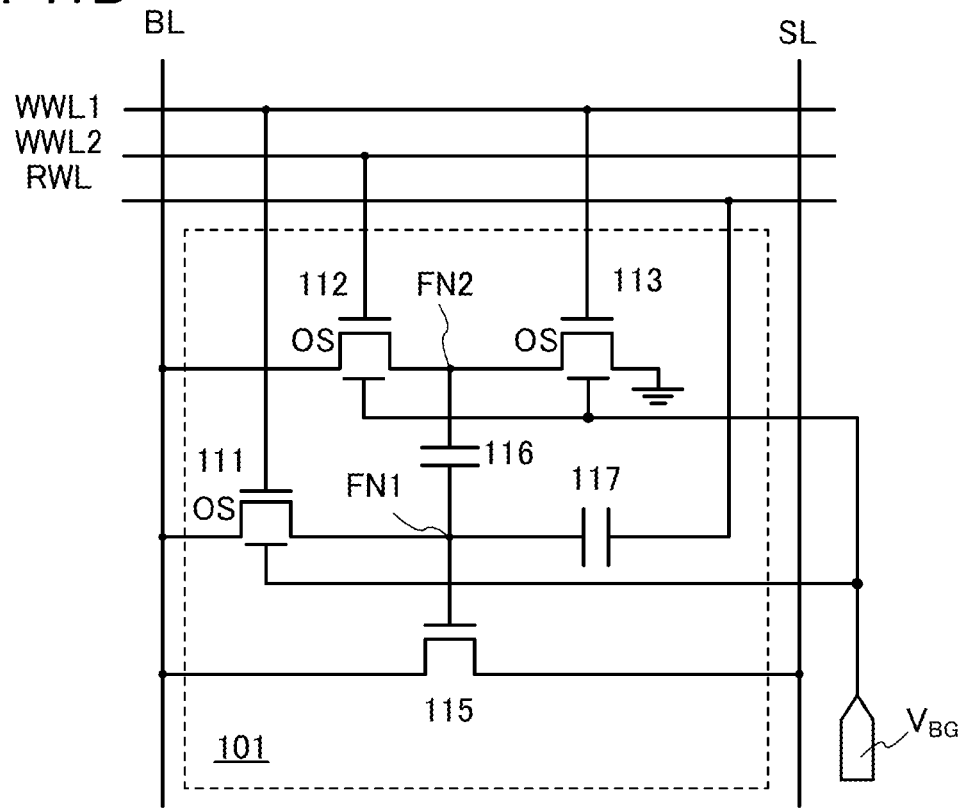
Figure 42A:
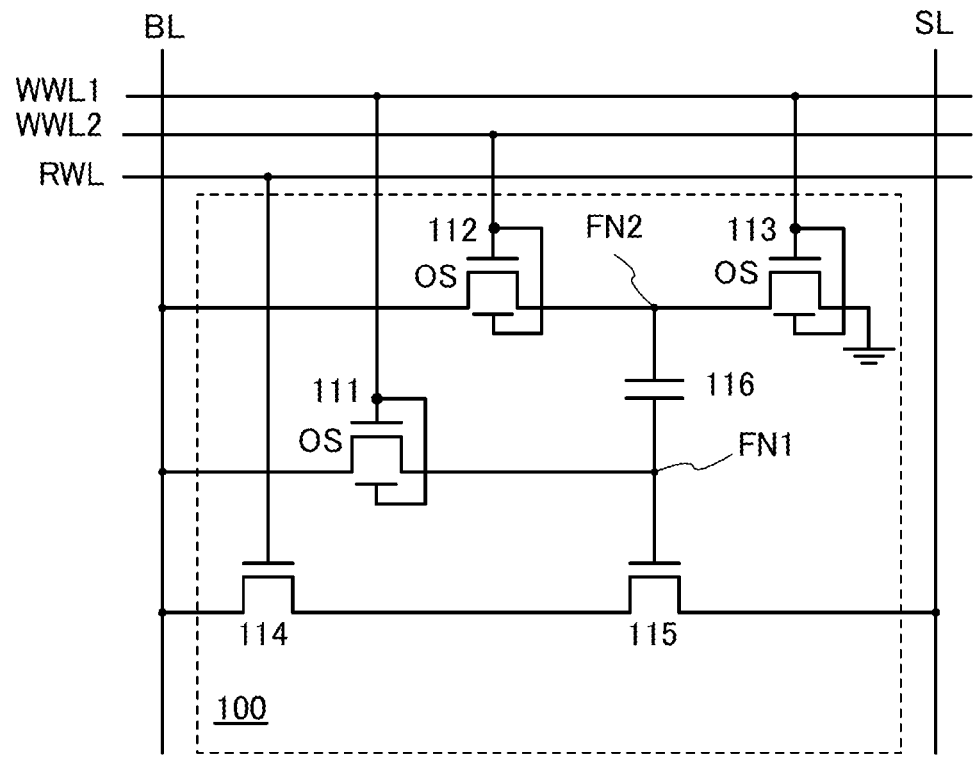
FIGS. 42A and 42B are circuit diagrams of a memory cell.
Figure 42B:
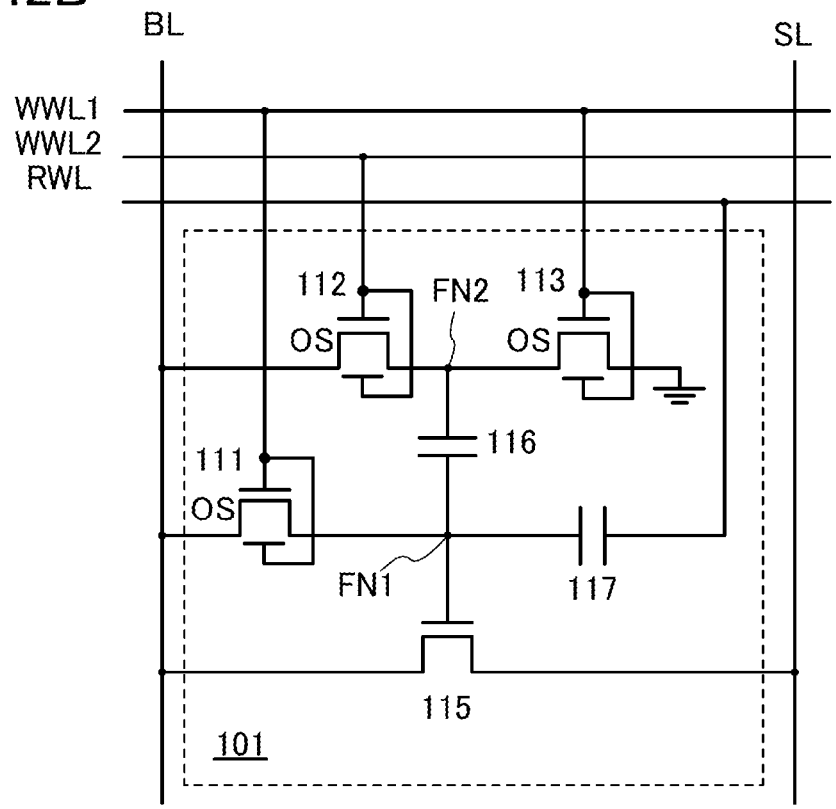

A material or a stacked-layer structure of the gate electrode 673 can be used for the conductive film 674. The conductive film 674 functions as a gate electrode layer. The conductive film 674 may be supplied with a constant potential, or a potential or a signal that is the same as that supplied to the gate electrode 673. FIGS. 41A and 41B are circuit diagrams of the memory cell 100 and the memory cell 101, respectively, in which the transistors 111 to 113 are provided with a second gate electrode. A potential $V_{BG}$ is supplied to the second gate electrodes of the transistors 111 to 113. With the configurations illustrated in FIGS. 41A and 41B, the threshold voltage of the transistors 111 to 113 can be controlled. FIGS. 42A and 42B are circuit diagrams of the memory cell 100 and the memory cell 101, respectively, in which each of the transistors 111 to 113 has a first gate electrode and a second gate electrode electrically connected to each other. With the configurations illustrated in FIGS. 42A and 42B, the on-state current of the transistors 111 to 113 can be increased.

Although FIGS. 5, 6, and 11 show the examples where the transistors 111 to 113 are not provided with the conductive film 674, these transistors can include the conductive film 674 as a second gate electrode as in FIGS. 13A to 13D.

The structures, the methods, and the like described in this embodiment can be combined as appropriate with any of the structures, the methods, and the like described in the other embodiments.

Embodiment 4

In this embodiment, an example of a semiconductor device that can include the memory cell shown in Embodiment 1 will be described with reference to FIGS. 15 to 18.

<Configuration Example of Semiconductor Device>

Figure 15:
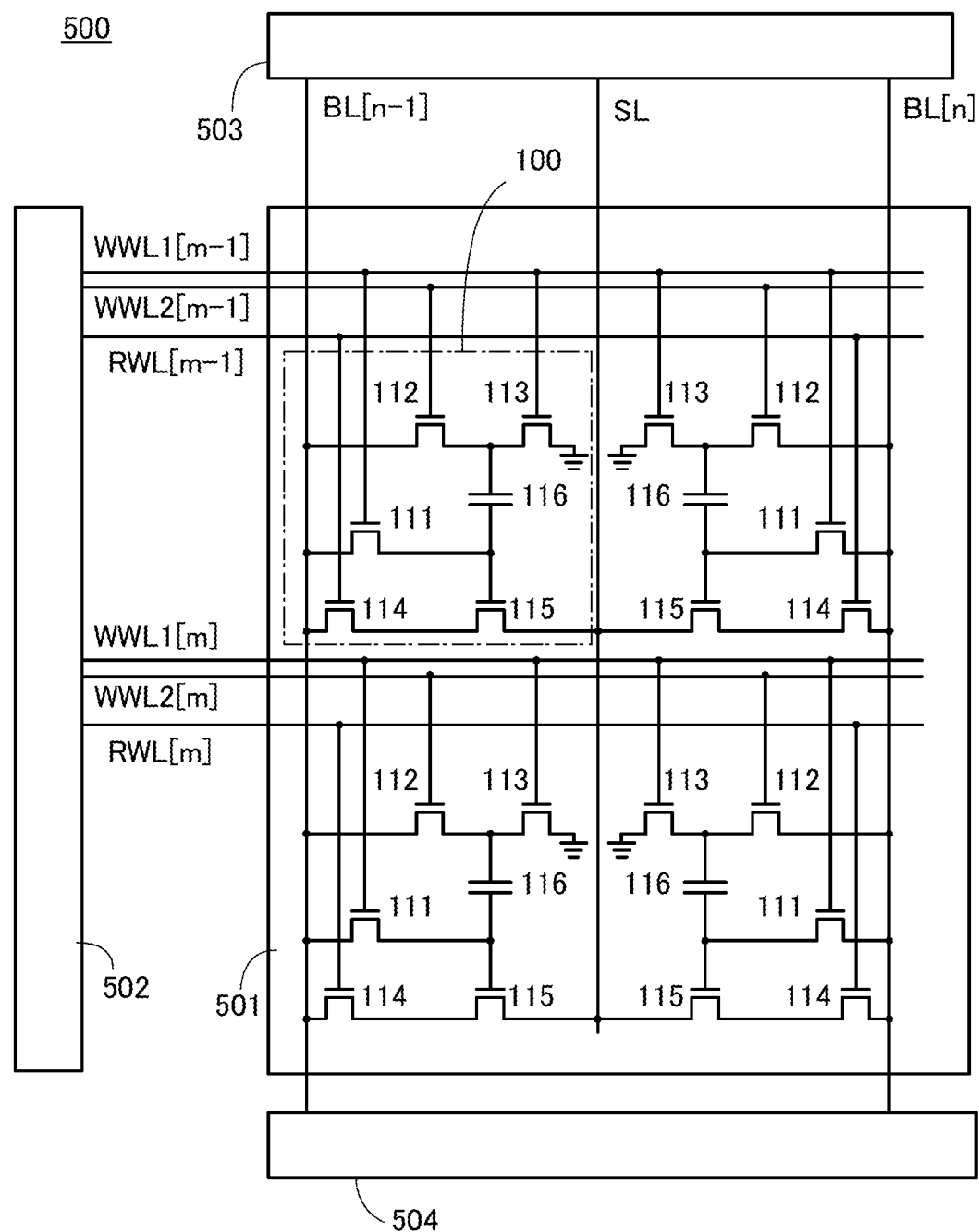
FIG. 15 is a circuit block diagram of a semiconductor device.

FIG. 15 is a block diagram illustrating a configuration example of a semiconductor device 500 including the memory cell 100 illustrated in FIG. 1. Note that the memory cell used in the semiconductor device 500 is not limited to the memory cell 100 in FIG. 1, and can be another memory cell 101 shown in Embodiment 1 or the memory cell 101 shown in Embodiment 2.

The semiconductor device 500 illustrated in FIG. 15 includes a memory cell array 501 having a plurality of memory cells 100 shown in FIG. 1, a row driver 502, a column driver 503, and A/D converters 504. The semiconductor device 500 includes the memory cells 100 arranged in a matrix with m rows and n columns. In FIG. 15, a write word line WWL1[$m-1$], a write word line WWL2[$m-1$], and a read word line RWL[m-1] in an (m-1)th row; a write word line WWL1[$m$], a write word line WWL2[$m$], and a read word line RWL[m] in an m-th row; a bit line BL[n−1] for an (n−1)th column; a bit line BL[n] in an n-th column; and a power supply line SL are shown as the write word lines WWL1 and WWL2, the read word lines RWL, the bit lines BL, and the power supply line SL. Note that without limitation to the memory cell 100, the semiconductor device 500 can include the memory cell shown in the other embodiments.

In the memory cell array 501 illustrated in FIG. 15, the memory cells 100 described with reference to FIG. 1 are arranged in matrix. Note that the components of the memory cell 100 are the same as those in FIG. 1; thus, the description of the components is omitted here and the description of FIG. 1 can be referred to.

In the memory cell array 501 shown in FIG. 15, the power supply line SL is shared by adjacent memory cells. With such a configuration, the area occupied by the power supply line SL is reduced. Thus, the semiconductor device with the configuration can have high memory capacity per unit area.

The row driver 502 is a circuit having a function of selectively turning on the transistors 111 in the memory cells 100 of each row and a function of selectively changing the potentials of the nodes FN1 and FN2 in the memory cells 100 of each row. Specifically, the row driver 502 supplies a word signal to the write word lines WWL1 and WWL2 and supplies a read signal to the read word line RWL. With the row driver 502, the memory cells 100 can be selected row by row, and data can be written and read to/from the selected memory cells 100 in the semiconductor device 500.

The column driver 503 is a circuit having functions of selectively writing data to the nodes FN1 and FN2 in the memory cells 100 of each column, precharging the potential of the bit line BL, initializing the potential of the bit line BL, and bringing the bit line BL into an electrically floating state. With the column driver 503, the memory cells 100 can be selected column by column, and data can be written and read to/from the selected memory cells 100 in the semiconductor device 500.

The A/D converter 504 is a circuit having a function of converting the potential of the bit line BL, which is an analog value, into a digital value and outputting the digital value to the outside. Specifically, the A/D converter 504 is a flash A/D converter. The A/D converters 504 enable the semiconductor device 500 to output, to the outside, the potential of the bit line BL that corresponds to data read from the memory cell 100.

Note that the A/D converter 504 is described as a flash A/D converter. However, the A/D converter 504 may be a successive approximation A/D converter, a multi-slope A/D converter, or a delta-sigma A/D converter.

<Configuration Example of Row Driver>

Figure 16:
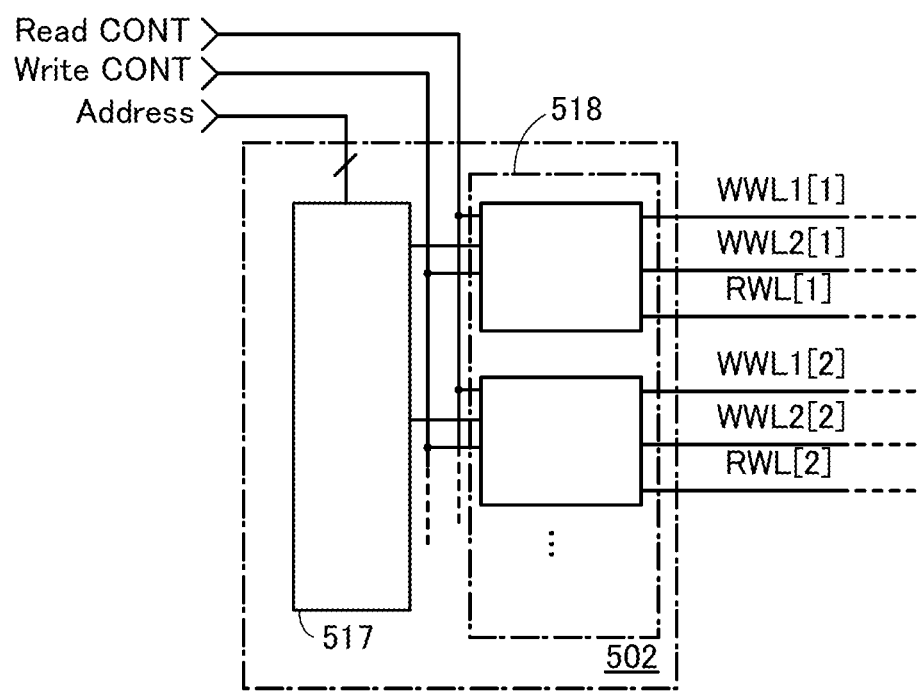
FIG. 16 is a circuit block diagram of a row driver.

FIG. 16 is a block diagram showing a configuration example of the row driver 502 illustrated in FIG. 15.

The row driver 502 illustrated in FIG. 16 includes a decoder 517 and read/write controllers 518. The read/write controller 518 is provided for every row of the write word lines WWL1 and WWL2 and the read word line RWL. The read/write controller 518 of each row is connected to the write word lines WWL1 and WWL2 and the read word line RWL.

The decoder 517 is a circuit having a function of outputting a signal for selecting a row of the write word lines WWL1 and WWL2 and the read word line RWL. Specifically, the decoder 517 receives an address signal (Address) and selects the read/write controller 518 of any of rows in accordance with the address signal Address. With the decoder 517, the row driver 502 can select a given row to write or read data.

With the read/write controllers 518, the row driver 502 can output a write word signal or a read control signal to the row selected by the decoder 517.

<Configuration Example of Column Driver>

Figure 17:
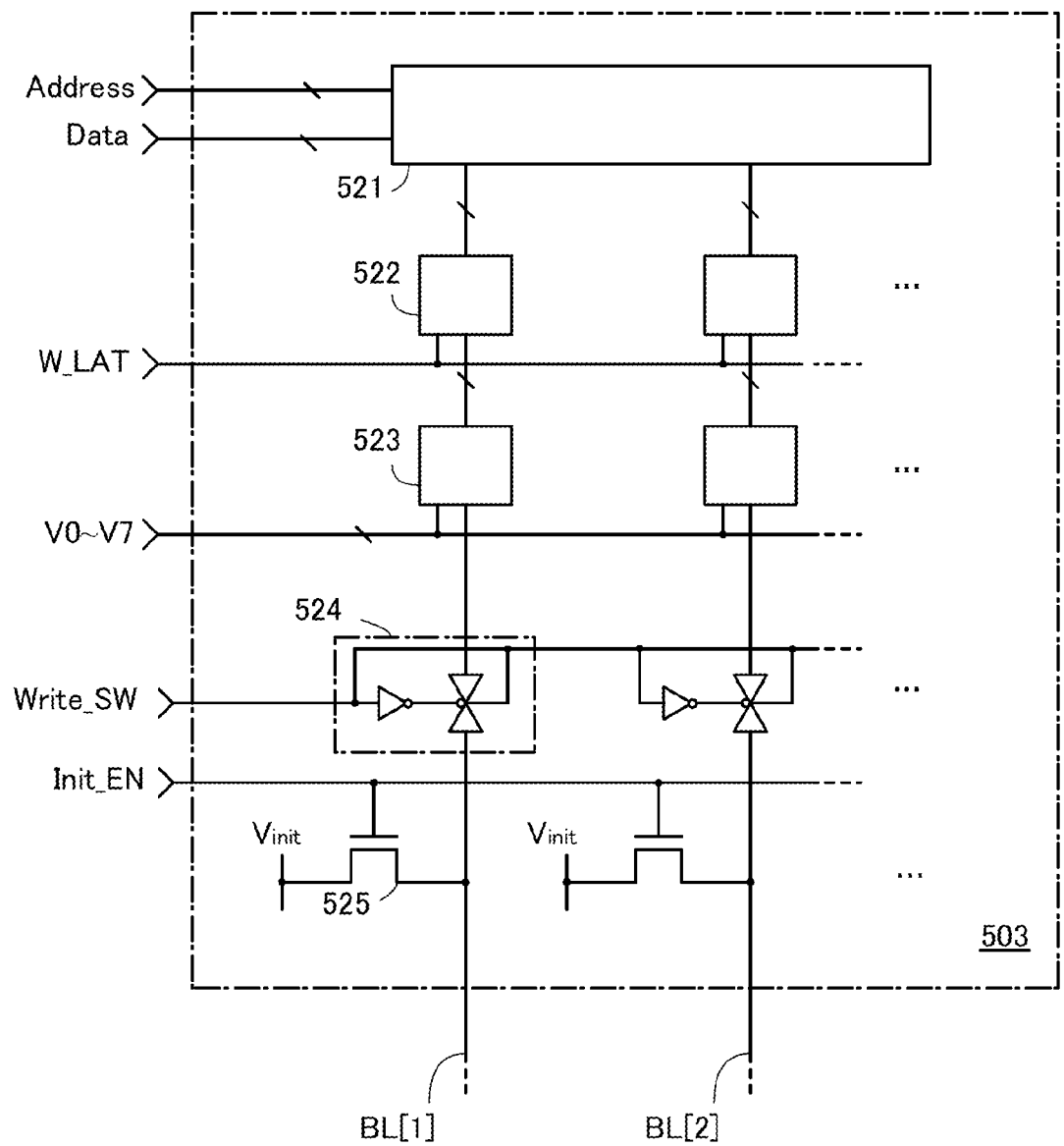
FIG. 17 is a circuit block diagram of a column driver.

FIG. 17 is a block diagram showing a configuration example of the column driver 503 illustrated in FIG. 15.

The column driver 503 shown in FIG. 17 includes a decoder 521, latch circuits 522, D/A converters 523, switch circuits 524, and transistors 525. The latch circuit 522, the D/A converter 523, the switch circuit 524, and the transistor 525 are provided for every column. Furthermore, the switch circuit 524 and the transistor 525 of each column are connected to the bit line BL.

The decoder 521 is a circuit having a function of selecting a column of the bit line BL and sorting and outputting input data. Specifically, the decoder 521 receives an address signal (Address) and data (Data) and outputs the data Data to the latch circuit 522 of any of columns in accordance with the address signal Address. The decoder 521 allows the column driver 503 to select a predetermined column and write data.

Note that the data Data input to the decoder 521 is k-bit digital data. The k-bit digital data is a signal represented by binary data of '1' or '0' for each bit. Specifically, 2-bit digital data is data represented by '00', '01', '10', and '11'.

The latch circuit 522 has a function of temporarily storing the input data Data. Specifically, the latch circuit 522 is a flip-flop circuit that receives a latch signal W_LAT, stores the data Data in accordance with the latch signal W_LAT, and outputs the data Data to the D/A converter 523. The latch circuit 522 enables the column driver 503 to write data at an opportune time.

The D/A converter 523 is a circuit having a function of converting input digital data (Data) into analog data ($V_{data}$). Specifically, the D/A converter 523 converts 3-bit data Data, for example, into one of eight potentials ($V_0$ to $V_7$) and outputs the potential to the switch circuit 524. The D/A converter 523 allows the column driver 503 to convert data to be written to the memory cell 100 into a potential corresponding to multilevel data.

Note that the data $V_{data}$ output from the D/A converter 523 are represented by different voltage levels. For example, 2-bit data $V_{data}$ is represented by any of the four voltage levels (0.5 V, 1.0 V, 1.5 V, and 2.0 V).

The switch circuit 524 has a function of supplying input data $V_{data}$ to the bit line BL and a function of bringing the bit line BL into an electrically floating state. Specifically, the switch circuit 524 includes an analog switch and an inverter. The switch circuit 524 supplies the data $V_{data}$ to the bit line BL in accordance with a switch control signal Write_SW, and then makes the bit line BL electrically floating by turning off the analog switch. The switch circuit 524 enables the column driver 503 to keep the bit line BL in an electrically floating state after the data $V_{data}$ is supplied to the bit line BL.

The transistor 525 has a function of supplying an initialization voltage $V_{initial}$ to the bit line BL and a function of bringing the bit line BL into an electrically floating state. Specifically, the transistor 525 is a switch that supplies an initialization voltage $V_{initial}$ to the bit line BL in accordance with an initialization control signal Init_EN, and then brings the bit line BL into an electrically floating state. The transistor 525 enables the column driver 503 to keep the bit line BL in an electrically floating state after the initialization voltage $V_{initial}$ is supplied to the bit line BL.

<Configuration Example of a/D Converter>

Figure 18:
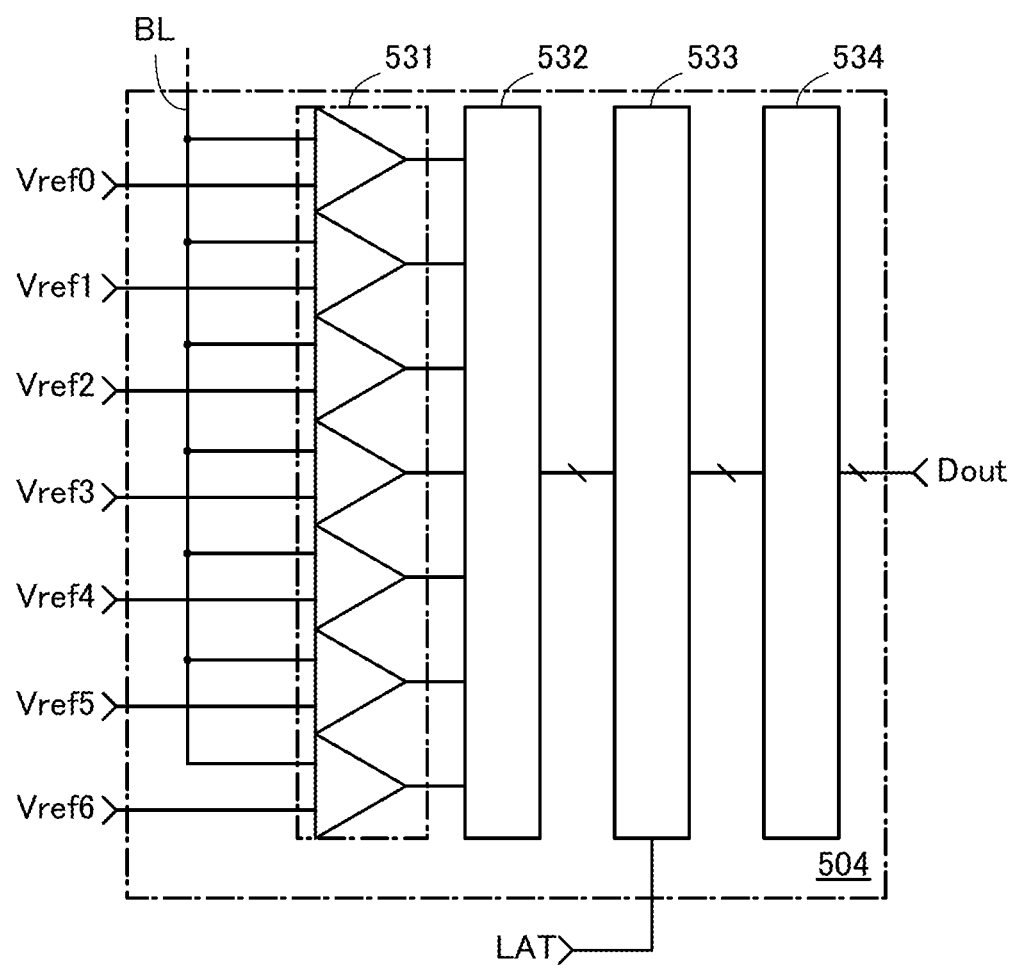
FIG. 18 is a circuit block diagram of an A/D converter.

FIG. 18 is a block diagram illustrating a configuration example of the A/D converter 504 shown in FIG. 15.

The A/D converter 504 illustrated in FIG. 18 includes a comparator 531, an encoder 532, a latch circuit 533, and a buffer 534. These circuits are provided for every column. The buffer 534 of each column outputs data Dout.

The comparator 531 is a circuit having a function of determining which of the levels of multilevel data the potential of the bit line BL corresponds to, by comparing the levels of the potential of the bit line BL and the potentials of reference voltages $V_{ref0}$ to $V_{ref6}$. Specifically, the comparator 531 includes a plurality of comparators to which the potential of the bit line BL and a corresponding one of the reference voltages $V_{ref0}$ to $V_{ref6}$ are supplied, and determines which of two potentials among the reference voltages $V_{ref0}$ to $V_{ref6}$ the potential of the bit line BL is between. With the comparator 531, the A/D converter 504 can determine which of the levels of the multilevel data the potential of the bit line BL corresponds to.

Note that the reference voltages $V_{ref0}$ to $V_{ref6}$ shown in FIG. 18 as an example are potentials that are supplied when multilevel data is 3-bit data, that is, 8-level data.

The encoder 532 is a circuit having a function of generating a multi-bit digital signal on the basis of a signal for determining the potential of the bit line BL that is output from the comparator 531. Specifically, the encoder 532 encodes an H-level or L-level signal output from the plurality of comparators to generate a digital signal. With the encoder 532, the A/D converter 504 can change data read from the memory cell 100 into digital data.

The latch circuit 533 has a function of temporarily storing input digital data. Specifically, the latch circuit 533 is a flip-flop circuit that receives a latch signal LAT, stores data in accordance with the latch signal LAT, and outputs the data to the buffer 534. With the latch circuit 533, the A/D converter 504 can output data at an opportune time. Note that the latch circuit 533 can be omitted.

The buffer 534 is a circuit having a function of amplifying data output from the latch circuit 533 and outputting the amplified data as an output signal Dout. Specifically, the buffer 534 is a circuit provided with an even number of inverter circuits. The buffer 534 allows the A/D converter 504 to reduce noise of a digital signal. Note that the buffer 534 can be omitted.

The structures, the methods, and the like described in this embodiment can be combined as appropriate with any of the structures, the methods, and the like described in the other embodiments.

Embodiment 5

In this embodiment, application examples of the semiconductor device described in the foregoing embodiment to an electronic component and to an electronic device including the electronic component will be described with reference to FIGS. 19A and 19B and FIGS. 20A to 20E.

Figure 19A:
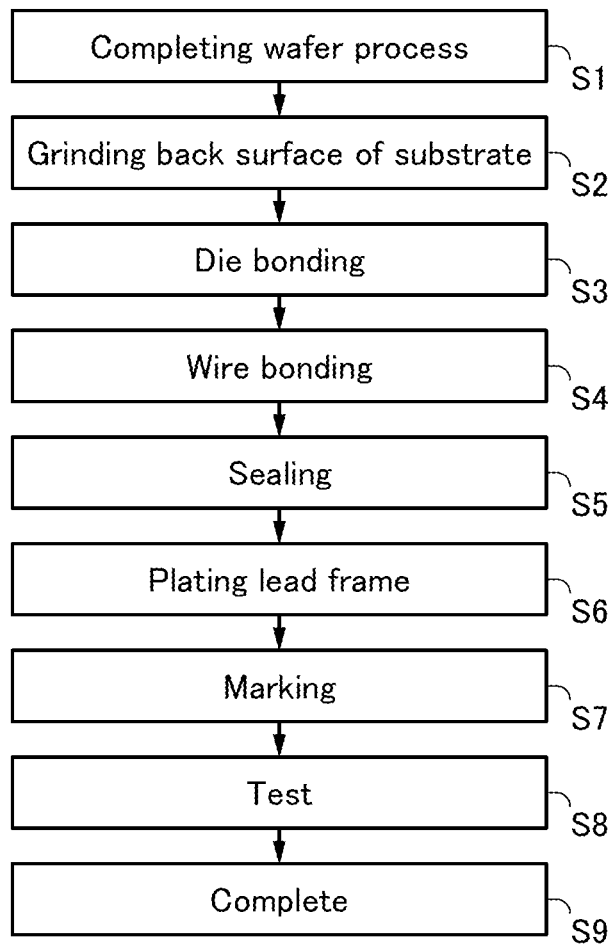
FIG. 19A is a flowchart showing fabrication steps of a semiconductor device.

FIG. 19A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistor described in Embodiment 3 is completed by integrating detachable components on a printed circuit board through the assembly process (post-process).

The post-process can be completed through steps shown in FIG. 19A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device described in the foregoing embodiment, it is possible to achieve an electronic component including a memory cell from which multilevel data can be read without switching a signal for reading data in accordance with the number of levels of the multilevel data. The electronic component includes the semiconductor device provided with the memory cell from which multilevel data can be read without switching a signal for reading data in accordance with the number of levels of the multilevel data, and accordingly, the read operation is performed at high speed in the electronic component.

Figure 19B:
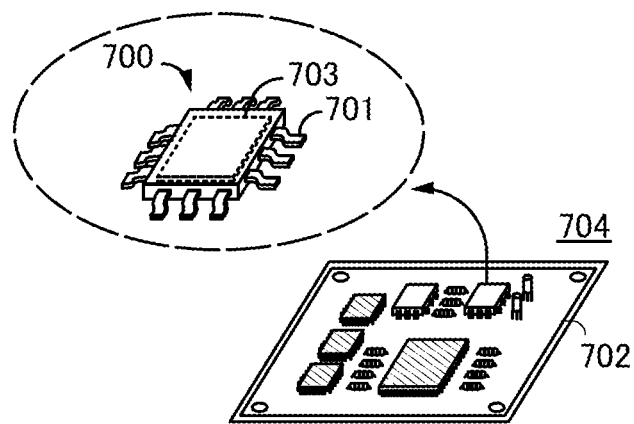
FIG. 19B is a schematic perspective view of the semiconductor device.

FIG. 19B is a schematic perspective diagram of a completed electronic component. FIG. 19B shows a schematic perspective diagram of a quad flat package (QFP) as an example of the electronic component. An electronic component 700 illustrated in FIG. 19B includes a lead 701 and a semiconductor device 703. The electronic component 700 in FIG. 19B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 20A:
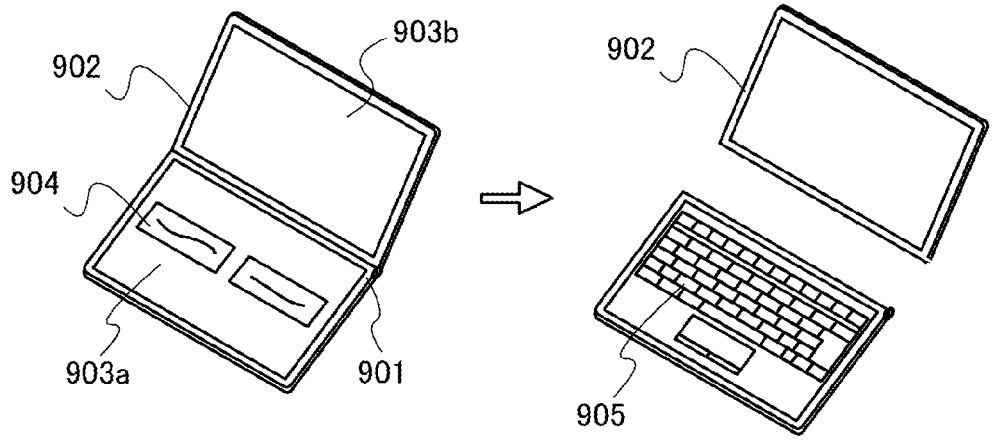
FIGS. 20A to 20E each illustrate an electronic device including a semiconductor device.

FIG. 20A illustrates a portable information appliance that includes a housing 901, a housing 902, a first display portion 903a, a second display portion 903b, and the like. At least one of the housings 901 and 902 includes the circuit board including the semiconductor device of the foregoing embodiment. It is thus possible to obtain a portable information appliance with high-speed read operation.

Note that the first display portion 903a is a panel having a touch input function, and for example, as illustrated in the left of FIG. 20A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 20A. Thus, letters can be input quickly by key input as in a conventional information appliance, for example.

One of the first display portion 903a and the second display portion 903b can be detached from the portable information appliance as shown in the right of FIG. 20A. Providing the second display portion 903b with a touch input function makes the information appliance convenient to carry because the weight can be further reduced and the information appliance can operate with one hand while the other hand supports the housing 902.

The portable information appliance in FIG. 20A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 20A may transmit and receive data wirelessly. Through wireless communication, desired book data or the like can be purchased and downloaded from an e-book server.

Furthermore, the housing 902 illustrated in FIG. 20A may be equipped with an antenna, a microphone function, or a wireless communication function to be used as a mobile phone.

Figure 20B:
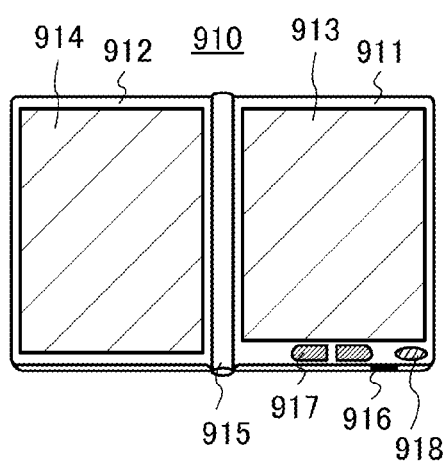

FIG. 20B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The circuit board including the semiconductor device of the foregoing embodiment is provided in at least one of the housings 911 and 912. It is thus possible to obtain an e-book reader with high-speed read operation.

Figure 20C:
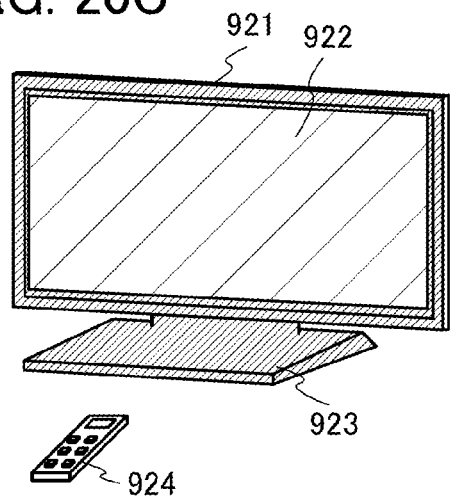

FIG. 20C illustrates a television device including a housing 921, a display portion 922, a stand 923, and the like. The television device can be controlled by a switch of the housing 921 and a separate remote controller 924. The circuit board including the semiconductor device of the foregoing embodiment is mounted on the housings 921 and the remote controller 924. Thus, it is possible to obtain a television device with high-speed read operation.

Figure 20D:
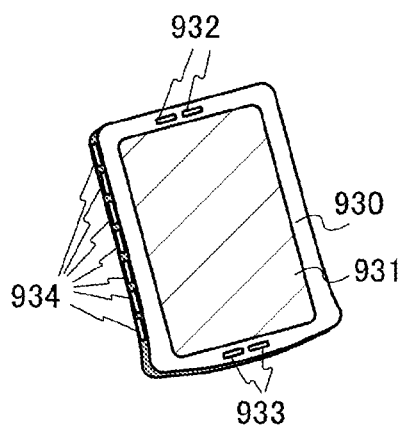

FIG. 20D illustrates a smartphone in which a main body 930 is provided with a display portion 931, a speaker 932, a microphone 933, an operation key 934, and the like. The circuit board including the semiconductor device of the foregoing embodiment is provided in the main body 930. It is thus possible to obtain a smartphone with high-speed read operation.

Figure 20E:
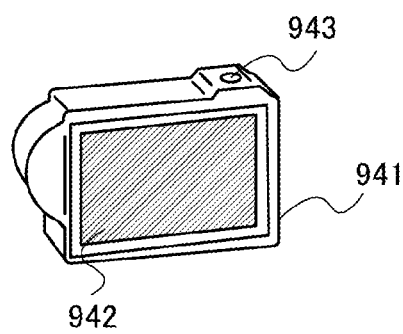

FIG. 20E illustrates a digital camera including a main body 941, a display portion 942, an operation switch 943, and the like. The circuit board including the semiconductor device of the foregoing embodiment is provided in the main body 941. Consequently, it is possible to obtain a digital camera with high-speed read operation.

As described above, the electronic device shown in this embodiment incorporates the circuit board including the semiconductor device of the foregoing embodiment, thereby performing read operation at high speed.

Note that the structures, the methods, and the like described in this embodiment can be combined as appropriate with any of the structures, the methods, and the like described in the other embodiments.

Embodiment 6

In this embodiment, structures of transistors used as the transistors 111 to 113 shown in Embodiments 1 and 2 will be described with reference to drawings.

<Structure Example 1 of Transistor>

Figure 21A:
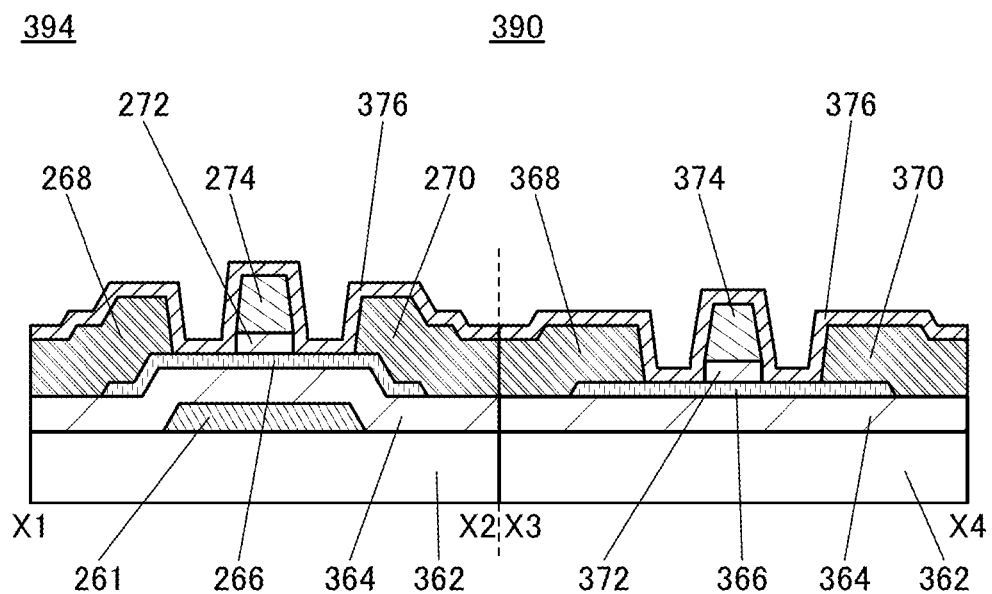
FIGS. 21A and 21B are cross-sectional views of transistors.
Figure 21B:
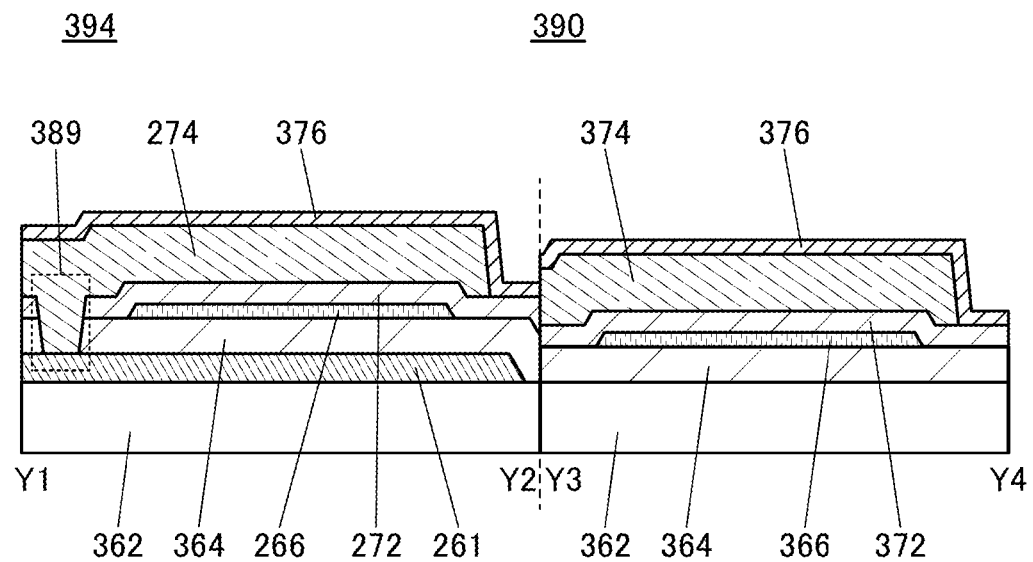

FIGS. 21A and 21B illustrate a transistor 390 and a transistor 394 that can be used as the transistors 111 to 113.

Figure 22A:
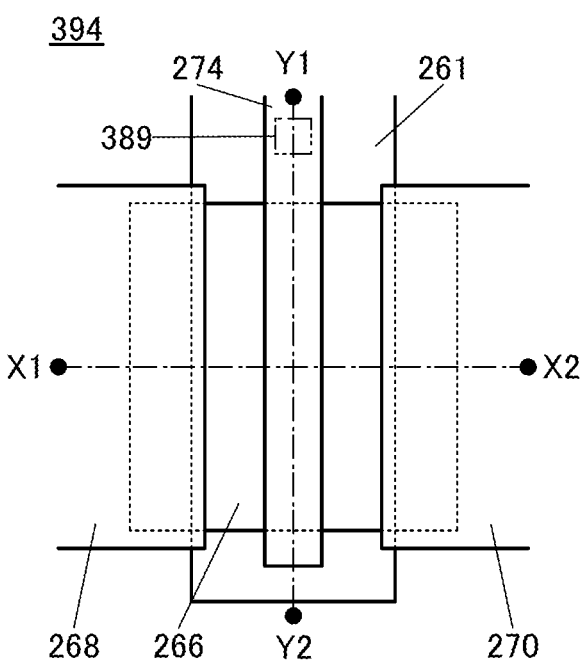
FIGS. 22A and 22B are top views of transistors.
Figure 22B:
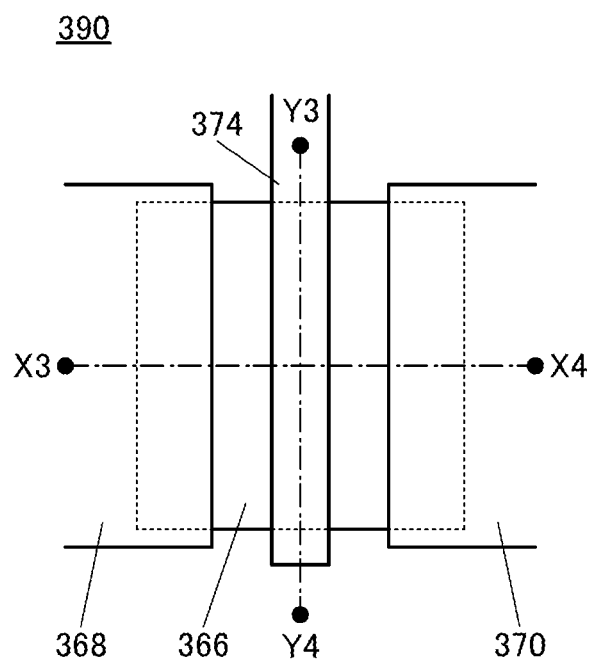

FIGS. 22A and 22B are top views of the transistor 394 and the transistor 390, respectively. FIGS. 21A and 21B are cross-sectional views of the transistor 390 and the transistor 394. FIG. 22A is the top view of the transistor 394, and FIG. 22B is the top view of the transistor 390. FIG. 21A shows a cross section along the dashed-dotted line X1-X2 in FIG. 22A and a cross section along the dashed-dotted line X3-X4 in FIG. 22B. FIG. 21B shows a cross section along the dashed-dotted line Y1-Y2 in FIG. 22A and a cross section along the dashed-dotted line Y3-Y4 in FIG. 22B. FIG. 21A is a cross-sectional view of the transistors 390 and 394 in the channel length direction. FIG. 21B is a cross-sectional view of the transistors 390 and 394 in the channel width direction.

The transistor 390 illustrated in FIGS. 21A and 21B includes an oxide semiconductor film 366 over an insulating film 364 over a substrate 362; a conductive film 368, a conductive film 370, and an insulating film 372 that are in contact with the oxide semiconductor film 366; and a conductive film 374 that overlaps the oxide semiconductor film 366 with the insulating film 372 placed therebetween. An insulating film 376 is provided over the transistor 390.

The transistor 394 illustrated in FIGS. 21A and 21B includes a conductive film 261 over the substrate 362; the insulating film 364 over conductive film 261; an oxide semiconductor film 266 over the insulating film 364; a conductive film 268, a conductive film 270, and an insulating film 272 that are in contact with the oxide semiconductor film 266; and a conductive film 274 that overlaps the oxide semiconductor film 266 with the insulating film 272 placed therebetween.

The transistor 394 includes the conductive film 261 that overlaps with the oxide semiconductor film 266 with the insulating film 364 placed therebetween. That is, the conductive film 261 functions as a gate electrode, and the transistor 394 is a dual-gate transistor. The other components are the same as those of the transistor 390 and have similar functions to those in the transistor 390.

The conductive film 261 and the conductive film 274 are not connected to each other and are supplied with different potentials, whereby the threshold voltage of the transistor 394 can be controlled. Alternatively, when the conductive film 261 and the conductive film 274 are connected to each other as illustrated in FIG. 21B and are supplied with the same potential, it is possible to reduce variation in initial characteristics, deterioration in a negative gate bias temperature (−GBT) stress test, and drain-induced barrier lowering (DIBL).

In the oxide semiconductor film 366, a region that does not overlap with the conductive films 368, 370, and 374 contains an element forming an oxygen vacancy. Moreover, in the oxide semiconductor film 266, a region that does not overlap with the conductive films 268, 270, and 274 contains an element forming an oxygen vacancy. Here, an element forming an oxygen vacancy is referred to as an impurity element. Typical examples of impurity elements include hydrogen and rare gas elements. Typical examples of rare gas elements are helium, neon, argon, krypton, and xenon. Moreover, boron, carbon, nitrogen, fluorine, aluminum, silicon, phosphorus, chlorine, or the like may be contained in the oxide semiconductor film 366 and the oxide semiconductor film 266 as impurity elements.

The insulating film 376 is a film containing hydrogen and is typically a nitride insulating film. The insulating film 376 in contact with the oxide semiconductor film 366 and the oxide semiconductor film 266 makes hydrogen contained in the insulating film 376 to be diffused into the oxide semiconductor films 266 and 366. As a result, regions of the oxide semiconductor films 266 and 366 that are in contact with the insulating film 376 have a high hydrogen content.

When hydrogen is added to an oxide semiconductor in which an oxygen vacancy is formed by addition of an impurity element, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally transmit visible light because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, the temperature dependence of resistivity of a film formed using an oxide conductor (hereinafter referred to as an oxide conductor film) will be described with reference to FIG. 36.

Here, samples each including an oxide conductor film were fabricated. As the oxide conductor films, the following three films were formed: an oxide conductor film (OC_SiN$_x$) formed by making an oxide semiconductor film in contact with a silicon nitride film; an oxide conductor film (OC_Ar dope+SiN$_x$) obtained by adding argon to an oxide semiconductor film with a doping apparatus and making the oxide semiconductor film in contact with a silicon nitride film; and an oxide conductor film (OC_Ar plasma+SiN$_x$) obtained by exposing an oxide semiconductor film to argon plasma with a plasma processing apparatus and making the oxide semiconductor film in contact with a silicon nitride film. Note that the silicon nitride film contains hydrogen.

A method for fabricating the sample including the oxide conductor film (OC_SiN$_x$) is shown below. A 400-nm-thick silicon oxynitride film was formed over a glass substrate by plasma-enhanced CVD, and then exposed to oxygen plasma to add oxygen ions to the silicon oxynitride film, thereby forming a silicon oxynitride film from which oxygen is released by heating. Next, a 100-nm-thick In—Ga—Zn oxide film was formed over the silicon oxynitride film by sputtering using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. After that, a 100-nm-thick silicon nitride film was formed by plasma-enhanced CVD. Then, heat treatment was performed at 350° C. in a mixed gas atmosphere of nitrogen and oxygen.

A method for fabricating the sample including the oxide conductor film (OC_Ar dope+SiN$_x$) is shown below. A 400-nm-thick silicon oxynitride film was formed over a glass substrate by plasma-enhanced CVD, and then exposed to oxygen plasma to add oxygen ions to the silicon oxynitride film, thereby forming a silicon oxynitride film from which oxygen is released by heating. Next, a 100-nm-thick In—Ga—Zn oxide film was formed over the silicon oxynitride film by sputtering using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. Then, by a doping apparatus, argon was added to the In—Ga—Zn oxide film with a dose of $5 \times 10^{14}$/cm$^2$ at an acceleration voltage of 10 kV to form an oxygen vacancy in the In—Ga—Zn oxide film.

After that, a 100-nm-thick silicon nitride film was formed by plasma-enhanced CVD. Then, heat treatment was performed at 350° C. in a mixed gas atmosphere of nitrogen and oxygen.

A method for fabricating the sample including the oxide conductor film (OC_Ar plasma+SiN$_x$) is shown below. A 400-nm-thick silicon oxynitride film was formed over a glass substrate by plasma-enhanced CVD, and then exposed to oxygen plasma, thereby forming a silicon oxynitride film from which oxygen is released by heating. Next, a 100-nm-thick In—Ga—Zn oxide film was formed over the silicon oxynitride film by sputtering using a sputtering target with an atomic ratio of In:Ga:Zn=1:1:1.2, and heat treatment at 450° C. in a nitrogen atmosphere and subsequently heat treatment at 450° C. in a mixed gas atmosphere of nitrogen and oxygen were performed. After that, in a plasma processing apparatus, argon plasma was generated and argon ions were accelerated to collide with the In—Ga—Zn oxide film, whereby an oxygen vacancy is formed. Next, a 100-nm-thick silicon nitride film was formed by plasma-enhanced CVD. Then, heat treatment was performed at 350° C. in a mixed gas atmosphere of nitrogen and oxygen.

Figure 36:
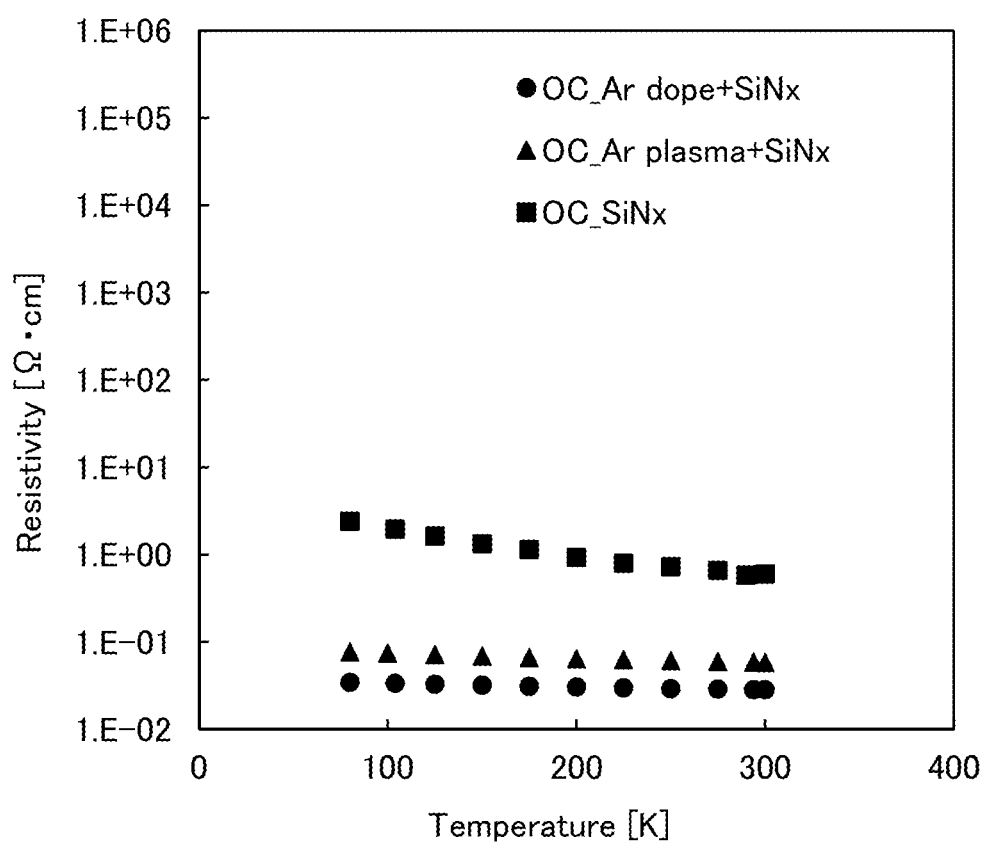
FIG. 36 shows temperature dependence of resistivity.

FIG. 36 shows the measured resistivity of the samples. Here, the resistivity was measured by a four-probe van der Pauw method. In FIG. 36, the horizontal axis represents measurement temperature, and the vertical axis represents resistivity. Furthermore, a square represents the measurement result of the oxide conductor film (OC_SiN$_x$); a triangle, the measurement result of the oxide conductor film (OC_Ar plasma+SiN$_x$); and a circle, the measurement result of the oxide conductor film (OC_Ar dope+SiN$_x$).

Although not shown, the resistivity of an oxide semiconductor that is not in contact with a silicon nitride film was too high to measure. It is therefore found that the oxide conductor film has lower resistivity than the oxide semiconductor film.

As is seen from FIG. 36, there is a small variation in the resistivity of the oxide conductor film (OC_Ar dope+SiN$_x$) and the oxide conductor film (OC_Ar plasma+SiN$_x$), each of which includes an oxygen vacancy and hydrogen. Typically, the variation in the resistivity is less than ±20% at temperatures from 80 K to 290 K or less than ±10% at temperatures from 150 K to 250 K. In other words, the oxide conductor is a degenerate semiconductor and it is suggested that the conduction band edge agrees with or substantially agrees with the Fermi level. Thus, when the oxide conductor film is used for a source region and a drain region of a transistor, an ohmic contact is made between the oxide conductor film and conductive films functioning as a source electrode and a drain electrode, thereby reducing the contact resistance between the oxide conductor film and the conductive films functioning as the source and drain electrodes. Since the temperature dependence of the resistivity of an oxide conductor is low, the amount of change in the contact resistance between the oxide conductor film and the conductive films functioning as the source and drain electrodes is small; thus, a highly reliable transistor can be fabricated.

Figure 23A:
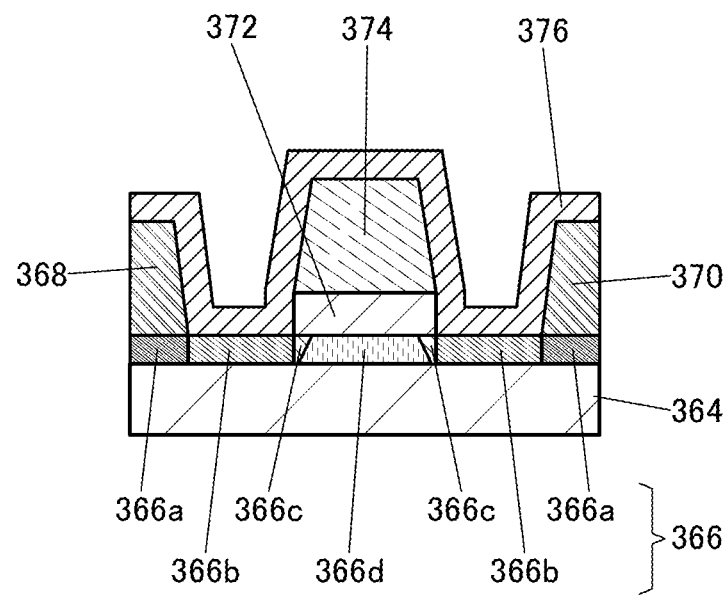
FIGS. 23A and 23B are cross-sectional views of a transistor.
Figure 23B:
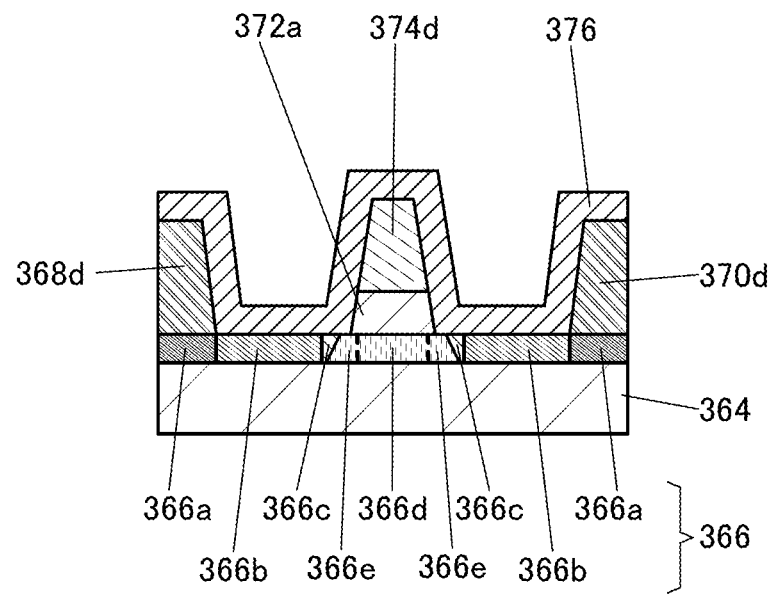

Enlarged views of the vicinity of the oxide semiconductor film 366 are shown in FIGS. 23A and 23B. Here, as a typical example, the description is made using enlarged views of the vicinity of the oxide semiconductor film 366 included in the transistor 390. As illustrated in FIGS. 23A and 23B, the oxide semiconductor film 366 includes regions 366a in contact with the conductive film 368 or the conductive film 370, regions 366b in contact with the insulating film 376, and a region 366d in contact with the insulating film 372. When a side surface of the conductive film 374 is tapered, the oxide semiconductor film 366 may include a region 366c that overlaps with the tapered portion of the conductive film 374.

The regions 366a function as a source region and a drain region. When the conductive films 368 and 370 are formed using a conductive material that is easily bonded to oxygen, such as tungsten, titanium, aluminum, copper, molybdenum, chromium, or tantalum or an alloy of such a material, oxygen included in the oxide semiconductor film 366 is bonded to the conductive material included in the conductive films 368 and 370, and an oxygen vacancy is formed in the oxide semiconductor film 366. Furthermore, in some cases, part of constituent elements of the conductive material that forms the conductive films 368 and 370 is mixed into the oxide semiconductor film 366. As a result, the conductivity of the regions 366a in contact with the conductive film 368 or the conductive film 370 increases, and the regions 366a serve as a source region and a drain region.

The region 366b functions as a low-resistance region. The region 366b includes at least a rare gas element and hydrogen as an impurity element. When a side surface of the conductive film 374 is tapered, an impurity element is added to the region 366c through the tapered portion of the conductive film 374. Consequently, the region 366c includes the impurity element but has a lower concentration of a rare gas element, which is an example of the impurity element, than the region 366b. The region 366c can increase the drain-source breakdown voltage of the transistor.

When the oxide semiconductor film 366 is formed by sputtering, each of the regions 366a to 366d includes a rare gas element, and the regions 366b and 366c have a higher concentration of the rare gas element than the regions 366a and 366d. This is because a rare gas is used as a sputtering gas to form the oxide semiconductor film 366 by sputtering and is therefore included in the oxide semiconductor film 366, and because a rare gas is intentionally added to the regions 366b and 366c to form an oxygen vacancy. Note that a rare gas element different from that included in the regions 366a and 366d may be added to the regions 366b and 366c.

The region 366b has a higher hydrogen concentration than the regions 366a and 366d because it is in contact with the insulating film 376. When hydrogen is diffused into the region 366c from the region 366b, the region 366c has a higher hydrogen concentration than the regions 366a and 366d. However, the region 366b has a higher hydrogen concentration than the region 366c.

In the regions 366b and 366c, the hydrogen concentration measured by secondary ion mass spectrometry (SIMS) can be $8 \times 10^{19}$ atoms/cm$^3$ or higher, $1 \times 10^{20}$ atoms/cm$^3$ or higher, or $5 \times 10^{20}$ atoms/cm$^3$ or higher. In the regions 366a and 366d, the hydrogen concentration measured by SIMS can be $5 \times 10^{19}$ atoms/cm$^3$ or lower, $1 \times 10^{19}$ atoms/cm$^3$ or lower, $5 \times 10^{18}$ atoms/cm$^3$ or lower, $1 \times 10^{18}$ atoms/cm$^3$ or lower, $5 \times 10^{17}$ atoms/cm$^3$ or lower, or $1 \times 10^{16}$ atoms/cm$^3$ or lower.

When boron, carbon, nitrogen, fluorine, aluminum, silicon, phosphorus, or chlorine is added to the oxide semiconductor film 366 as an impurity element, the impurity element is included only in the regions 366b and 366c. Thus, the regions 366b and 366c have a higher impurity element concentration than the regions 366a and 366d. In the regions 366b and 366c, the impurity element concentration measured by SIMS can range from $1 \times 10^{18}$ atoms/cm$^3$ to $1 \times 10^{22}$ atoms/cm$^3$, from $1 \times 10^{19}$ atoms/cm$^3$ to $1 \times 10^{21}$ atoms/cm$^3$, or from $5 \times 10^{19}$ atoms/cm$^3$ to $5 \times 10^{20}$ atoms/cm$^3$.

The regions 366b and 366c have a higher hydrogen concentration than the region 366d and have more oxygen vacancies than the region 366d because of addition of a rare gas element. Thus, the conductivity of the regions 366b and 366c increases, and the regions 366b and 366c serve as low-resistance regions. Typically, the resistivity of the regions 366b and 366c can be higher than or equal to $1 \times 10^{-3}$ Ωcm and lower than $1 \times 10^4$ Ωcm or higher than or equal to $1 \times 10^{-3}$ Ωcm and lower than $1 \times 10^{-1}$ Ωcm.

When the amount of hydrogen is smaller than or equal to the amount of oxygen vacancies in the regions 366b and 366c, hydrogen is easily captured in an oxygen vacancy and is not likely to be diffused into the region 366d serving as a channel. As a result, a transistor with normally-off characteristics can be fabricated.

The region 366d functions as a channel.

It is possible that an impurity element is added to the oxide semiconductor film 366 using the conductive films 368, 370, and 374 as masks, and then the area seen from above of the conductive films 368, 370, and 374 is reduced (see FIG. 23B). Specifically, after an impurity element is added to the oxide semiconductor film 366, slimming process is performed on a mask (e.g., a photoresist) over the conductive film 374. Then, the conductive film 374 and the insulating film 372 are etched using the mask. Through the above steps, a conductive film 374a and an insulating film 372a illustrated in FIG. 23B can be formed. As the slimming process, ashing process using an oxygen radical or the like can be employed, for example.

Consequently, in the oxide semiconductor film 366, offset regions 366e are formed between the regions 366c and the region 366d serving as a channel. Making the length of the offset region 366e in the channel length direction less than 0.1 μm can prevent a reduction in the on-state current of the transistor.

The insulating films 272 and 372 function as a gate insulating film.

The conductive films 268, 270, 368, and 370 function as a source electrode or a drain electrode.

The conductive films 274 and 374 function as a gate electrode.

In the transistor 390 and the transistor 394 shown in this embodiment, the conductive film 374 does not overlap the conductive films 368 and 370, and parasitic capacitance between the conductive film 374 and the conductive films 368 and 370 can be reduced; similarly, the conductive film 274 does not overlap the conductive films 268 and 270, and parasitic capacitance between the conductive film 274 and the conductive films 268 and 270 can be reduced. Thus, when a large-sized substrate is used as the substrate 362, signal delay in the conductive films 368, 370, and 374 and the conductive films 268, 270, and 274 can be reduced.

In the transistor 390, a region including an oxygen vacancy is formed by adding a rare gas element to the oxide semiconductor film 366 using the conductive films 368, 370, and 374 as masks. Furthermore, in the transistor 394, a region including an oxygen vacancy is formed by adding an impurity element to the oxide semiconductor film 266 using the conductive films 268, 270, and 274 as masks. Since the region including an oxygen vacancy is in contact with the insulating film 376 containing hydrogen, hydrogen contained in the insulating film 376 is diffused into the region including an oxygen vacancy and a low-resistance region is formed as a result. That is, the low-resistance region can be formed in a self-aligned manner.

To the regions 366b in the transistor 390 and the transistor 394 described in this embodiment, a rare gas is added to form an oxygen vacancy, and hydrogen is also added. Thus, the conductivity of the regions 366b can be increased, and variation in the conductivity of the regions 366b between transistors can be reduced. That is, by addition of a rare gas and hydrogen to the regions 366b, the conductivity of the regions 366b can be controlled.

The structures shown in FIGS. 21A and 21B will be described below in detail.

As the substrate 362, the substrate 640 illustrated in FIGS. 12A to 12D can be used as appropriate.

As the insulating film 364, the insulating film 652 illustrated in FIGS. 12A to 12D can be used as appropriate.

As the oxide semiconductor films 266 and 366, the oxide semiconductor 660 illustrated in FIGS. 12A to 12D can be used as appropriate.

As the insulating films 272 and 372, the gate insulating film 653 illustrated in FIGS. 12A to 12D can be used as appropriate.

The conductive films 261, 268, 270, 274, 368, 370, and 374 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, at least one of manganese and zirconium may be used. The above conductive films may have a single-layer structure or a stacked-layer structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; and a three-layer structure in which a copper film containing manganese, a copper film, and a copper film containing manganese are stacked in this order. Alternatively, an alloy film or a nitride film that contains aluminum and one or more elements selected from titanium, tantalum, tungsten, molybdenum, chromium, neodymium, and scandium may be used.

The conductive films 261, 268, 270, 274, 368, 370, and 374 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. Moreover, these conductive films can have a stacked-layer structure using the above light-transmitting conductive material and the above metal element.

The thickness of each of the conductive films 261, 268, 270, 274, 368, 370, and 374 can range from 30 nm to 500 nm or from 100 nm to 400 nm.

The insulating film 376 is a film containing hydrogen and is typically a nitride insulating film. The nitride insulating film can be formed using silicon nitride, aluminum nitride, or the like.

<Structure Example 2 of Transistor>

A transistor 450 that can be used as the transistors 111 to 113 described in Embodiments 1 and 2 will be described with reference to FIGS. 24A to 24C.

Figure 24A:
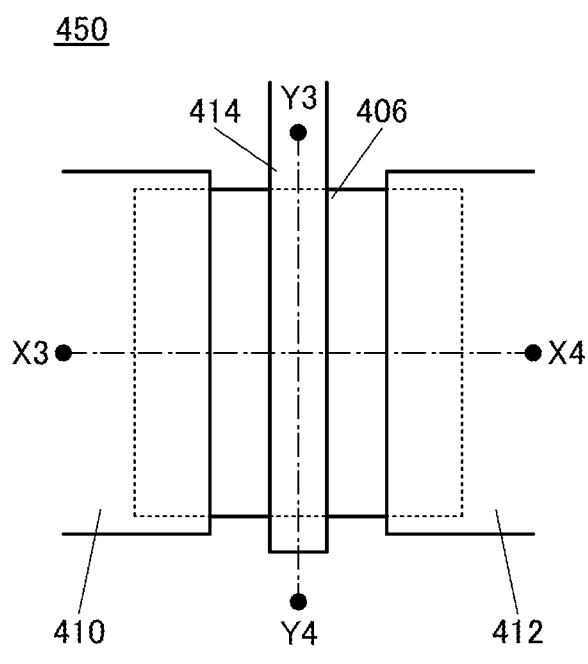
FIG. 24A is a top view of a transistor and FIGS. 24B and 24C are cross-sectional views of the transistor.
Figure 24B:
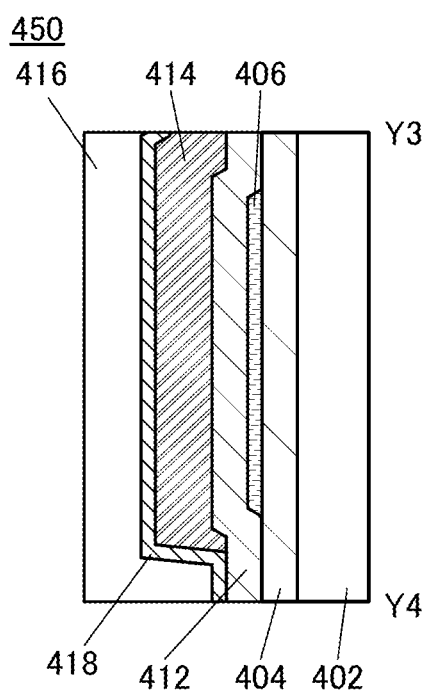
Figure 24C:
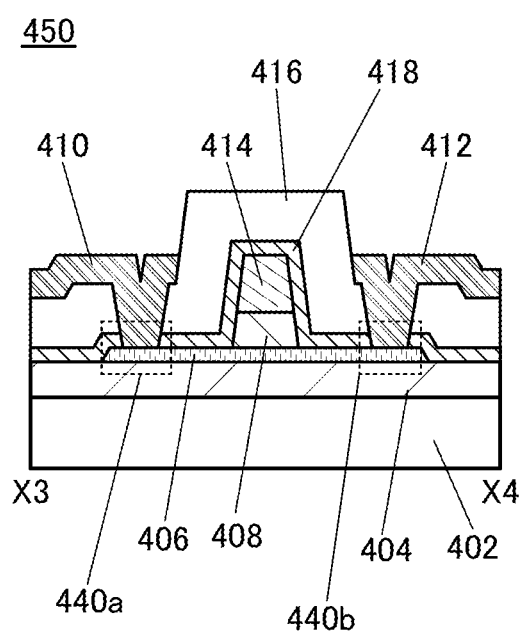

FIG. 24A to 24C are a top view and cross-sectional views of the transistor 450. FIG. 24A is the top view of the transistor 450. FIG. 24B shows a cross section along the dashed-dotted line Y3-Y4 in FIG. 24A. FIG. 24C shows a cross section along the dashed-dotted line X3-X4 in FIG. 24A.

The transistor 450 illustrated in FIGS. 24A to 24C includes an oxide semiconductor film 406 over an insulating film 404 formed over a substrate 402, an insulating film 408 in contact with the oxide semiconductor film 406, a conductive film 414 that overlaps the oxide semiconductor film 406 with the insulating film 408 placed therebetween, an insulating film 418 in contact with the oxide semiconductor film 406, an insulating film 416 over the insulating film 418, a conductive film 410 in contact with the oxide semiconductor film 406 in an opening 440a formed in the insulating films 416 and 418, and a conductive film 412 in contact with the oxide semiconductor film 406 in an opening 440b formed in the insulating films 416 and 418.

In the transistor 450, the conductive film 414 functions as a gate electrode, and the conductive films 410 and 412 function as source and drain electrodes.

In the oxide semiconductor film 406, a region that does not overlap with the conductive films 410, 412, and 414 contains an element forming an oxygen vacancy. Here, an element forming an oxygen vacancy is referred to as an impurity element. Typical examples of impurity elements include hydrogen, boron, carbon, nitrogen, fluorine, aluminum, silicon, phosphorus, chlorine, and rare gas elements. Typical examples of rare gas elements are helium, neon, argon, krypton, and xenon.

When an impurity element is added to the oxide semiconductor film, an oxygen vacancy is formed because a bond between a metal element and oxygen in the oxide semiconductor film is cut or because oxygen bonded to a metal element in the oxide semiconductor film is detached from the metal element and bonded to the impurity element. Thus, the carrier density is increased in the oxide semiconductor film, and the conductivity of the oxide semiconductor film is increased as a result.

As the substrate 402, the substrate 640 illustrated in FIGS. 12A to 12D can be used as appropriate.

As the insulating film 404, the insulating film 652 illustrated in FIGS. 12A to 12D can be used as appropriate.

As the oxide semiconductor film 406, the oxide semiconductor 660 illustrated in FIGS. 12A to 12D can be used as appropriate.

As the insulating film 408, the gate insulating film 653 illustrated in FIGS. 12A to 12D can be used as appropriate.

As the conductive films 410, 412, and 414, the conductive films 261, 268, 270, 274, 368, 370, and 374 illustrated in FIGS. 21A and 21B can be used as appropriate.

When an oxide insulating film from which oxygen is released by heating is used as the insulating film 416, oxygen contained in the insulating film 416 can be supplied to the oxide semiconductor film 406.

The gate insulating film 416 can be formed with a single-layer structure or a stacked-layer structure using silicon oxide, silicon oxynitride, silicon nitride oxide, silicon nitride, aluminum oxide, hafnium oxide, gallium oxide film, or Ga—Zn oxide, for example.

The insulating film 418 is preferably a film serving as a barrier film against hydrogen, water, and the like from the outside. The insulating film 418 can be formed with a single-layer structure or a stacked-layer structure using silicon nitride, silicon nitride oxide, or aluminum oxide, for example.

The thickness of each of the insulating films 416 and 418 can range from 30 nm to 500 nm or from 100 nm to 400 nm.

In the transistor 450, the conductive film 414 does not overlap with the conductive films 410 and 412, and parasitic capacitance between the conductive film 414 and the conductive films 410 and 412 can be reduced. Thus, signal delay in the conductive films 410, 412, and 414 can be reduced.

In the transistor 450, an impurity element is added to the oxide semiconductor film 406 using the conductive film 414 as a mask. That is, a low-resistance region can be formed in a self-aligned manner.

Like the transistor 394 illustrated in FIGS. 21A and 21B, the transistor 450 can have a dual-gate structure in which a conductive film is provided below the insulating film 404 so that the oxide semiconductor film 406 overlaps the conductive film.

The structure described above in this embodiment can be combined as appropriate with any of the structures described in the other embodiments.

Embodiment 7

In this embodiment, modification examples of transistors used as the transistors 111 to 113 shown in Embodiments 1 and 2 will be described with reference to FIGS. 37A to 37F, FIGS. 38A to 38F, and FIGS. 39A to 39E. Each of transistors illustrated in FIGS. 37A to 37F includes an oxide semiconductor film 828 formed over an insulating film 824 over a substrate 821, an insulating film 837 in contact with the oxide semiconductor film 828, and a conductive film 840 that is in contact with the insulating film 837 and overlaps the oxide semiconductor film 828. The insulating film 837 functions as a gate insulating film. The conductive film 840 functions as a gate electrode.

Each of the transistors also includes an insulating film 846 in contact with the oxide semiconductor film 828, an insulating film 847 in contact with the insulating film 846, and conductive films 856 and 857 that are in contact with the oxide semiconductor film 828 in openings provided in the insulating films 846 and 847. The conductive films 856 and 857 function as source and drain electrodes. An insulating film 862 is provided in contact with the insulating film 847 and the conductive films 856 and 857.

As the structure of the transistor in this embodiment and a conductive film and an insulating film that are in contact with the transistor, those shown in any of the foregoing embodiments can be used as appropriate.

Figure 37A:
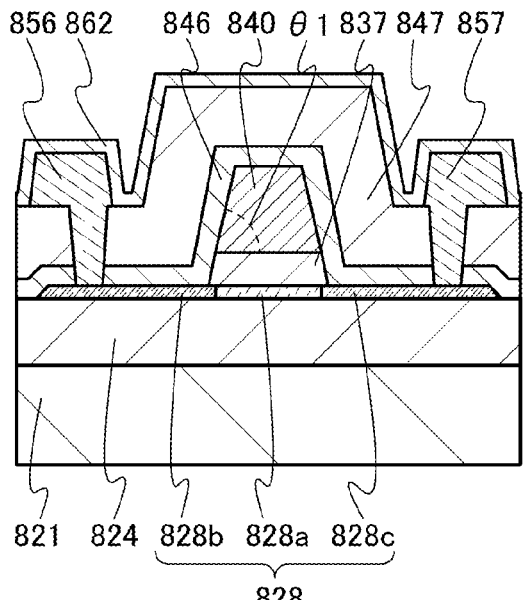
FIGS. 37A to 37F are cross-sectional views of a transistor.

In the transistor illustrated in FIG. 37A, the oxide semiconductor film 828 includes a region 828a that overlaps with the conductive film 840, and regions 828b and 828c that are provided with the region 828a placed therebetween and contain an impurity element. The conductive films 856 and 857 are in contact with the regions 828b and 828c, respectively. The region 828a functions as a channel region. The regions 828b and 828c have lower resistivity than the region 828a, and thus can be referred to as low-resistance regions. The regions 828b and 828c function as source and drain regions.

Figure 37B:
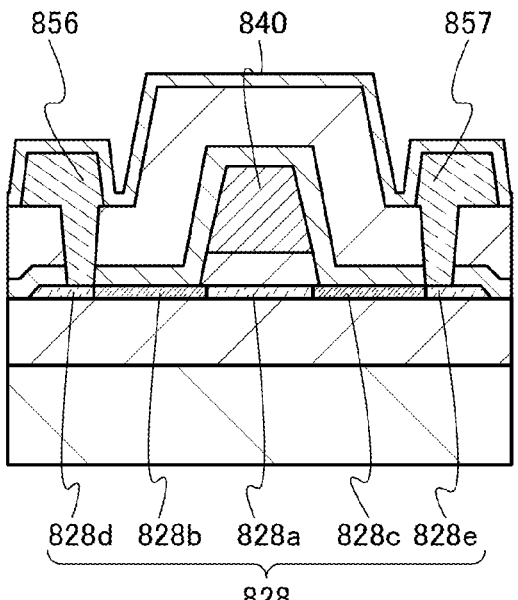

Alternatively, as in the oxide semiconductor film 828 of the transistor illustrated in FIG. 37B, an impurity element is not contained in regions 828d and 828e in contact with the conductive films 856 and 857. In this case, the regions 828b and 828c containing an impurity element are provided between the region 828a and the regions 828d and 828e in contact with the conductive films 856 and 857. The regions 828d and 828e have conductivity when voltage is applied to the conductive films 856 and 857, and thus function as source and drain regions.

The transistor in FIG. 37B can be formed in the following manner: the conductive films 856 and 857 are formed, and then an impurity element is added to the oxide semiconductor film using the conductive film 840 and the conductive films 856 and 857 as masks.

An end portion of the conductive film 840 may be tapered. Specifically, an angle θ1 between a surface where the insulating film 837 and the conductive film 840 are in contact with each other and a side surface of the conductive film 840 may be less than 90° or range from 10° to 85°, from 15° to 85°, from 30° to 85°, from 45° to 85°, or from 60° to 85°. With the angle θ1 in the above range, the insulating film 846 can adequately cover side surfaces of the insulating film 837 and the conductive film 840.

Next, modification examples of the regions 828b and 828c will be described. FIGS. 37C to 37F are enlarged views of the vicinity of the oxide semiconductor film 828 illustrated in FIG. 37A. Here, a channel length L is the distance between a pair of regions containing an impurity element.

Figure 37C:
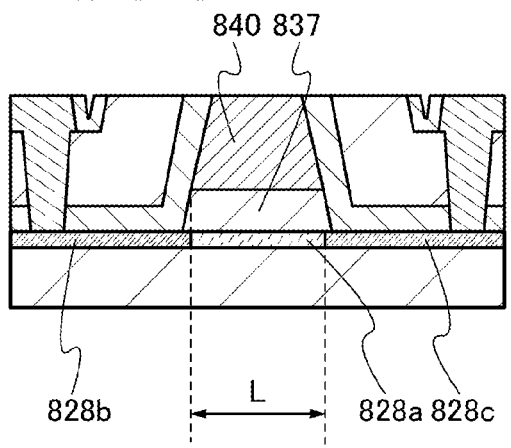

As illustrated in FIG. 37C, in the cross section in the channel length direction, boundaries between the region 828a and the regions 828b and 828c correspond to or substantially correspond to end portions of the conductive film 840 with the insulating film 837 placed therebetween. That is, when seen from the above, the boundaries between the region 828a and the regions 828b and 828c are aligned or substantially aligned with the end portions of the conductive film 840.

Figure 37D:
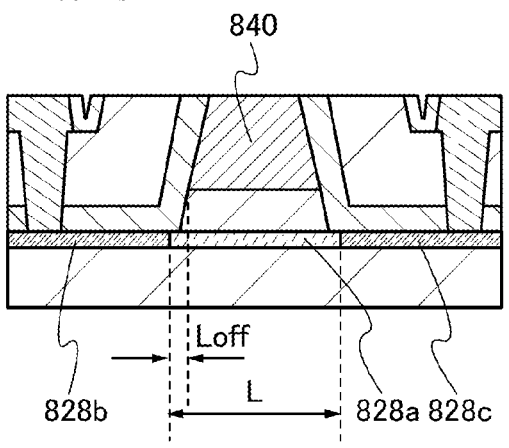

Alternatively, as illustrated in FIG. 37D, in the cross section in the channel length direction, the region 828a has a region that does not overlap with the conductive film 840. This region functions as an offset region. The length of the offset region in the channel length direction is represented by $L_{off}$. When there are a plurality of offset regions, $L_{off}$ designates the length of one offset region. Note that $L_{off}$ is included in the channel length L and is less than 20%, less than 10%, less than 5%, or less than 2% the channel length L.

Figure 37E:
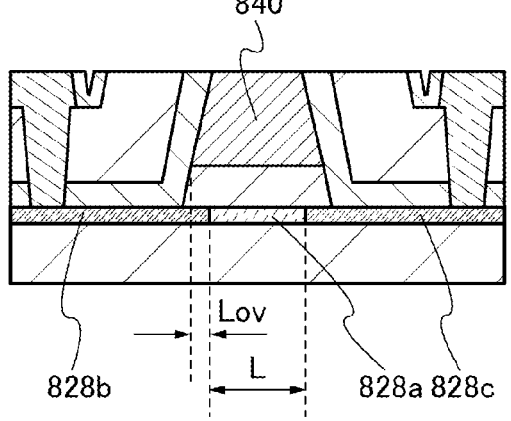

Alternatively, as illustrated in FIG. 37E, in the cross section in the channel length direction, each of the regions 828b and 828c has a region that overlaps with the conductive film 840 with the insulating film 837 placed therebetween. This region functions as an overlap region. The length of the overlap region in the channel length direction is represented by $L_{ov}$, and $L_{ov}$ is less than 20%, less than 10%, less than 5%, or less than 2% the channel length L.

Figure 37F:
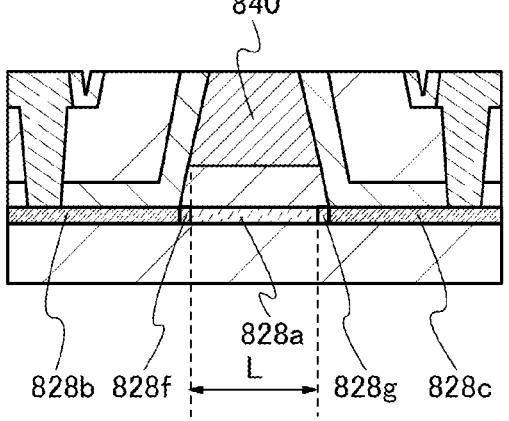

Alternatively, as illustrated in FIG. 37F, in the cross section in the channel length direction, a region 828f is provided between the region 828a and the region 828b and a region 828g is provided between the region 828a and the region 828c. The regions 828f and 828g have a lower impurity element concentration and higher resistivity than the regions 828b and 828c. Here, the regions 828f and 828g overlap with the insulating film 837, but they may overlap with the insulating film 837 and the conductive film 840.

Although the structures in FIGS. 37C to 37F are described using the transistor illustrated in FIG. 37A, they may be applied to the transistor illustrated in FIG. 37B as appropriate.

Figure 38A:
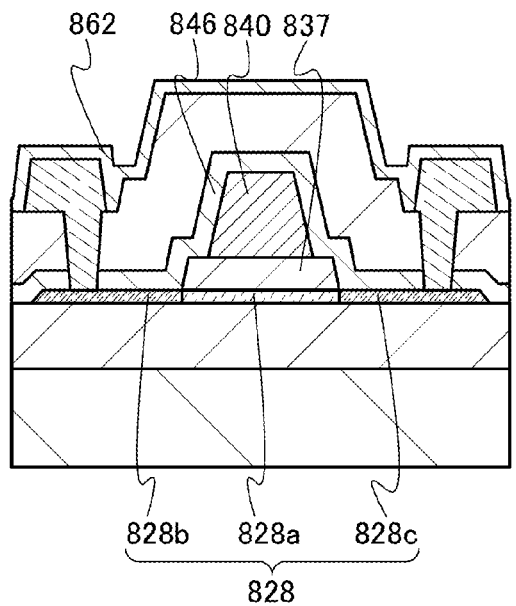
FIGS. 38A to 38F are cross-sectional views of a transistor.

In the transistor illustrated in FIG. 38A, end portions of the insulating film 837 are placed outward with respect to the end portions of the conductive film 840 in the cross section. In other words, the insulating film 837 protrudes from the conductive film 840. The insulating film 846 can be distanced from the region 828a, whereby nitrogen, hydrogen, and the like included in the insulating film 846 can be prevented from entering the region 828a serving as a channel region.

Figure 38B:
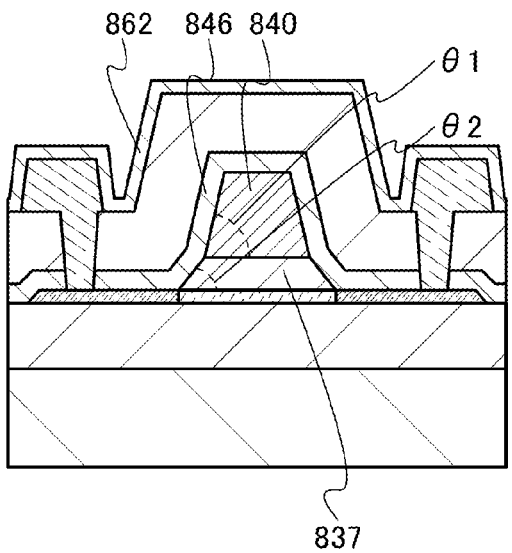

In the transistor illustrated in FIG. 38B, the insulating film 837 and the conductive film 840 are tapered and have different taper angles. That is, the angle θ1 between the surface where the insulating film 837 and the conductive film 840 are in contact with each other and the side surface of the conductive film 840 is different from an angle θ2 between a surface where the oxide semiconductor film 828 and the insulating film 837 are in contact with each other and the side surface of the insulating film 837. The angle θ2 may be less than 90° or range from 30° to 85° or from 45° to 70°. For example, when the angle θ2 is less than the angle θ1, the insulating film 846 covers the insulating film 837 and the conductive film 840 more adequately. In contrast, when the angle θ2 is greater than the angle θ1, the transistor can be miniaturized.

Next, modification examples of the regions 828b and 828c will be described with reference to FIGS. 38C to 38F. FIGS. 38C to 38F are enlarged views of the vicinity of the oxide semiconductor film 828 illustrated in FIG. 38A.

Figure 38C:
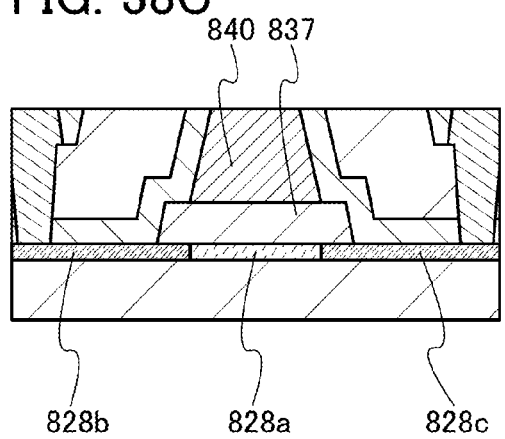

As illustrated in FIG. 38C, in the cross section in the channel length direction, boundaries between the region 828a and the regions 828b and 828c correspond to or substantially correspond to end portions of the conductive film 840 with the insulating film 837 placed therebetween. That is, when seen from the above, the boundaries between the region 828a and the regions 828b and 828c are aligned or substantially aligned with the end portions of the conductive film 840.

Figure 38D:
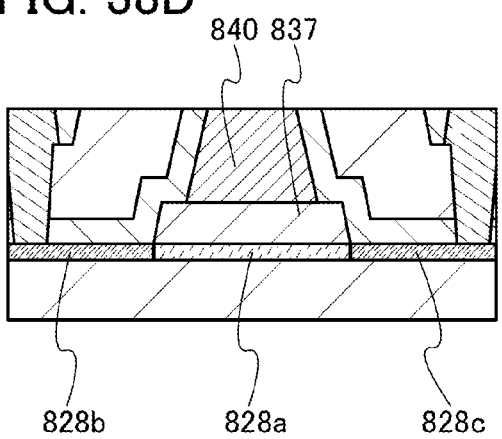

Alternatively, as illustrated in FIG. 38D, in the cross section in the channel length direction, the region 828a has regions that do not overlap with the conductive film 840. These regions function as offset regions. That is, when seen from the above, the end portions of the regions 828b and 828c are aligned or substantially aligned with the end portions of the insulating film 837 and do not overlap with the end portions of the conductive film 840.

Figure 38E:
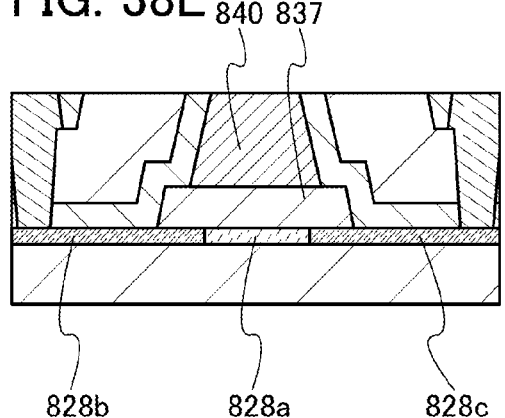

Alternatively, as illustrated in FIG. 38E, in the cross section in the channel length direction, each of the regions 828b and 828c has a region that overlaps with the conductive film 840 with the insulating film 837 placed therebetween. This region is referred to as an overlap region. That is, when seen from the above, the end portions of the regions 828b and 828c overlap with the conductive film 840.

Figure 38F:
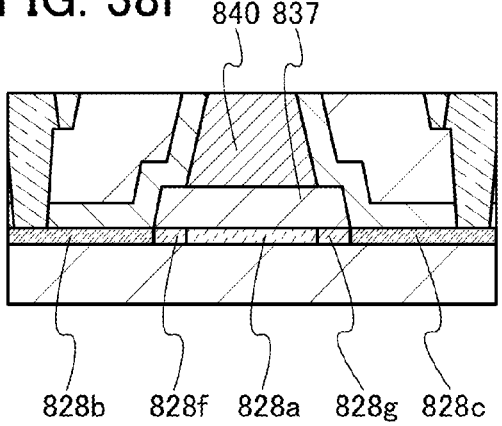

Alternatively, as illustrated in FIG. 38F, in the cross section in the channel length direction, the region 828f is provided between the region 828a and the region 828b and the region 828g is provided between the region 828a and the region 828c. The regions 828f and 828g have a lower impurity element concentration and higher resistivity than the regions 828b and 828c. Here, the regions 828f and 828g overlap with the insulating film 837, but they may overlap with the insulating film 837 and the conductive film 840.

Although the structures in FIGS. 38C to 38F are described using the transistor illustrated in FIG. 38A, they may be applied to the transistor illustrated in FIG. 38B as appropriate.

Figure 39A:
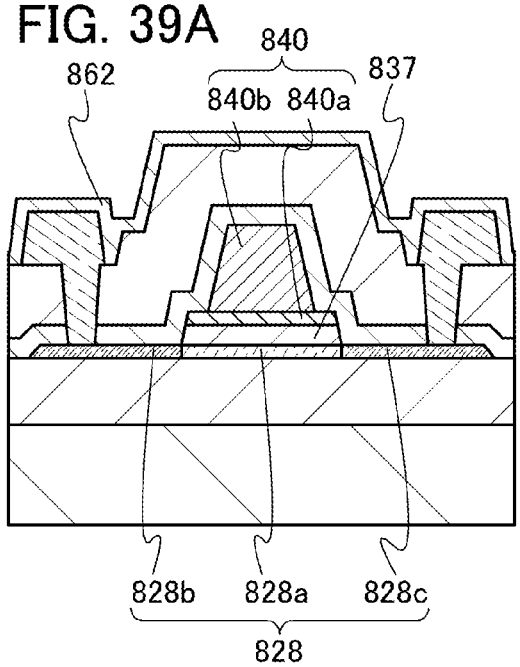
FIGS. 39A to 39E are cross-sectional views of a transistor

In the transistor illustrated in FIG. 39A, the conductive film 840 has a stacked-layer structure of a conductive film 840a in contact with the insulating film 837 and a conductive film 840b in contact with the conductive film 840a. An end portion of the conductive film 840a is placed outward with respect to the end portion of the conductive film 840b in the cross section. In other words, the conductive film 840a protrudes from the conductive film 840b.

Next, modification examples of the regions 828b and 828c will be described. FIGS. 39B to 39E are enlarged views of the vicinity of the oxide semiconductor film 828 illustrated in FIG. 39A.

Figure 39B:
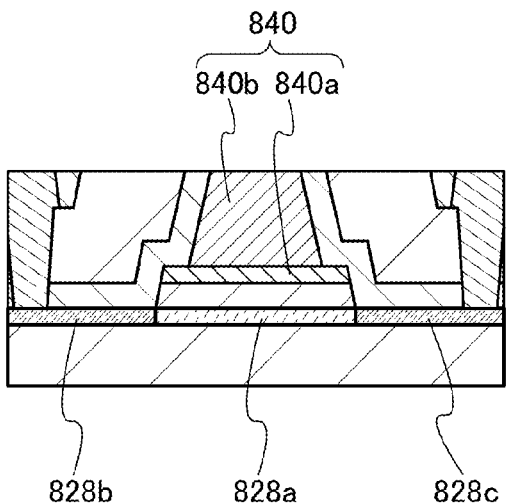

As illustrated in FIG. 39B, in the cross section in the channel length direction, boundaries between the region 828a and the regions 828b and 828c correspond to or substantially correspond to end portions of the conductive film 840a included in the conductive film 840, with the insulating film 837 placed therebetween. That is, when seen from the above, the boundaries between the region 828a and the regions 828b and 828c are aligned or substantially aligned with the end portions of the conductive film 840a.

Figure 39C:
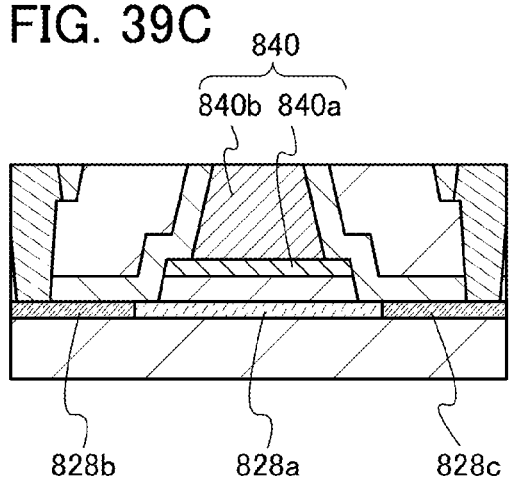

Alternatively, as illustrated in FIG. 39C, in the cross section in the channel length direction, the region 828a has regions that do not overlap with the conductive film 840. These regions function as offset regions. That is, when seen from the above, the end portions of the regions 828b and 828c do not overlap with the end portions of the conductive film 840a.

Figure 39D:
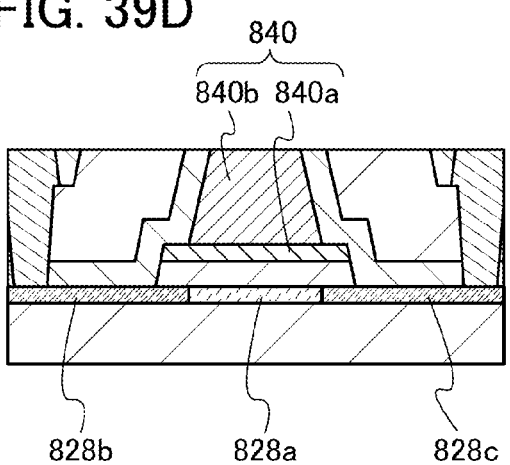

Alternatively, as illustrated in FIG. 39D, in the cross section in the channel length direction, each of the regions 828b and 828c has a region that overlaps with the conductive film 840, here the conductive film 840a. This region is referred to as an overlap region. That is, when seen from the above, the end portions of the regions 828b and 828c overlap with the conductive film 840a.

Figure 39E:
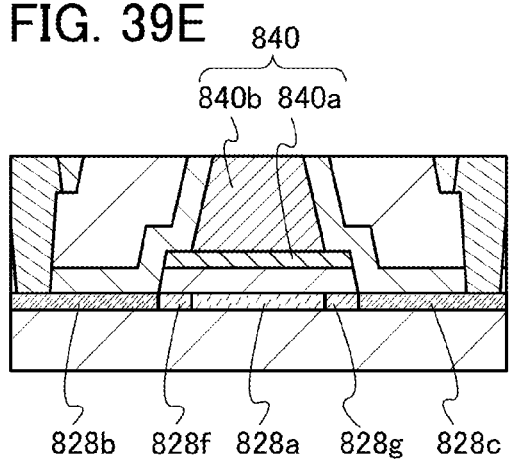

Alternatively, as illustrated in FIG. 39E, in the cross section in the channel length direction, the region 828f is provided between the region 828a and the region 828b and the region 828g is provided between the region 828a and the region 828c. Since an impurity element is added to the regions 828f and 828g through the conductive film 840a, the regions 828f and 828g have a lower impurity element concentration and higher resistivity than the regions 828b and 828c. Here, the regions 828f and 828g may overlap with the conductive film 840a or the conductive film 840b.

It is possible that the end portion of the insulating film 837 is placed outward with respect to the end portion of the conductive film 840a in the cross section.

It is possible that the insulating film 837 has a curved side surface.

It is possible that the insulating film 837 is tapered. That is, the angle between a surface where the oxide semiconductor film 828 and the insulating film 837 are in contact with each other and the side surface of the insulating film 837 may be less than 90°, preferably greater than or equal to 30° and less than 90°.

When the oxide semiconductor film 828 includes the regions 828f and 828g with lower impurity element concentration and higher resistivity than the regions 828b and 828c as illustrated in FIGS. 39A to 39E, an electric field applied to the drain region can be relaxed. Thus, degradation of the transistor, such as threshold voltage variation due to an electric field applied to the drain region, can be reduced.

The structure described above in this embodiment can be combined as appropriate with any of the structures described in the other embodiments.

This application is based on Japanese Patent Application serial no. 2013-271666 and no. 2014-047382 filed with Japan Patent Office on Dec. 27, 2013 and Mar. 11, 2014, respectively, the entire contents of which are hereby incorporated by reference.

What is claimed is:

1. A semiconductor device comprising:
a first transistor, a second transistor, a third transistor, a fourth transistor, and a fifth transistor;
a first node and a second node;
a capacitor;
a bit line; and
a power supply line,
wherein:
the first node is supplied with first data of M bits through the first transistor (M is a natural number of 1 or more),
the first node is electrically connected to a first electrode of the capacitor and a gate of the fifth transistor,
the second node is supplied with second data of N bits through the second transistor (N is a natural number of 1 or more),
the second node is supplied with a first potential through the third transistor,
the second node is electrically connected to a second electrode of the capacitor,
one of a source and a drain of the fifth transistor is electrically connected to the power supply line, and
the other of the source and the drain of the fifth transistor is electrically connected to the bit line through the fourth transistor.

2. The semiconductor device according to claim 1, wherein each of the first transistor, the second transistor, and the third transistor comprises a semiconductor layer containing an oxide semiconductor.

3. The semiconductor device according to claim 1, wherein each of the fourth transistor and the fifth transistor comprises a semiconductor layer containing silicon.

4. The semiconductor device according to claim 1, wherein each of the fourth transistor and the fifth transistor is an n-channel transistor.

5. The semiconductor device according to claim 1, wherein the first potential is 0 V.

6. A method for driving the semiconductor device according to claim 1,
a write operation comprising the steps of:
turning on the first transistor and the third transistor and supplying the first data to the first node;
turning on the second transistor, turning off the first transistor and the third transistor, and supplying the second data to the second node; and
making the first node and the second node electrically floating by turning off the second transistor, and
a read operation comprising the steps of:
applying a potential difference between the power supply line and the bit line;
making the bit line electrically floating; and
turning on the fourth transistor and charging the bit line.

7. A semiconductor device comprising:
a first transistor, a second transistor, a third transistor, and a fourth transistor;
a first node and a second node;
a first capacitor and a second capacitor;
a bit line; and
a power supply line,
wherein:
the first node is supplied with first data of M bits through the first transistor (M is a natural number of 1 or more),
the first node is electrically connected to a first electrode of the first capacitor, a first electrode of the second capacitor, and a gate of the fourth transistor,
the second node is supplied with second data of N bits through the second transistor (N is a natural number of 1 or more),
the second node is supplied with a first potential through the third transistor,
the second node is electrically connected to a second electrode of the first capacitor,
one of a source and a drain of the fourth transistor is electrically connected to the power supply line, and
the other of the source and the drain of the fourth transistor is electrically connected to the bit line.

8. The semiconductor device according to claim 7, wherein each of the first transistor, the second transistor, and the third transistor comprises a semiconductor layer containing an oxide semiconductor.

9. The semiconductor device according to claim 7, wherein the fourth transistor comprises a semiconductor layer containing silicon.

10. The semiconductor device according to claim 7, wherein the fourth transistor is an n-channel transistor.

11. The semiconductor device according to claim 7, wherein the first potential is 0 V.

12. A method for driving the semiconductor device according to claim 7,
a write operation comprising the steps of:
supplying a second potential to a second electrode of the second capacitor;
turning on the first transistor and the third transistor, and supplying the first data to the first node;
turning on the second transistor, turning off the first transistor and the third transistor, and supplying the second data to the second node; and
making the first node and the second node electrically floating by turning off the second transistor,
a read operation comprising the steps of:
applying a potential difference between the power supply line and the bit line;
making the bit line electrically floating; and
supplying a third potential to the second electrode of the second capacitor and charging or discharging the bit line.

13. A semiconductor device comprising:
a first transistor, a second transistor, a third transistor, a fourth transistor, and a fifth transistor;
a capacitor;
a bit line; and
a power supply line,
wherein:
one of a source and a drain of the first transistor is electrically connected to a first electrode of the capacitor,
the other of the source and the drain of the first transistor is electrically connected to the bit line,
one of a source and a drain of the second transistor is electrically connected to a second electrode of the capacitor,
the other of the source and the drain of the second transistor is electrically connected to the bit line,
one of a source and a drain of the third transistor is electrically connected to the second electrode of the capacitor,
the other of the source and the drain of the third transistor is supplied with a first potential,
one of a source and a drain of the fourth transistor is electrically connected to one of a source and a drain of the fifth transistor, the other of the source and the drain of the fourth transistor is electrically connected to the bit line, a gate of the fifth transistor is electrically connected to the first electrode of the capacitor, and the other of the source and the drain of the fifth transistor is electrically connected to the power supply line.

14. The semiconductor device according to claim 13, wherein each of the first transistor, the second transistor, and the third transistor comprises a semiconductor layer containing an oxide semiconductor.

15. The semiconductor device according to claim 13, wherein each of the fourth transistor and the fifth transistor comprises a semiconductor layer containing silicon.

16. The semiconductor device according to claim 13, wherein each of the fourth transistor and the fifth transistor is an n-channel transistor.

17. The semiconductor device according to claim 13, wherein the first potential is 0 V.

18. A method for driving the semiconductor device according to claim 13, a write operation comprising the steps of:
turning on the first transistor and the third transistor and supplying first data to the gate of the fifth transistor through the first transistor;

turning on the second transistor, turning off the first transistor and the third transistor, and supplying second data to the second electrode of the capacitor through the second transistor; and making the second electrode of the capacitor electrically floating by turning off the second transistor, and a read operation comprising the steps of:
applying a potential difference between the power supply line and the bit line;

making the bit line electrically floating; and turning on the fourth transistor and charging the bit line.

* * * * *